(12) United States Patent
Wahlstrom

(10) Patent No.: US 6,335,896 B1
(45) Date of Patent: *Jan. 1, 2002

(54) DYNAMIC RANDOM ACCESS MEMORY

(75) Inventor: Sven E. Wahlstrom, Palo Alto, CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/792,419

(22) Filed: Feb. 3, 1997

Related U.S. Application Data

(62) Division of application No. 08/609,401, filed on Mar. 1, 1996.

(51) Int. Cl.[7] ............................................... G11C 13/00
(52) U.S. Cl. .................................. 365/230.03; 365/149
(58) Field of Search ............................. 365/189.01, 149, 365/189.04, 200, 230.01, 230.03

(56) References Cited

U.S. PATENT DOCUMENTS

| 4,920,517 A | 4/1990 | Yamauchi et al. ........... 365/207 |
| 5,016,224 A | 5/1991 | Tanaka et al. ......... 365/230.03 |
| 5,317,212 A | 5/1994 | Wahlstrom .................... 307/465 |
| 5,375,086 A | 12/1994 | Wahlstrom .................... 365/149 |
| 5,396,452 A | 3/1995 | Wahlstrom .................... 365/149 |
| 5,687,125 A * | 11/1997 | Kikuchi ....................... 365/200 |

FOREIGN PATENT DOCUMENTS

| EP | 0239225 | 2/1987 | ........... G11C/11/24 |
| EP | 0282650 | 12/1987 | ........... G11C/7/00 |
| EP | 0431865 | 3/1990 | ........... G11C/7/00 |
| WO | WO 91/0155 | 7/1990 | ........... G11C/7/06 |

* cited by examiner

Primary Examiner—Terrell W. Fears
(74) Attorney, Agent, or Firm—Townsend and Townsend and Crew LLP

(57) ABSTRACT

A capacitor memory data storage system of reading, writing and refreshing which uses short bit line segments separated by pass transistors to allow smaller capacitors and faster speeds than the prior art.

26 Claims, 93 Drawing Sheets

A) RECESS ETCH

B) N+ IMPLANT

C) OXIDE GROUT AND POLY DEPOSITOR

D) AFTER POLISHING

E) GROUND CONTACT AREA IMPLANT

F) EPITAXIAL LAYER ADDITION

G) OXYGENE IMPLANT

A) AFTER RECESS ETCH THIN OXIDE AND POLY DEPOSITION
(IN LOCO OR BLANKET AND POLISH)

B) SOURCE AND DRAIN IMPLANT

C) EPI LAYER GROWTH

D) AFTER OXYGENE IMPLANT

A) WAFER WITH DEEP N+ DIFFUSION

B) NITROGEN IMPLANT

C) ISOLATION CUTS AND REFILL (SiO$_2$)

D) EPI LAYER GROWTH

E) NITROGEN OR O$_2$ IMPLANT

A) TRANSITION DRAIN AND GROUND DIFFUSION (N+)

B) Si₃N₄ OR SiO₂ IMPLANT

C) ISOLATION CUT AND REFILL

D) CAPACITOR N+ IMPLANT

E) P- EPI GROWTH

F) N₂ OR O₂ IMPLANT

DYNAMIC RANDOM ACCESS MEMORY

This Appln. is a Div. of Ser. No. 08/609,401 filed Mar. 1, 1996.

BACKGROUND OF THE INVENTION

The present invention relates to the operation and manufacture of integrated circuits. More specifically, in one embodiment the invention provides improved dynamic random access memories (DRAMs), methods of operating dynamic random access memories and methods of making dynamic random access memories.

In the attempt to increase the number of bits on present DRAMs, methods are sought for shrinking device dimensions while still maintaining high enough capacitance in the storage capacitors so that data can be reliably stored, refreshed and read. For example, new dynamic random access memories are disclosed in application Ser. No. 08/353,788, filed Dec. 12, 1994, and U.S. Pat. No. 5,396,452, each of which is hereby incorporated by reference, wherein a memory cell contains separate read and write transistors.

In another example, substantial space could be saved merely by providing smaller capacitors in present DRAMs. However, smaller capacitors are generally refreshed more often than larger capacitors, as it can be assumed that the leakage current is the same. The capacitance of a bit line is proportional to the number of bits on the bit line. The refresh power consumption is proportional to the frequency of refresh cycles multiplied by the number of bits per bit line, where the refresh frequency is inversely proportional to the cell capacitor size. Therefore, the space advantages of a DRAM with smaller capacitors are mitigated by the higher power consumption of the required additional refresh cycles.

From the above examples it is seen that an improved dynamic random access memory is needed, along with improved methods of operating such memories and improved methods of making such memories.

SUMMARY OF THE INVENTION

The present invention is directed, in one embodiment, to a memory structure having short bit line segments. Each bit line segment is coupled to a separate block of memory cells and a corresponding amplifier. The bit line segments are separated by pass transistors. The amplifiers are activated in all three modes of operation: read mode, write mode and refresh mode, while the pass transistors are enabled only in connection with data input and output. Very small cell capacitors can be used in this configuration, making it possible to use conventional gate capacitors, but power consumption is not appreciably increased. Furthermore, the speed of the memory for read and write operations is faster than present DRAMs with long continuous bit lines coupled to a single amplifier.

In another aspect of the invention a memory is provided wherein the contents of the memory can be read without any interference from ongoing writing, reading and refreshing. The memory is structured in two tiers, meaning that in addition to a first tier, a DRAM with addressing, reading, writing and refreshing, a second tier with separate addressing from the first tier is used to read the contents of the cells in the first tier.

Improved methods of forming a dynamic random access memory are further provided according to the present invention. For example, in one aspect of the invention, a method is provided for forming a memory cell for use with programmable logic devices that must be controlled with relatively large capacitors. In programmable logic devices, pass transistors transfer signals between locations in the device. The controlling capacitor must be significantly larger than the gate capacitance of the pass transistor, so that the voltage on the controlling capacitor is relatively constant during the signal transition. A multi-layer approach to forming the memory allows the controlling capacitor to be located underneath the pass transistors and the memory cell transistors.

A further understanding of the nature and advantages of the inventions herein may be realized by reference to the remaining portions of the specification and the attached drawings.

DESCRIPTION OF THE PREFERRED EMBODIMENT

Figure 1A:
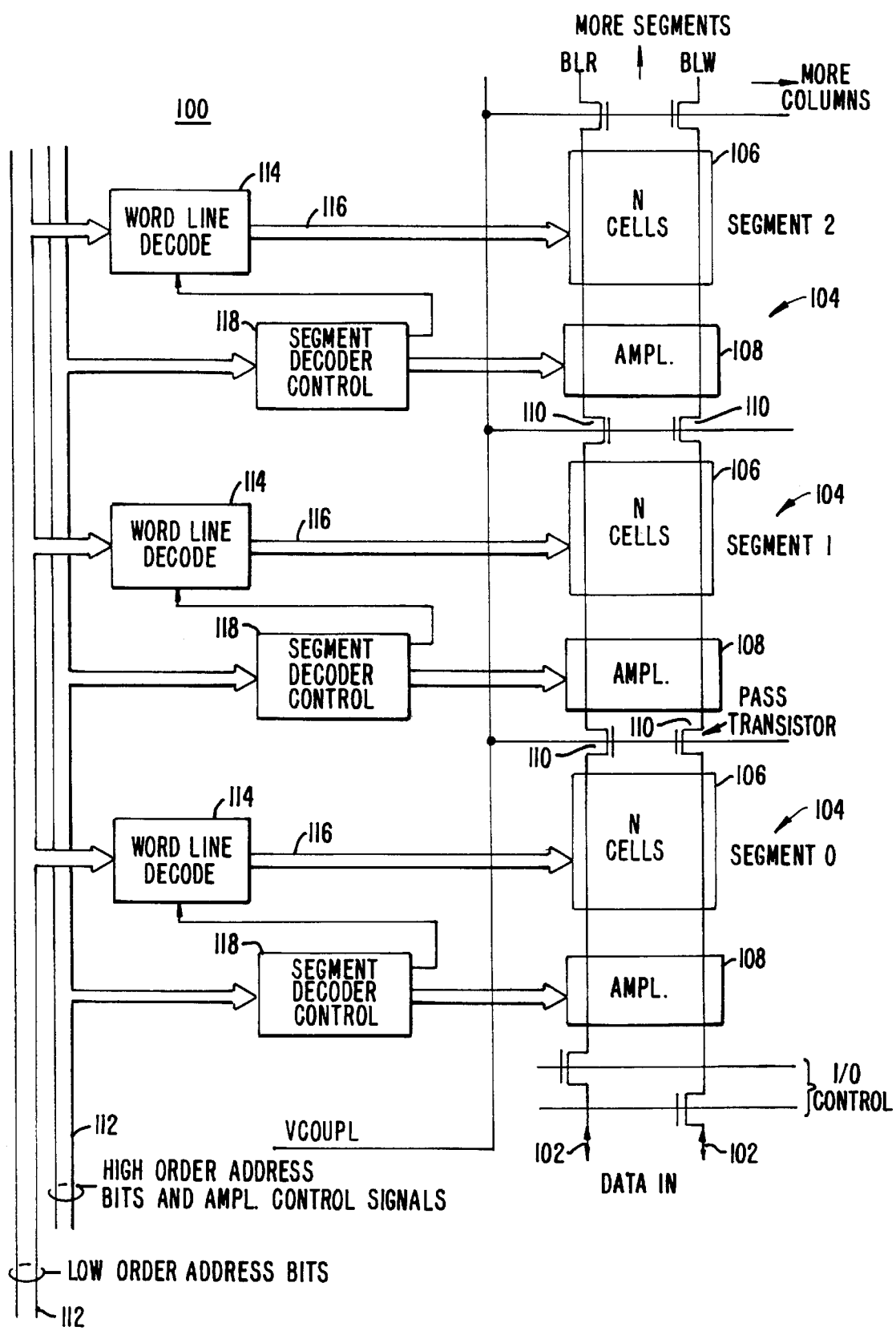
FIGS. 1A–B show simplified block diagrams of a segmented bit line memory.

FIG. 1A shows a simplified block diagram of a memory 100 including segmented bit lines 102, made up of a read bit line BLR and a write bit line BLW. Each bit line segment 104 is coupled to a separate block of memory cells 106 and a corresponding amplifier 108. Bit line segments 104 are separated by pass transistors 110 in line with bit lines 102. Amplifiers 108 are activated in all three modes of operation: read mode, write mode and refresh mode. Pass transistors 110 are enabled only in connection with data input and output. Address lines 112 select the particular memory cells 106 to be accessed. A word line decode block 114 is used to select a desired word line 116, while segment decode block 118 is used to selected a desired bit line segment 104.

Low order address bits select one of the word lines 116 in the segment selected by a segment decoder. The higher order address bits select a bit line segment 104. In a refresh mode, the low order bits select one word in each segment, and the segment decoder is bypassed to enable all segments. It should be noted that in an alternative embodiment, rather than separating the address lines into low and high order bits, a single set of multiplexed address lines may be implemented. The bit lines in the selected segments that are normally clamped to a clamp level of Vdd/2 may be released to float during a period when the clamp is off. The selected word line 116 is then brought to the first ramp level, and a dummy current is turned on for the selected bit line segment 104. The voltage on the read bit line in the segment changes quickly due to the low bit line capacitance. The voltage displacement due to the cell current can actually be of the same order of magnitude as the final displacement caused by the amplifier, when its power is turned on later in the refresh cycle. The amplifier 108 will therefore use most of its power dissipation to bring the bit lines to the power rails. Both latch type and the inverter type amplifiers, each of which will be described further herein, can be used. As described earlier, the ramp is brought to its high level for a moment, increasing voltage on word line 116, when the high bit line has reached Vdd, completing the refresh operation before power again is turned off. In the very end of the cycle the clamp signal is applied again.

In order to read data from memory 100, all bit line segments 104 are initially disconnected, and the clamp input is brought low on all segments. This permits bit lines 102 in all segments to float. Only one word line 116 in only one bit line segment 104 is selected in the read mode. When the read cycle has reached a point where amplifier 108 has been turned on and amplified the signal slightly, the bit line segments 104 on one bit line 102 are connected. The interconnected segment lines initially appear as delay lines consisting of RC elements. The capacitance C corresponds to the capacitance of the individual bit line segments 104, while the resistance R corresponds to the impedance of the coupling transistor. This is however not a regular delay line, as each segment 104 also has its own amplifier 108. This allows a signal to proceed from segment to segment very quickly while also being amplified. In a typical memory configuration, a column decoder would select the columns to be the subject of the reading or writing of data. The non selected columns will still be addressed by the word line 116 selected by the word line decoder 114. When the amplitude on the output segment has reached the rails, the segment is connected by the column decoder to the output register of the memory.

In a write operation, data is connected via the column decoder to the bottom segments of the selected columns. The write circuit forces the bottom segment separation to be much larger than the separation of the segments in the addressed and read segment at the time of coupling the segments together. If the read data is different than the data to be written, two signals of different polarity will proceed in opposite directions down the "delay line". The signal with the largest amplitude will determine the final polarity of the addressed segment.

In the refresh mode, the segments remain disconnected during the full read-restore cycle. As mentioned above, one word line in each segment is selected by the low order address bits in the word line decoders and the segment decoder is bypassed so that all segments are activated the same way. The dummy current circuit is also activated in all segments. The control circuit in FIG. 1B clearly shows how the refresh mode differs from the read and write modes in the word line decoding. It should be noted that if the amplifier 108 in each segment 104 consists only of an inverter, the time required for refresh may be longer than the time required for reading and writing. The read bit line in each segment is driven only by the difference of cell current and dummy current. This current is increased significantly at the end of the cycle, but the signal on the read bit line is not enhanced by amplifier 108. In reading and writing, on the other hand, segments 104 are interconnected, so that the read bit line on the first segment is connected to the write bit line of the second segment and so on. This means that the output of one segment amplifier drives the input to the next segment amplifier in the read and write modes. The delay through the "delay line" must of course be taken into account when comparing the timing requirements. It is preferred that all modes have the same timing, as this simplifies the global control circuits.

Therefore, very small cell capacitors can be used in this configuration, making it possible to use conventional gate capacitors. The speed of the memory for reading and writing is faster than the same type of memory with long continuous bit lines.

Figure 1B:
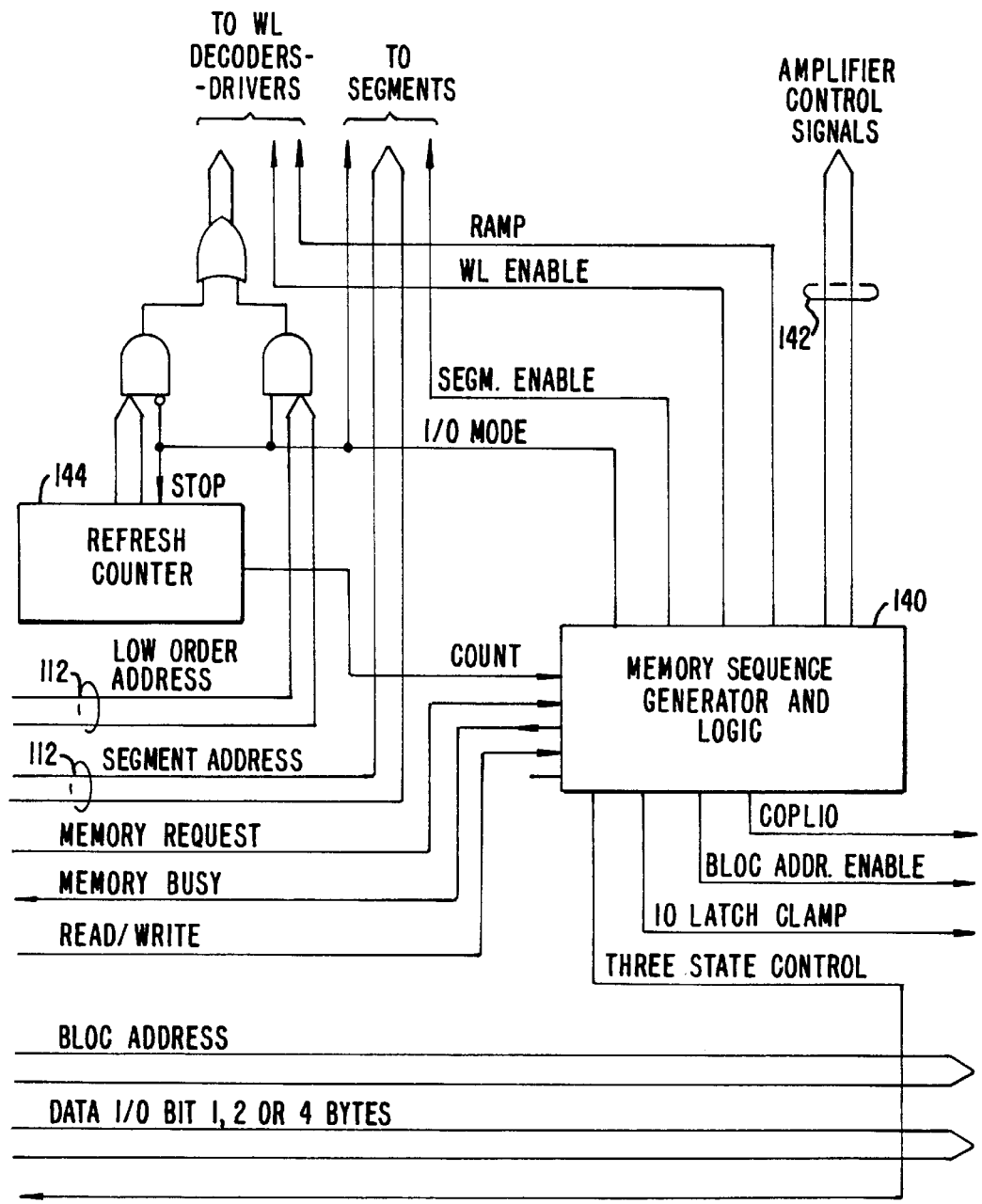

The addressing and control of memory 100 is shown in FIG. 1B. Memory sequence generator 140 receives memory control signals such as Memory Request and Read/Write Enable and provides amplifier control signals 142. Amplifier control signals 142, combined with high order segment address bits 112, are input to segment decoder control block 118 (FIG. 1A) to control a selected one of memory segments 104. Refresh counter 144 initiates a refresh cycle when necessary. The output of refresh counter 144, combined with low order word address bits, are input to word line decoder block 114 (FIG. 1A) to select a particular word line in memory 100. Memory sequence generator 140 also generates additional control signals, such as Cop1 I/O, Block Address Enable and I/O Latch Clamp, that are input to a column decode block (not shown) that accesses a desired column of memory 100 for reading, writing or refreshing.

Figure 2A:
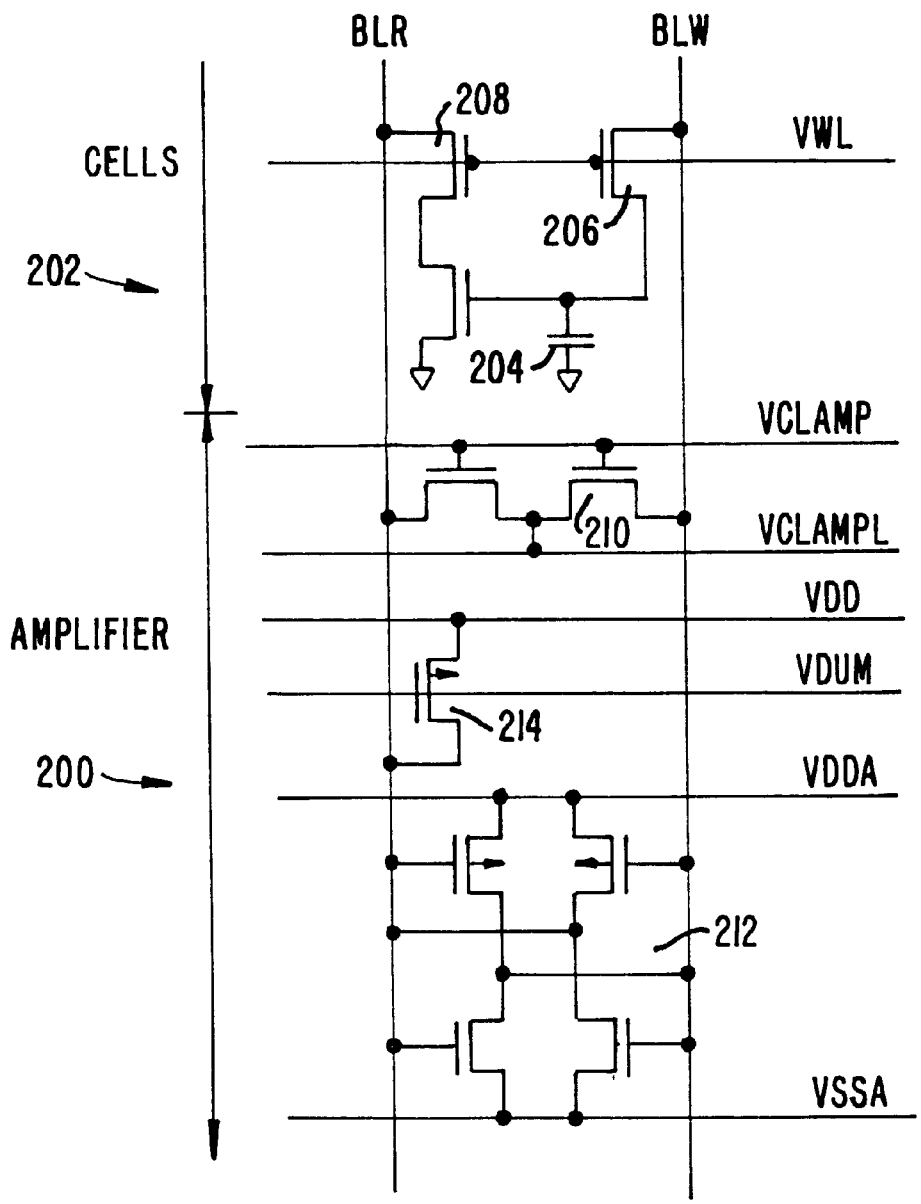
FIGS. 2A–E show circuit and timing diagrams of latching and inverting amplifier circuits.
Figure 2B:
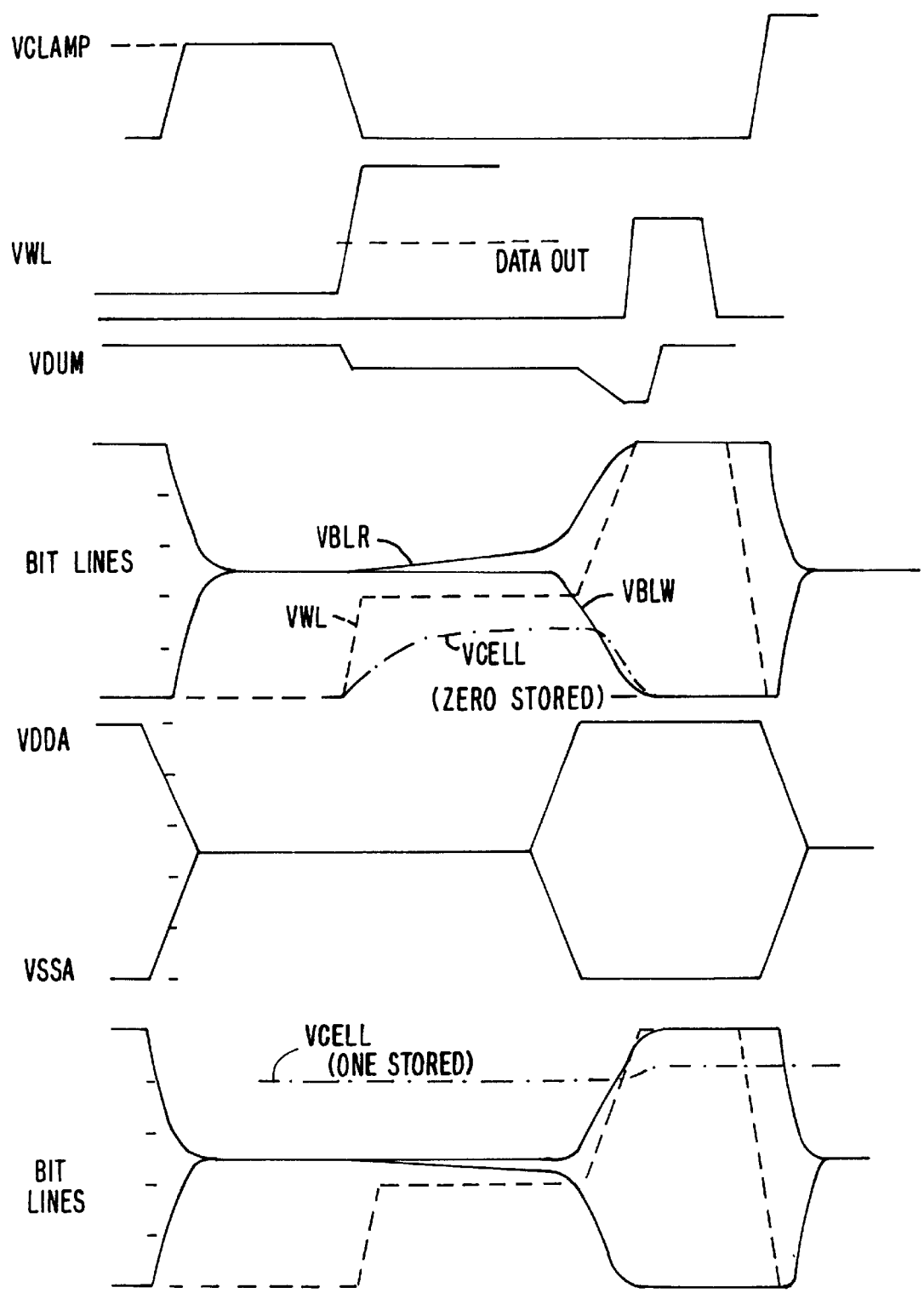

The type of amplifier 108 used depends on the application for memory 100. For the highest possible speed, where disturbance on the cell capacitor voltage is permitted to be high, a basic latching amplifier 200 coupled to memory cells 202, as shown in FIG. 2A, may be used. Memory cell 202 includes a storage capacitor 204, a write transistor 206 and a read transistor 208. Amplifier 200 includes clamping transistors 210 and cross-coupled inverters 212. The corresponding timing diagram is shown in FIG. 2B. It should be noted that for highest speed with a given transistor size in memory cells 202, a higher initial cell current can be obtained if the threshold voltage on write transistor 206 is increased. There is of course a great advantage to using a standard CMOS process for the memory, especially if mixed with logic. The segmented bit line approach and small cell capacitors 204 are preferred to maintain the highest possible memory speed. In that case, the segments would be coupled together just after amplifier 108 has been powered up.

In operation of the memory shown in FIG. 2A, at the end of a memory cycle, the power to the amplifier is turned off and VCLAMP is turned on, clamping the bit lines to the clamp voltage level (VCLAMPL), which is typically about half of the Vdd level. At the beginning of a new memory cycle, VCLAMP is brought low, allowing the bit lines BLR and BLW to float. VWL is then brought to an intermediate level that is at least high enough to draw current from the read bit line BLR if the voltage on cell capacitor 204 is high (a stored ONE). If, on the other hand, the voltage on cell capacitor 204 is low (a stored ZERO), an excessively high signal level on VWL will charge the cell capacitor through write transistor 206 during the read portion of the cycle. A slight increase of the cell voltage while reading a stored ZERO from cell capacitor 204 is acceptable since the resulting read current is minimal compared to the cell current while reading a stored ONE. At the same time the first word line voltage is applied, a negative going voltage is also applied to dummy transistor 214, causing it to feed a current to BLR which is designed to be about equal to the average current for reading a stored ONE or for reading a stored ZERO from cell capacitor 204. As shown in FIG. 2B, BLR is pulled in the positive direction when a stored ZERO is read because the dummy current dominates. While reading a stored ONE, however, the cell current dominates and pulls BLR in the negative direction. As soon as the voltage difference between the bit lines is sufficient for reliable operation, the supply voltages VDDA and VSSA for latching amplifier 212 are applied. Bit lines BLR and BLW will then quickly move to their respective rail voltages. Once each bit line is close to its final voltage, the voltage on the word line VWL is increased to at least a level of VDD. A previously stored ONE will now be refreshed to approximately one threshold voltage less than VWL, while a previously stored ZERO will be restored to 0 V.

Figure 2C:
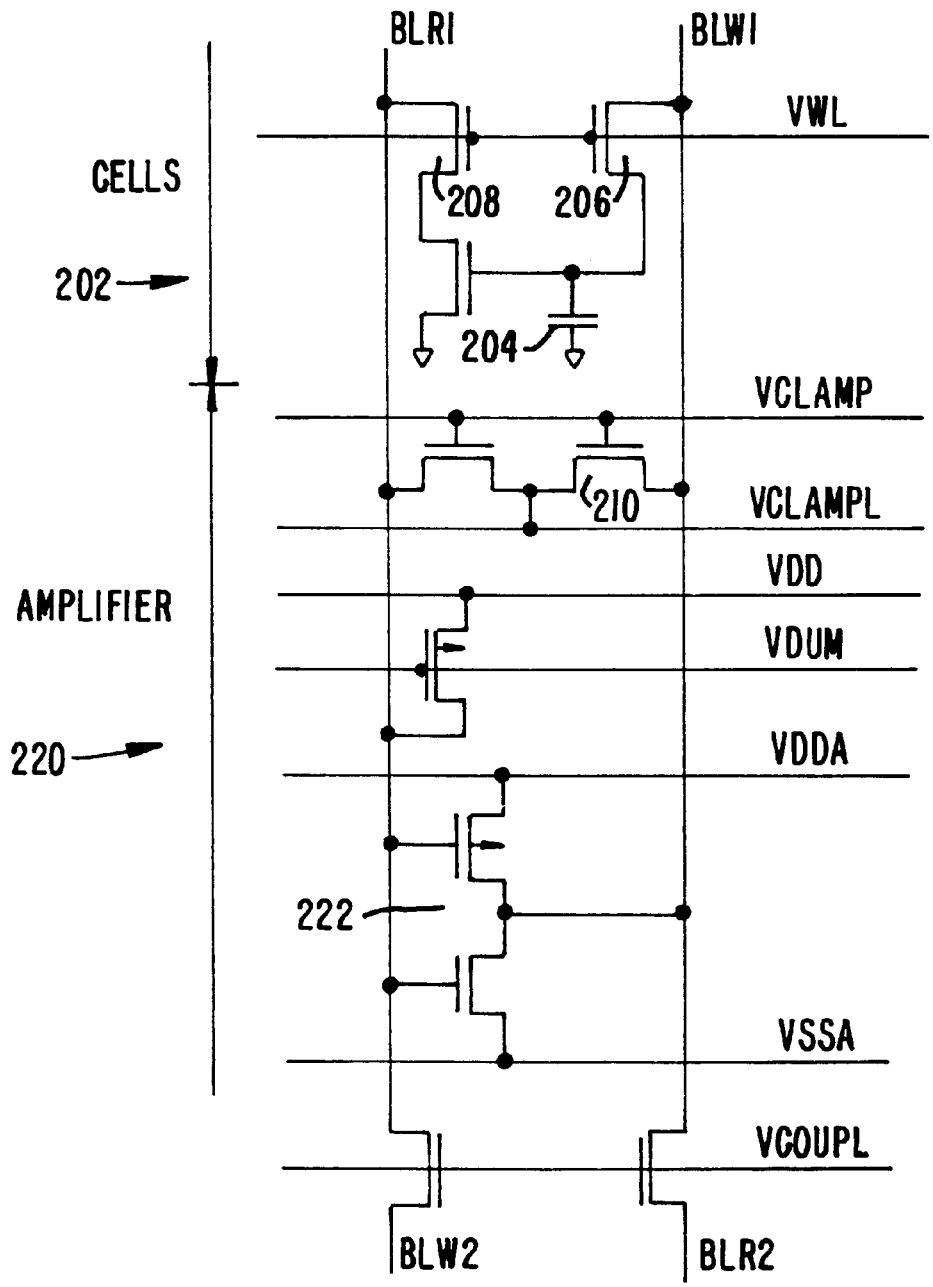
Figure 2D:
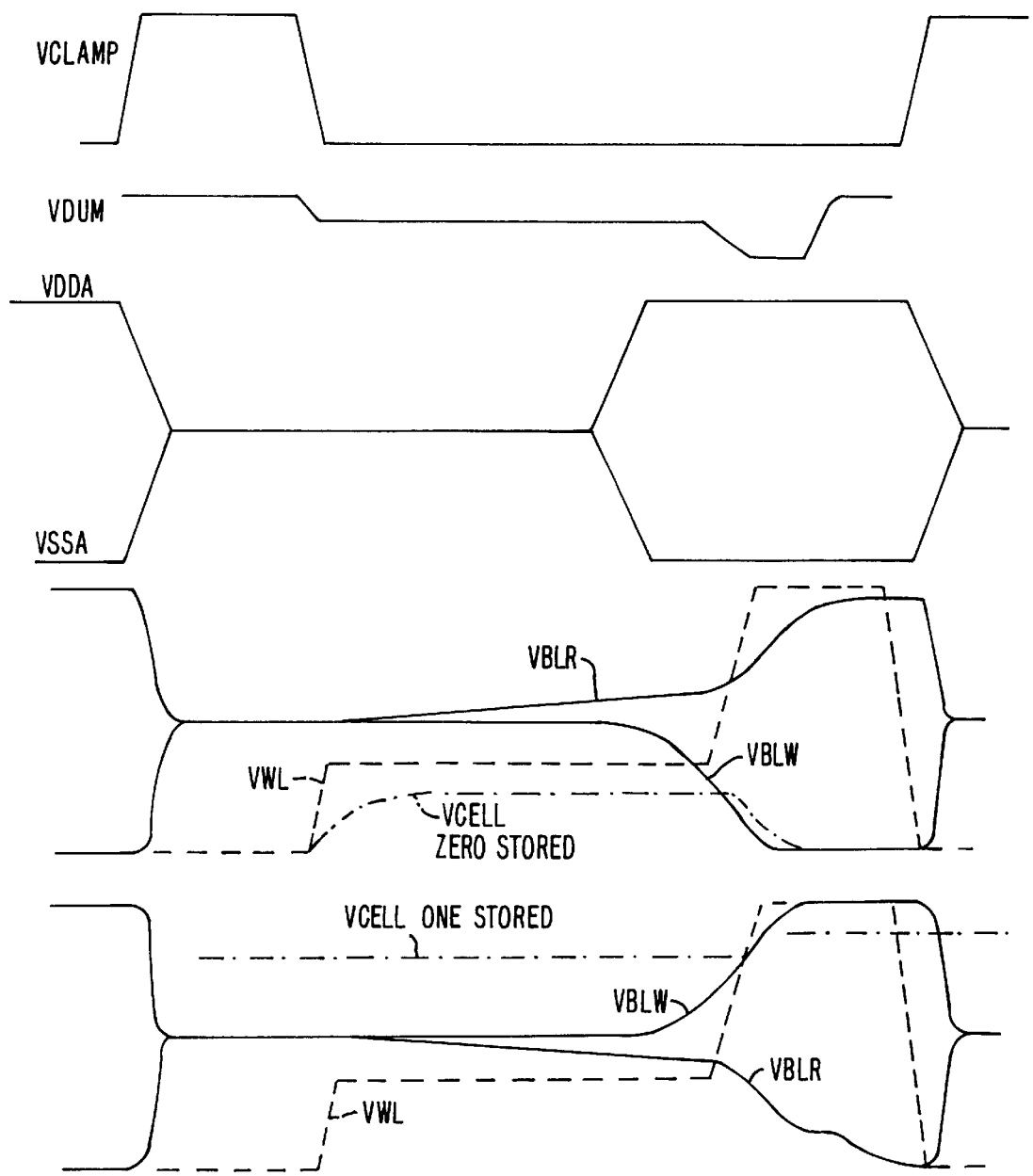
Figure 2E:
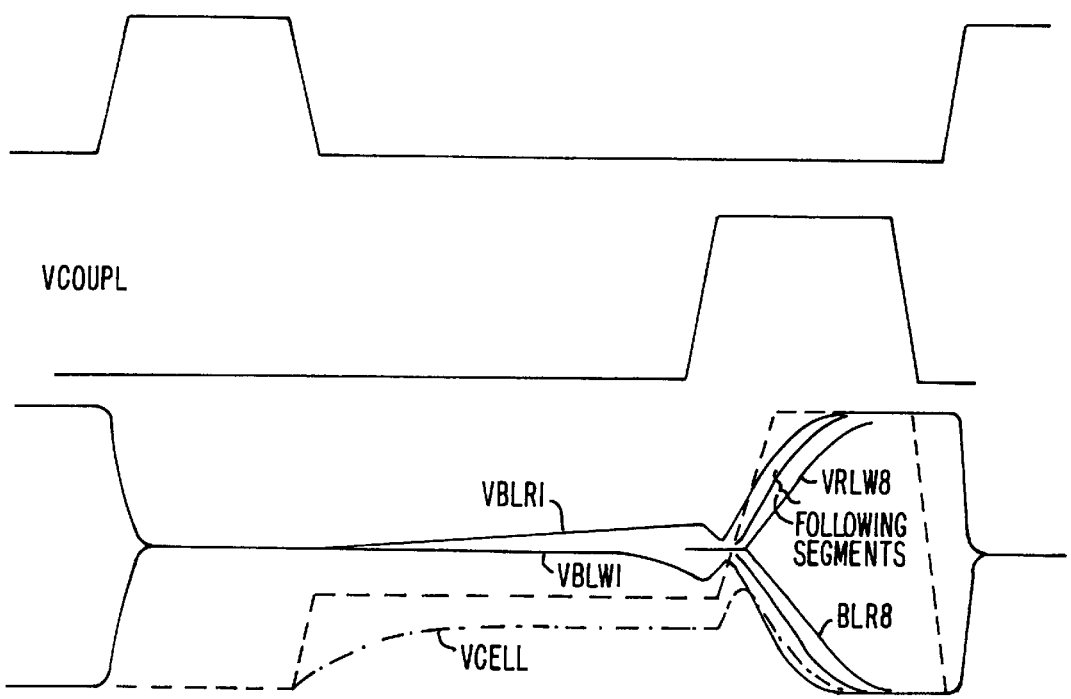

If speed is not the primary goal and the disturbance level on the cell capacitors 204 is allowed to be high, the basic inverting amplifier 220 coupled to cells 202, as shown in FIG. 2C, may be used. The operation of the memory shown in FIG. 2C is similar to that of the memory shown in FIG. 2A. Amplifier 220 includes clamping transistor 210 and a simple inverter 222. The clamping to a common reference level, which is chosen to be close to the switching point of the amplifier, is not very accurate, as the switching point of the amplifiers varies with changes in the device parameters. The timing must therefore be adequate to allow the cell current to displace the read bit line BLR at least as much as the error before, since the bit line voltages represent the actually stored data. The power to the inverter amplifier 220 should not be turned on before the worst case clamping error has been compensated. This will prevent the write bit line BLW from temporarily going to a ground level with the word line on, which would cause a stored one to be discharged to a zero. A stored zero on the other hand would not be affected if the write bit line inadvertently went to the high level, while the word line voltage is still at its lower level. The preferred method is to wait a sufficient time until a potential clamping error has been compensated for. The amplifier will then consistently move the write bit line in the correct direction. As discussed earlier, power consumption can be minimized if power is turned on even later in the read mode, so that read bit line BLR has moved closer to a rail voltage. If the inverting amplifier is used in connection with segmented bit lines, the coupling can be made only when the clamping error has been compensated and the signal has been amplified somewhat. FIG. 2D shows the timing for amplifier 220 in FIG. 2C, and FIG. 2E indicates the amplifier's performance as part of a segmented bit line configuration. Note in the latter case how the partially amplified signal on both bit lines BLR and BLW is temporarily reduced when the adjacent segment is connected. Again, the read bit line BLR on the read segment is connected to the write bit line BLW on the next segment. The segments together act as a plurality of latched amplifiers. It is important that all amplifiers are powered up before the segments are coupled, as this guarantees a gradual amplification of the initially reduced signal before it progresses down the full bit line. Without amplification, the signal on the read bit line BLR of the read segment would be reduced to a small fraction of its original value. For a memory structure where a bit line is made up of eight segments, then, the signal would be reduced by a factor of eight. This signal is too weak to overcome the clamping error on some of the segments.

Compensation of Clamping Error

Figure 3A:
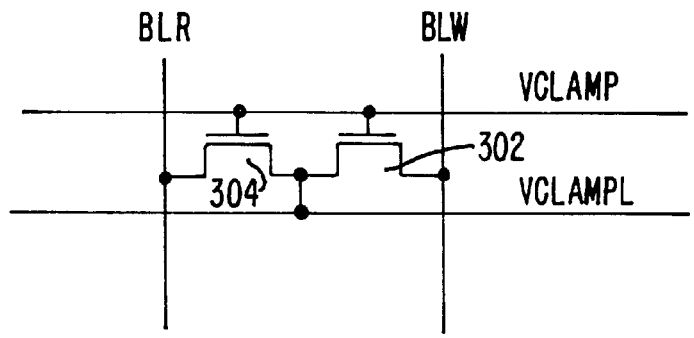
FIGS. 3A–J show circuit diagrams of clamp circuits according to the present invention.
Figure 3B:
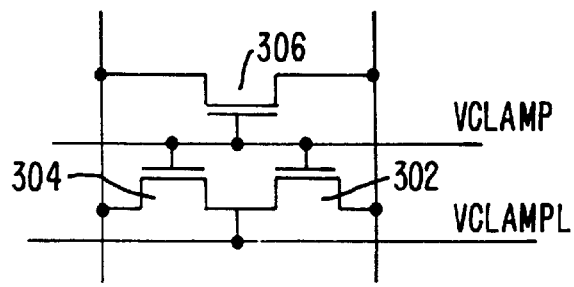

In applications where the cell current is low, yet fast memory cycle times are still needed, it is desirable to minimize the clamping error. FIGS. 3A through 3G illustrate the different clamping devices and methods. FIG. 3A shows a preferred structure with clamping transistors 302 and 304, which was also shown in FIGS. 2A and 2C. Both bit lines will reach the reference level VCLAMPL, while VCLAMP is high, but when VCLAMP goes low, the gates of the transistors 302, 304 will couple a small negative charge to each of the bit lines. The voltage drop on the bit lines can easily be as much as 100 mV, if a short clamp time is desired. To achieve a short clamp time, the clamp transistors 302, 304 must be relatively large. Segmented bit lines, with their lower capacitance, will have smaller clamp transistors than full-length, unsegmented bit lines, but the ratio of gate capacitance to bit line capacitance is the same and therefore the result is a comparable disturbance. The latched amplifier 200 (FIG. 2A) is relatively immune to the clamping offsets that appears equally on both bit lines. Latched amplifier 200 suffers from a non-correctable offset error due to device parameter variations. The two cross-coupled inverters 212 may have different switching points. One of the bit lines will therefore be moving at a different rate after clamping than the other bit line. The cell current must be larger than the built-in offset current for a correct reading of the selected cell. If used in a segmented bit line configuration, there is a risk that one or more of the non-selected segments may start to switch on their own before the segments are connected, which could result in a read error. The clamp circuit in FIG. 3B addresses this possibility by adding transistor 306 that directly shorts the bit lines during clamping.

Figure 3C:
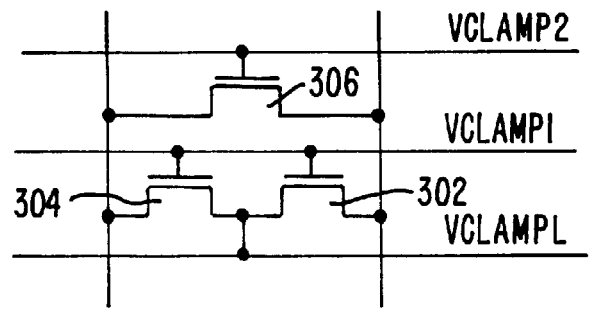
Figure 3D:
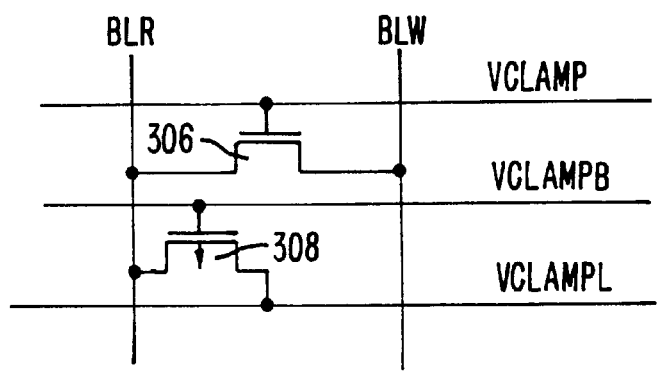

The inverting amplifier 220 (FIG. 2C) is sensitive both to the difference between its switching point and the reference VCLAMPL and to the effect of turning off VCLAMP. Instead of waiting for the read bit line to overcome the worst case clamp error, another approach may be taken, as shown in FIG. 3C. VCLAMP1 again connects both bit lines to a common reference voltage VCLAMPL while power is off, but VCLAMP1 is turned off as soon as power is turned on. VCLAMP2, on the other hand, turns on at the same time as VCLAMP1, but stays on longer. When power is turned on, the bit lines are at the potential of VCLAMPL, which may be different than the switching point of the inverter. VCLAMP2 shorts the input and the output of the inverter, so that the bit lines are moved to the switching point, thus putting the inverter in full balance before the cell current is applied to the read bit line. Note that turning off VCLAMP2 causes a negative displacement of the bit lines. The displacement on the read bit line (the inverter input) is most critical and must be compensated by coupling a positive charge to the read bit line. The clamp shown in FIG. 3D accomplishes that objective. Here, the connection to the reference voltage is done with a P-channel transistor 308. VCLAMPB goes positive at essentially the same time that VCLAMP goes low. The P-channel transistor 308 has a relatively high on resistance compared to the N-channel clamping transistor 306 and the impedance in the inverter associated with searching the switching point centering. The purpose of the P-channel transistor 308 is to maintain the bit lines close to the switching point at for a longer stand-by period. Since the switching point is set to half the Vdd level (Vdd/2), and the bit lines before clamping are set to the rail voltages, the potential of the bit lines after clamping will therefore be close to Vdd/2. The width and length of the P-channel transistor 308 can be chosen such that the requirement for both high impedance and the required coupling of charge to the read bit line BLR can be met.

Figure 3E:
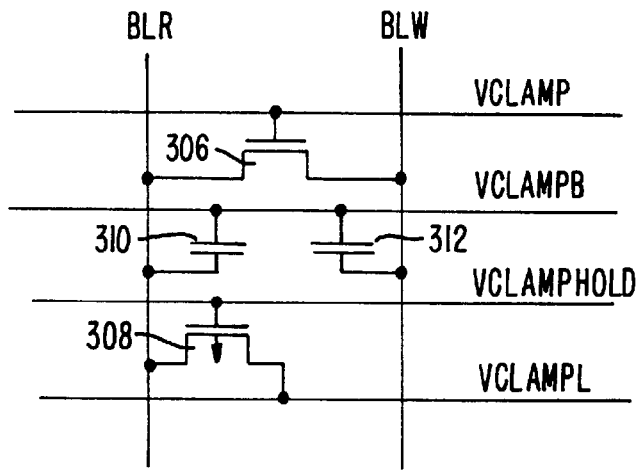
Figure 3F:
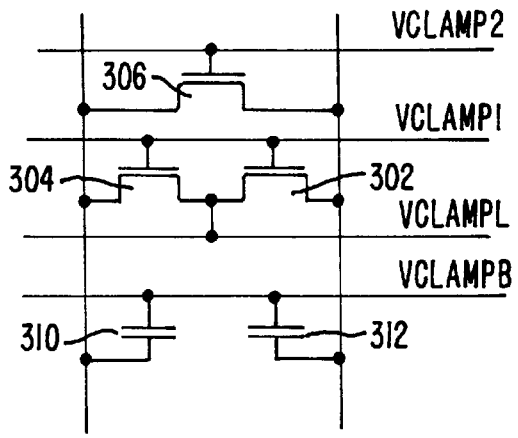

FIG. 3E illustrates the addition of compensating capacitors 310 and 312 between VCLAMPB and bit lines BLR and BLW that are chosen to fully compensate at turnoff of the clamp transistor 308. In FIG. 3F, VCLAMP1 holds bit lines BLR and BLW at the reference level in standby mode, while VCLAMP2 remains high after power has been turned on to inverter 220 (FIG. 2C). The charge transfer to the bit lines, when CLAMP2 is turned off, is compensated by VCLAMPB going positive. The compensation is necessary on the inverter input, but is less critical on its output, so the compensation can be limited to only one capacitor on the read bit line.

Figure 3G:
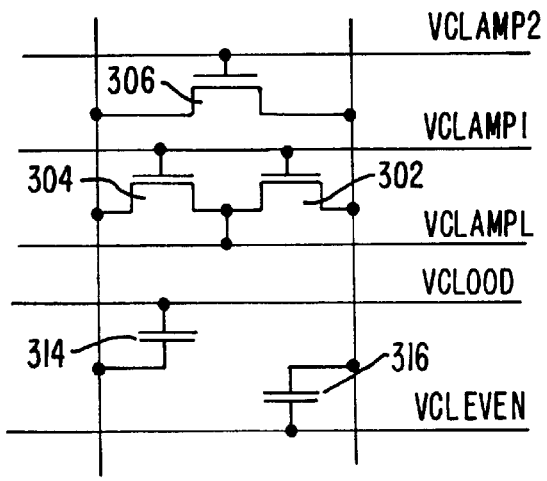

As will be discussed herein, the advantageous features of inverting amplifier 220 and segmented bit lines in FIG. 1A can also be applied to conventional DRAM cells. In that case, the DRAM cells are connected to both bit lines. This type of clamp circuit is shown in FIG. 3G. The associated amplifier includes two separately powered inverters and two separately driven compensation capacitors 314 and 316. A similar amplifier arrangement can also be used for the DRAM cells of this invention, except that a common drive signal for the compensating capacitors shown in FIG. 3F can be used. The compensating capacitors used in a conventional DRAM may serve two purposes. First, they supply the charge to compensate for the negative charge transferred when VCLAMP2 goes negative, but the size of the capacitor is a little larger than required for that compensation. The added charge pre-biases the bit line to which the read cell is connected, so that reading a cell will give the same absolute voltage difference between the read bit line and the switching point for both a charged and a discharged cell capacitor. In reading and writing data in a segmented bit line configuration, the segments that are not addressed must have their read bit lines BLR very close to the switching point not to cause errors. The compensating charge transfer for these segments, must therefore be less than for the selected segment. This can be accomplished by using a lower amplitude on the compensating voltage or, of course, a separate compensating capacitor can be used to add the dummy charge on the selected segment.

Figure 3H:
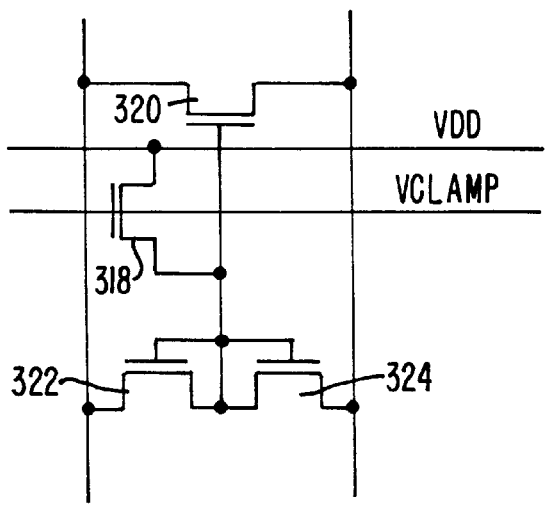

The amplitude of the clamp signal for all the cases discussed above is the full Vdd voltage, resulting in a large capacitive coupling when the clamp signal is turned off. In the initial time period after clamping, the bit lines will still be close to the clamping level (Vdd/2). This means that the clamp signal need not initially go more negative than to ((Vdd/2)+Vth). As the cell current proceeds to separate the bit lines, the clamp signal must track the negative-going bit line. The arrangement in FIG. 3H shows such an configu-ration. Here, when VCLAMP is turned on, transistor 318 lifts the gate of transistor 320 to (Vdd−Vth), which clamps the bit lines together. The transistors 322 and 324 act as diodes and are designed as relatively weak transistors in order to limit how much they can pull the clamped bit lines positive while VCLAMP is high. Transistors 322 and 324 are actually designed so that the positive excursion during the time of clamping is exactly as much as the negative capacitive coupling when VCLAMP goes low. When transistor 318 is turned off, transistors 322, 324 proceed to pull the gate of clamp transistor 320 toward the lowest bit line voltage plus the threshold voltage of transistor 322 and transistor 324. With a normal threshold, this tends to hold a slight clamping for a short period, reducing the gain of the inverter for small cell currents. By terminating the clamp signal early or by using lower threshold voltage on 322 and 324, this problem can be eliminated. When the bit lines eventually move, the low-going bit line will continue to keep the gate of the clamp transistor 320 just below its threshold voltage.

Figure 3I:
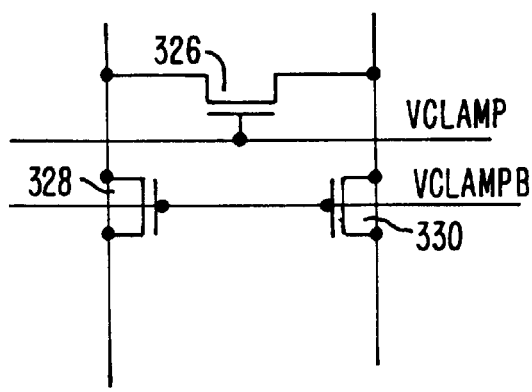

In several of the amplifiers, the assumption has been made that the amplifier power is permanently connected. This means that the bit lines are close to Vdd or Vss between cycles. A clamping operation will then have to swing the bit lines as much as Vdd/2 to the switching point of the amplifier. The time required for the clamping operation is in this case slightly longer than when the bit lines start out close to the clamp level. The clamping circuit as shown in FIG. 3I is used for this purpose and consists of one N-channel clamp transistor 326 and two capacitors, here shown as transistors 328 and 330 with both source and drain connected to the associated bit line, for compensation of the turnoff disturbance.

Figure 3J:
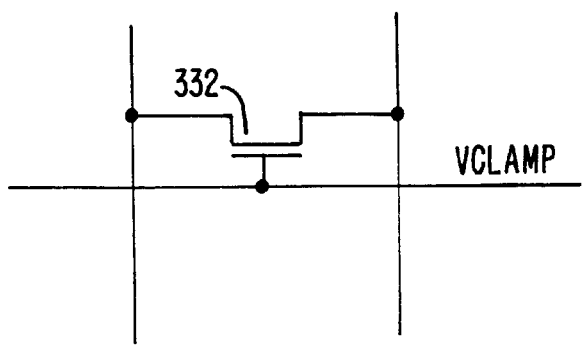

FIG. 3J shows a single N-channel clamping transistor 332, used in connection with clamping under power. Amplifier power is selectively turned on and off during a memory cycle. In cycles repeating frequently, the bit lines start out very close to the switching point. At the end of each cycle the two bit lines are clamped together after having been close to the opposite rail voltages. The refresh frequency must satisfy the requirements for the small cell capacitors, so larger bit line capacitances will discharge very little between cycles.

The amplifier's VddA and VssA nodes are both connected to the reference level Vdd/2, which is the nominal switching point level. Any leakage through the transistors would go to this level. Only junction leakage could cause the bit lines to drift away from the reference level. The inverter transistors would however limit the drift to one threshold away from the reference level in either direction. Starting from this worst case situation, the adjustment toward the switching point after applying power to the amplifier follows the table below. The inverter has a W/L ratio for the N and P transistors of 1.2/.6 and 2.4/.6, respectively, while the bit line capacitances are 100 fF (100E-15).

| Time after power on VBLR-Vref | |
|---|---|
| ns | mv |
| 0 | −600 |
| 2 | −376 |
| 3 | −163 |
| 4 | −68 |
| 5 | −19 |
| 6 | −5 |

-continued

Time after power on VBLR-Vref

| ns | mv |
|---|---|
| 7 | −1 |
| 8 | 0 |

Turning off a clamp transistor of with W/L of 2.4/.6 introduces a disturbance of −80 mV. The disturbance must be considered in relation to the cell current. The rate of voltage change on the read bit line is 10 mv/($\mu$A*ns) for the bit line capacitance of 100 fF. A differential cell current (Icell−Idummy) of 5 $\mu$A would change the bit line voltage at a rate of 50 mv/ns. Turning off the clamp after 5 ns, with the cell current on, would result in full compensation 7 ns after the start of the cycle, overcoming 80 mv plus 19 mv. At lower cell currents the clamping will be turned off about 1 ns later, and it would take longer to compensate for the offset caused by the clamp transistor. At a differential cell current of 1 $\mu$A, the total time to compensation would be about 14 ns. The polarity of the disturbance on the read bit line is such that the write bit line for the lower cell currents may go positive to near the Vdd level. This would not cause any disturbance on the addressed segment. If however the read bit line starts out at Vref+600 mV and the clamp transistor turns off while the read bit line is still more than 80 mV above the reference, the write bit line would go negative.

Only if the clamp is turned off very early could the write bit line go below the word line voltage, thus turning on the write transistor and write a zero in a cell that was a one. This case is very remote as the word line voltage would by design not be turned on that early.

A more serious problem occurs in reading and writing data in a segmented bit line configuration. The disturbance introduced by turning off the clamp voltage would remain on the non-selected segments. The current to the write bit line caused by an 80 mv differential voltage on the read bit line is approximately 12 $\mu$A, with the inverter dimension as discussed above. The bit lines would be displaced at a rate of 120 mV/ns and thus completely override the contribution from the selected segment except for rather high cell currents. A cell current of 1 $\mu$A will change the read bit line voltage at a rate of 10 mv/ns. The displacement on the write bit line after T nS follows the equation Vdispl=Icell($\mu$A) *10*TSquared/2 mV. A cell current of 10 $\mu$a would after 2 ns have displaced the read bit to +120 mV and the write bit line to −120 mv, while at the same time the bit lines on the non-selected segments would have moved 240 mV positive. A simulation has shown that a cell current of at least 40 $\mu$A would be required to operate an 8-segment memory, assuming bit line capacitances of 100 fF. By using different clamping times for selected and non selected segments, the problem is highly reduced. If the clamping on the non selected segment is terminated just before the signal coupling the segments together is turned on, the voltage between the non-selected segments would be approximately 100 mV. Allowing the bit lines in the selected segment to be displaced more than k*100 mV before coupling, where k is the number of segments, would yield more reliable operation. Some of the amplifiers shown may use a second inverter in each segment which can be selectively engaged. Allowing the second inverter to contribute to the amplification in the selected segment before the coupling satisfies the above-stated requirement.

It was assumed above that the power to the amplifiers was selectively turned on and off during the memory cycles. The method of clamping to the switching point of the inverters used in some amplifier configurations, however, makes it natural to operate the amplifiers under full power all the time. This means that in standby mode, the bit lines will always be at or close to the rail voltages. The clamping will, when used in connection with an inverter, bring the bit lines to the inverter switching point against the transistor that is in the holding mode. The final adjustment to the switching point level will therefore take somewhat longer than if the bit lines start out already close to the switching point as described before.

Figure 4A:
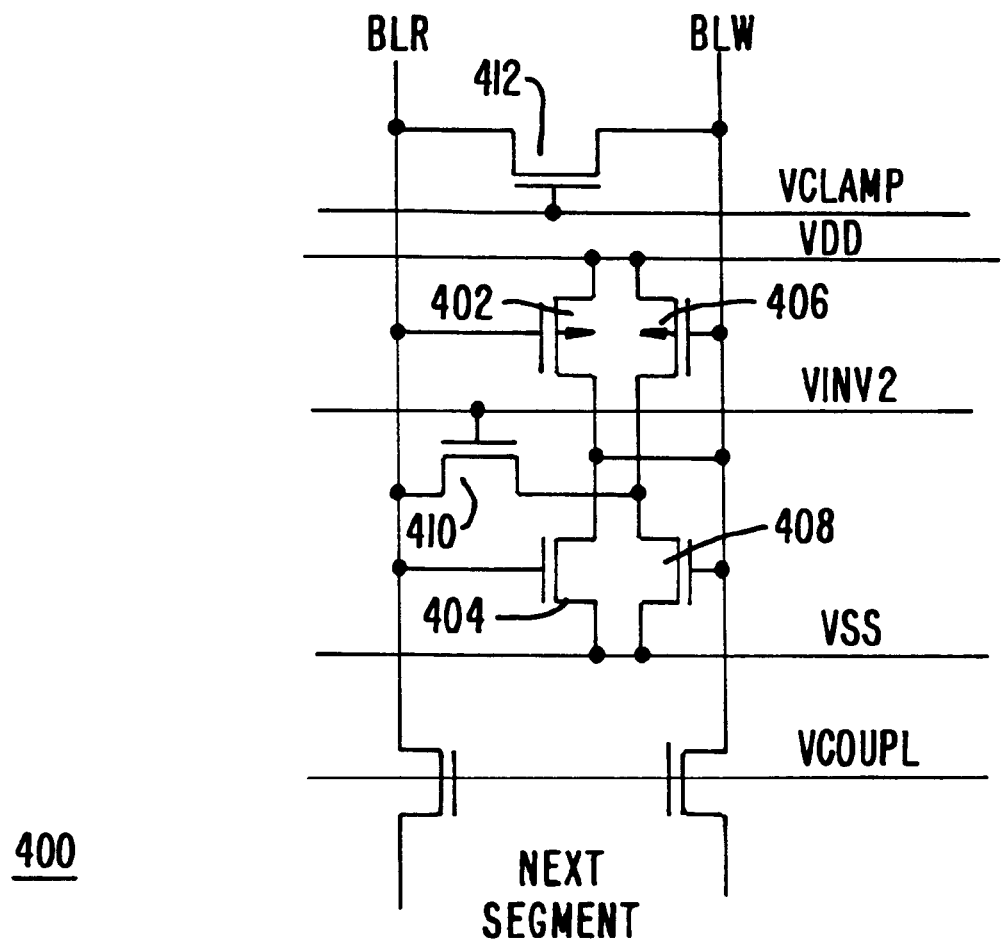
FIGS. 4A–C show circuit and timing diagrams of a two inverter amplifier.

FIG. 4A illustrates an amplifier 400 intended for segmented bit lines. The basic inverting amplifier consists of transistors 402 and 404 that make up the first inverter, while the second inverter with transistors 406 and 408 may be added for additional amplification later in the memory cycle. Transistor 410, when turned on by the signal VINV2 will connect the output of the second inverter to the input of the first. The clamping is done by turning on the clamping transistor 412, thus shorting the bit lines BLR and BLW and adjusting to the switching point level of the first inverter. The selected word lines on the selected segments are brought to the reading level at essentially the same time as VCLAMP goes low. The read bit line BLR at this time has a predictable offset error as discussed above, due to incomplete adjustment to the switching point during clamping and the capacitive coupling from VCLAMP, when it goes negative. With only the first inverter connected (VINV2 low), the cell current will both overcome the offset and displace the bit lines sufficiently for a correct refresh level. If limited to only the first inverter and no coupling between segments, this would be a relatively slow operation of high power consumption.

Figure 4B:
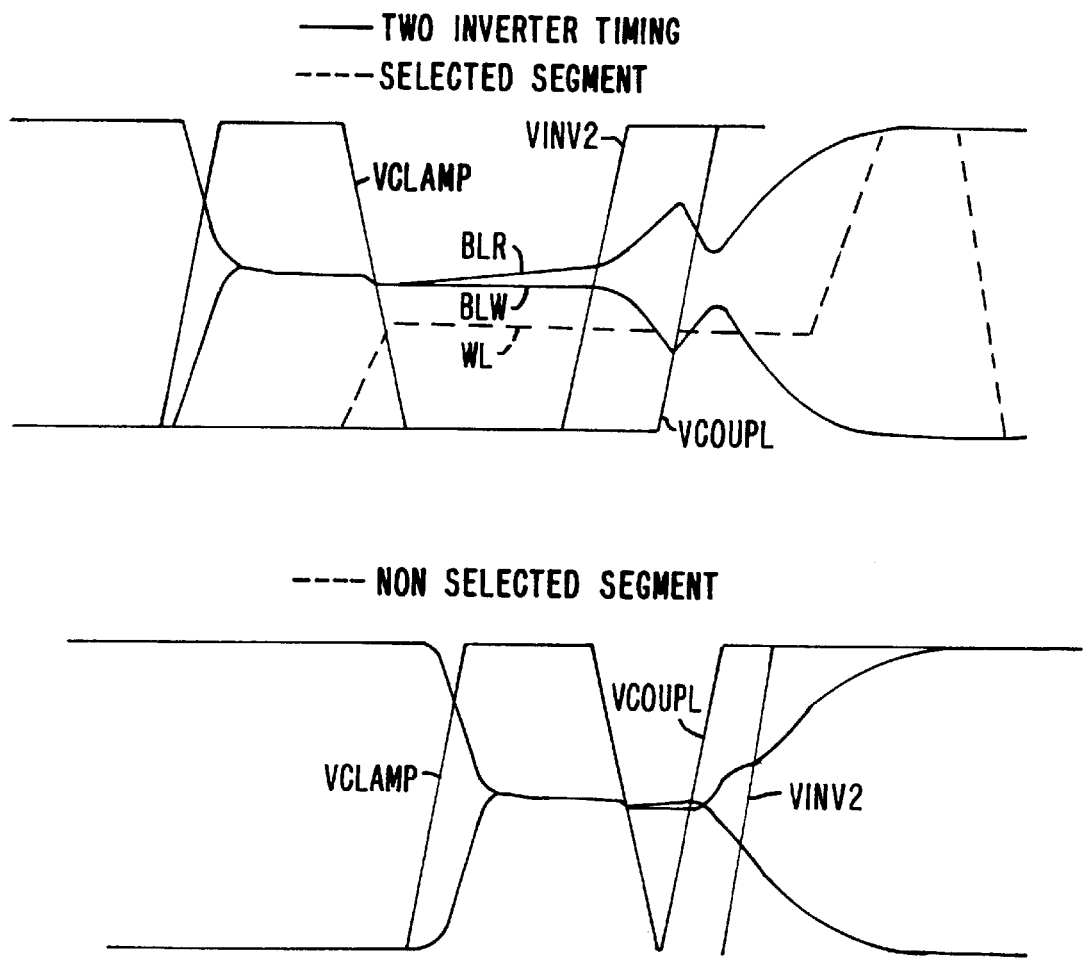

In the refresh mode, as discussed above, the segments remain separated and refresh cells on their selected word lines. To speed up the refresh cycle, the second inverter is connected at the time when the bit lines are separated on the order of 100 mV. The amplifier now acts as a conventional latching amplifier. When the memory is used in read or write mode, the offset on non-selected segment must still be considered. At the time of connecting the segments, the signals on the non-selected segments must be an order of magnitude smaller than the signal on the selected segment. As shown in the timing diagrams of FIG. 4B, a different approach is used that guarantees a suitable ratio between the signals. For the selected segment the clamping takes place first in the cycle, allowing the signal to grow, driven by the first inverter. Then the second inverter is connected and the higher amplification proceeds for some time until the segments are interconnected by the signal VCOUPL. A temporary drop in the signal is followed by the mutual amplification from the cross-coupled segment inverters. Initially only the selected segment has its second inverter contributing. The non-selected segments as shown in the lower timing diagram all have a delayed clamp signal that is turned off just before VCOUPL is turned on. Therefore, the only signal on the bit lines of the non-selected segments is the offset signal caused by the turnoff of the clamp signal. Once the coupling has been established, the second inverters on the non-selected segments are turned on, introducing additional speed to the read operation. The bottom segments in the selected columns may use the early clamp signal in write mode, permitting the full read cycle to apply the write signal, so that the signal at the bottom segment at the time of coupling is sufficiently larger than the signal on a selected segment other than the bottom segment, to guarantee correct writing.

Figure 4C:
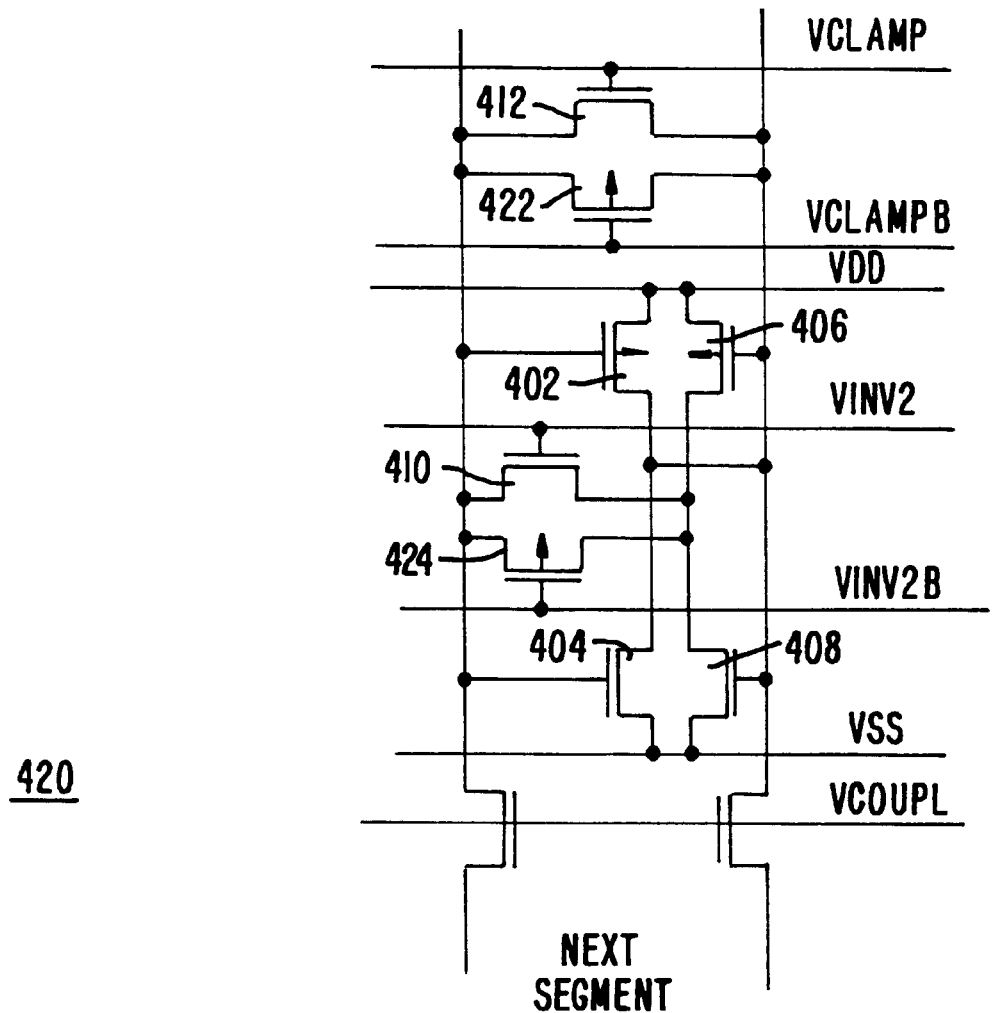

FIG. 4C shows amplifier 420 that is a variation of the two inverter amplifier. In amplifier 420, the clamping transistors include both N transistor 412 and P transistor 422, and coupling transistors include both N transistor 410 and P transistor 424. By optimizing the design in this way, most of the clamping disturbance can be eliminated.

Figure 5A:
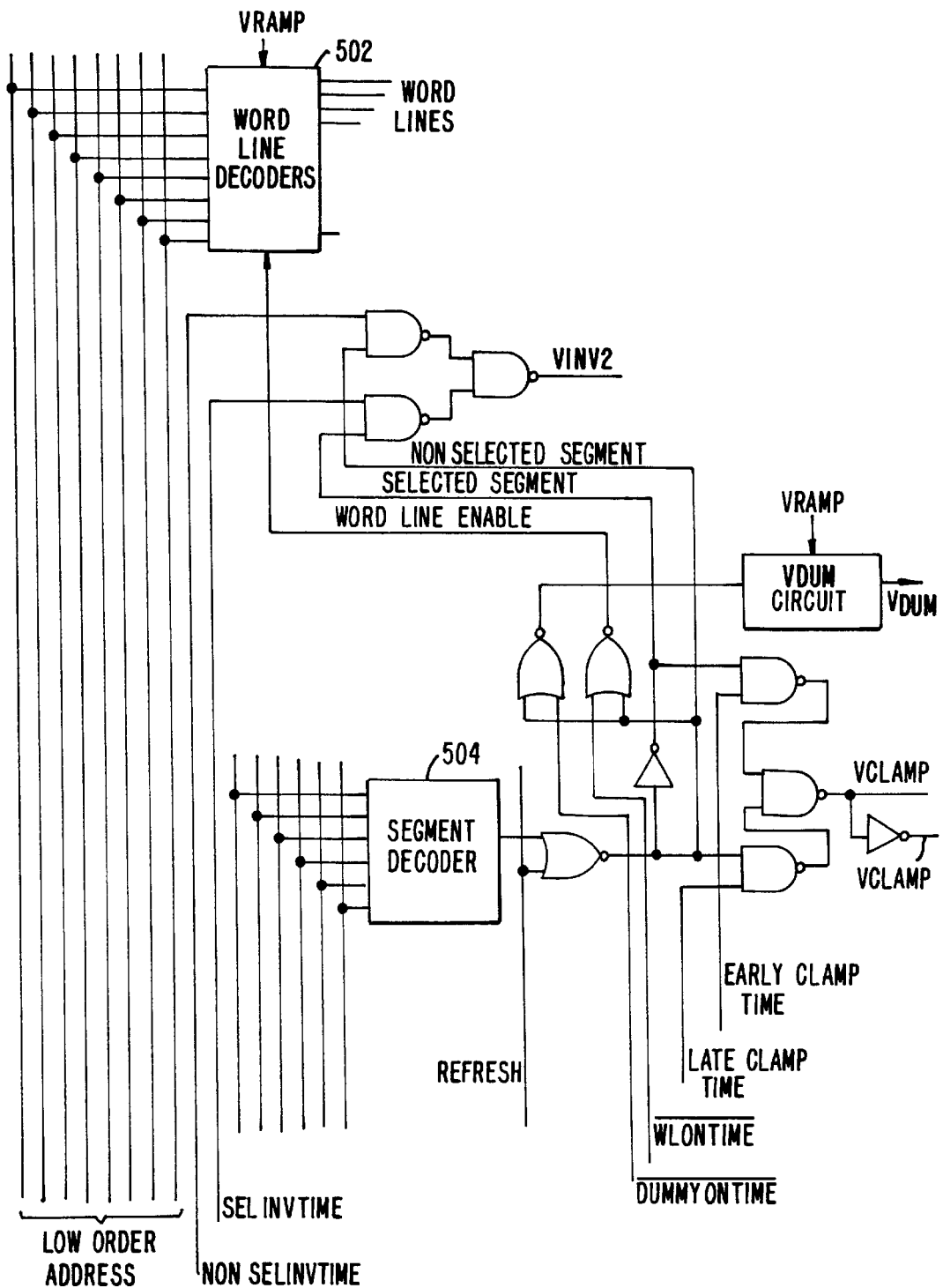
FIGS. 5A–B show simplified block diagrams of control logic circuitry for the memory of the present invention.
Figure 5B:
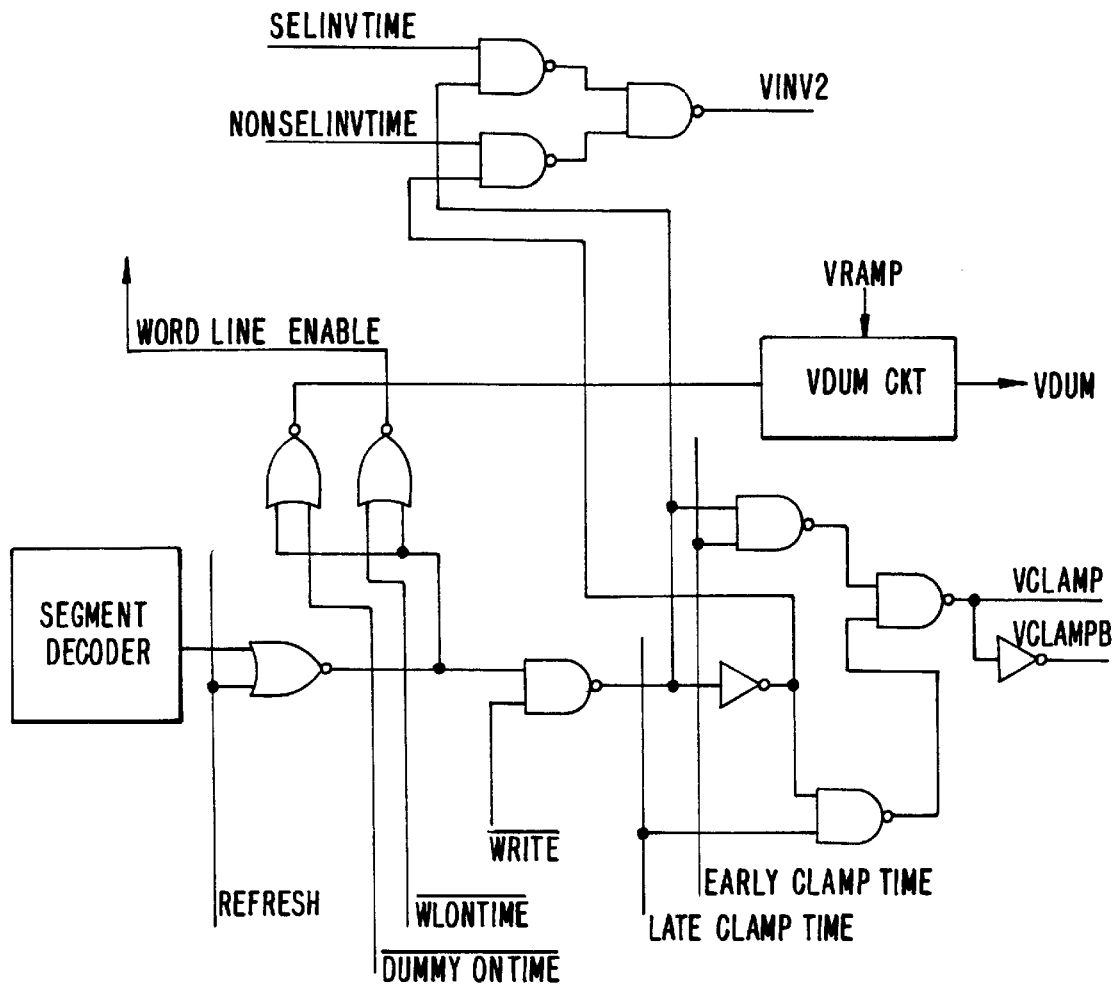

It has been mentioned that different timing is required for selected and non-selected segments. FIGS. 5A and 5B show the logic required for each segment for controlling an associated amplifier. All segments have the same logic shown in FIG. 5A, except the bottom segment of a bit line, shown in FIG. 5B, that is used for transferring data in and out of the bit line. A memory cycle may be initiated by a separately timed refresh request or an interrupting Block Enable or Chip Enable signal. Word Line Decoder block 502 and Segment Decoder block 504 decode the incoming function and address code to select a given segment in the memory and a given operation (a read or a write) and initiate a timing sequence. The appropriate timing signals are generated and applied to the memory block. The signals are routed to all segment controllers and are used slightly differently for selected and non-selected segments. In the refresh operation, which is requested by a free running clock, in one mode all segments are considered to be selected. The applied timing signals in the figures are Early Clamp Time, Late Clamp Time, Selected Segment Inverter on Time (SelInvTime), Non-selected Segment Inverter on Time (NonSelInvTime), Word Line on Time (WLonTime) and Dummy Current on Time (DummyOnTime). The abbreviations for these signals are shown in parentheses where appropriate. A ramp signal VRAMP is also applied, which may be common for the block or be generated in each segment, with the timing controlled by common signals not shown on the diagram. The logic for the bottom segment shown in FIG. 5B operates differently than the other segments during the write operation. The enabling of word line and dummy current is the same for all segments, but the clamp signal and the connection of the second inverter are always early for the bottom segment in the write mode. This ensures that the written data gives a dominating signal to the connected segments. In write mode, input data is coupled to BLR of the bottom segment; in read mode, output data is coupled to BLW of the bottom segment.

Figure 6A:
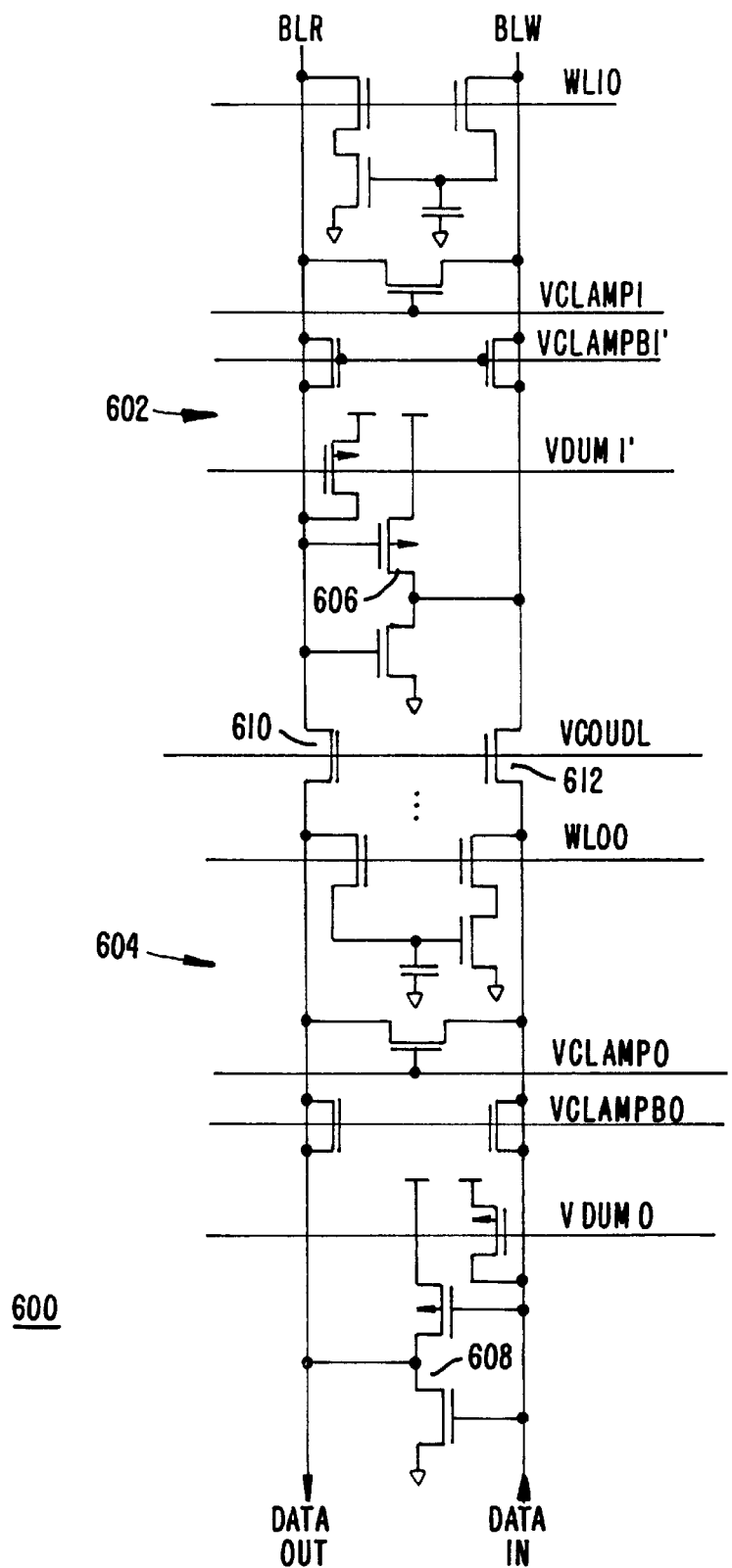
FIGS. 6A–C show circuit and timing diagrams of a single inverter amplifier.
Figure 6B:
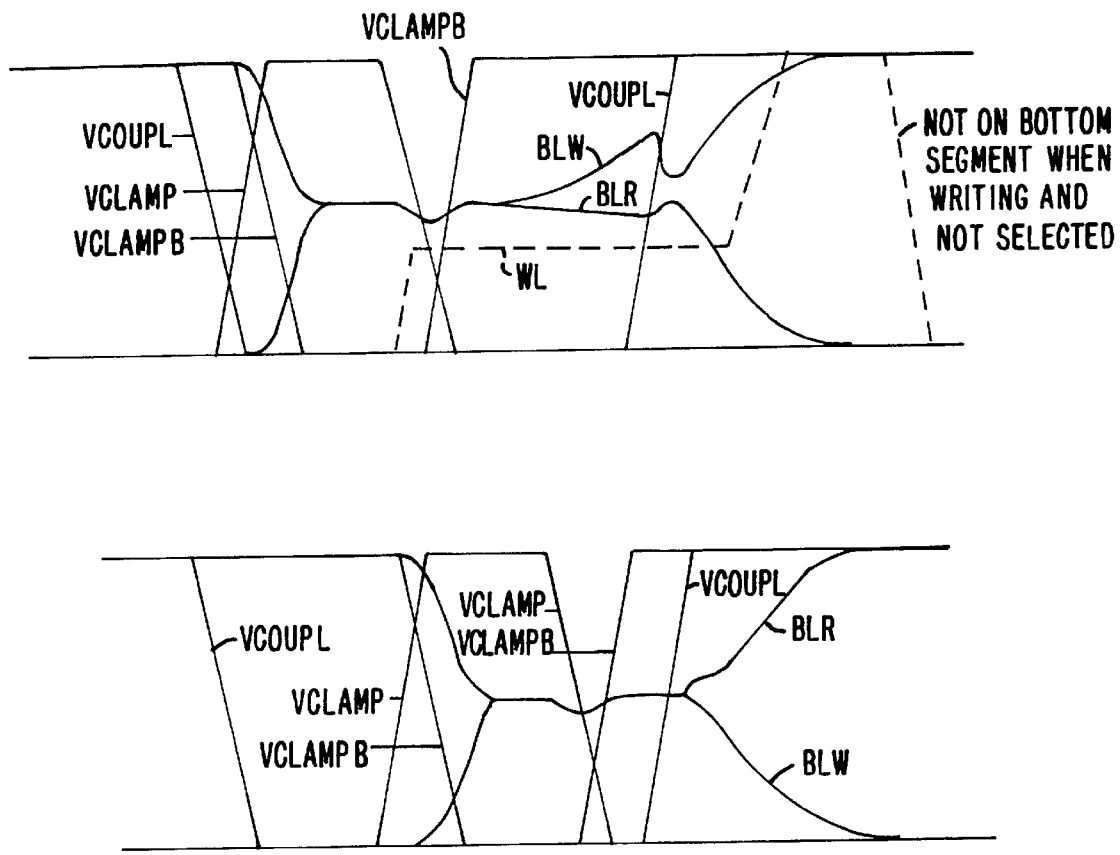
Figure 6C:
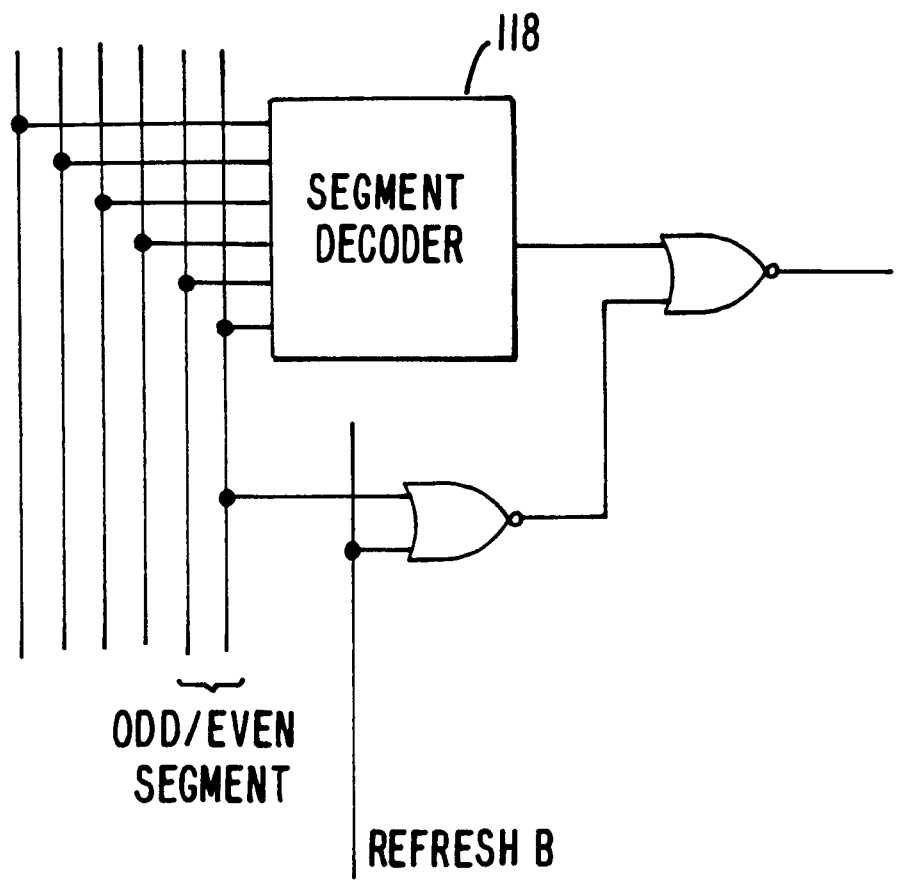

FIG. 6A illustrates a memory 600 having two segments 602 and 604 where only one inverter 606 and 608, respectively, in each segment operates under fixed power. Read bit line BLR from segment 602 is coupled to write bit line BLW of the next segment 604 through pass transistors 610 and 612 when VCOUPL is high. FIG. 6B shows the relative timing between selected and non-selected segments. In refresh mode, in a preferred embodiment, all segments are considered selected and the coupling signal remains low during the cycle. Alternatively, the segments may cooperate in pairs, resulting in the selection of every other segment. FIG. 6C shows how the selection of segment for refresh is controlled by the odd/even bit. This decoding may be common for all segments or local as shown. The coupling signal is divided in two. One signal is used only in the refresh mode, while the other is used in read and write modes. The advantage in pairing the segments in refresh mode is that the time and power consumption is reduced due to the higher amplification for the two cooperating inverters. The structure also makes it possible to pre-amplify the signal at reading and writing, before interconnecting all segments. The coupling signal interconnecting the two segments in the pair is made subject to early selection if one of the segments is selected. This increases the amplification of the pair of signals. When a dominating signal amplitude has been reached, all remaining coupling signals are activated. For a preferred margin, clamping is performed at three different times. The earliest clamp time is for the selected segment in a segment pair, the next clamp time is for the non-selected segment in the segment pair and the third time is for all remaining segments.

Conventional DRAMs and Segmented Bit Lines

Conventional DRAMs also gain in speed and margins by using the segmented bit line approach. The shorter bit lines used in conventional DRAMs have a lower capacitance that gives stronger signal for given cell capacitor sizes. This approach actually permits the use of smaller cell capacitors and higher refresh frequencies, as discussed for the new cell type above. The same methods for minimizing the disturbance caused by the clamping operation apply to conventional DRAMs. There is, however, a slight difference in the amplifier design. The cells in a folded bit line configuration may be alternately connected to one or the other of the two bit lines. All word lines with even addresses may, for instance, be selecting cells on one bit line, while all word lines with odd addresses would select cells on the other bit line. In the simplest amplifier discussed earlier having only one inverter, the coupling between segments must complete the amplifier so that the inverter output of one segment connects to the input of the inverter in the next segment. Each segment must therefore have two inverters, each selectively used according to which bit line is addressed.

Figure 7A:
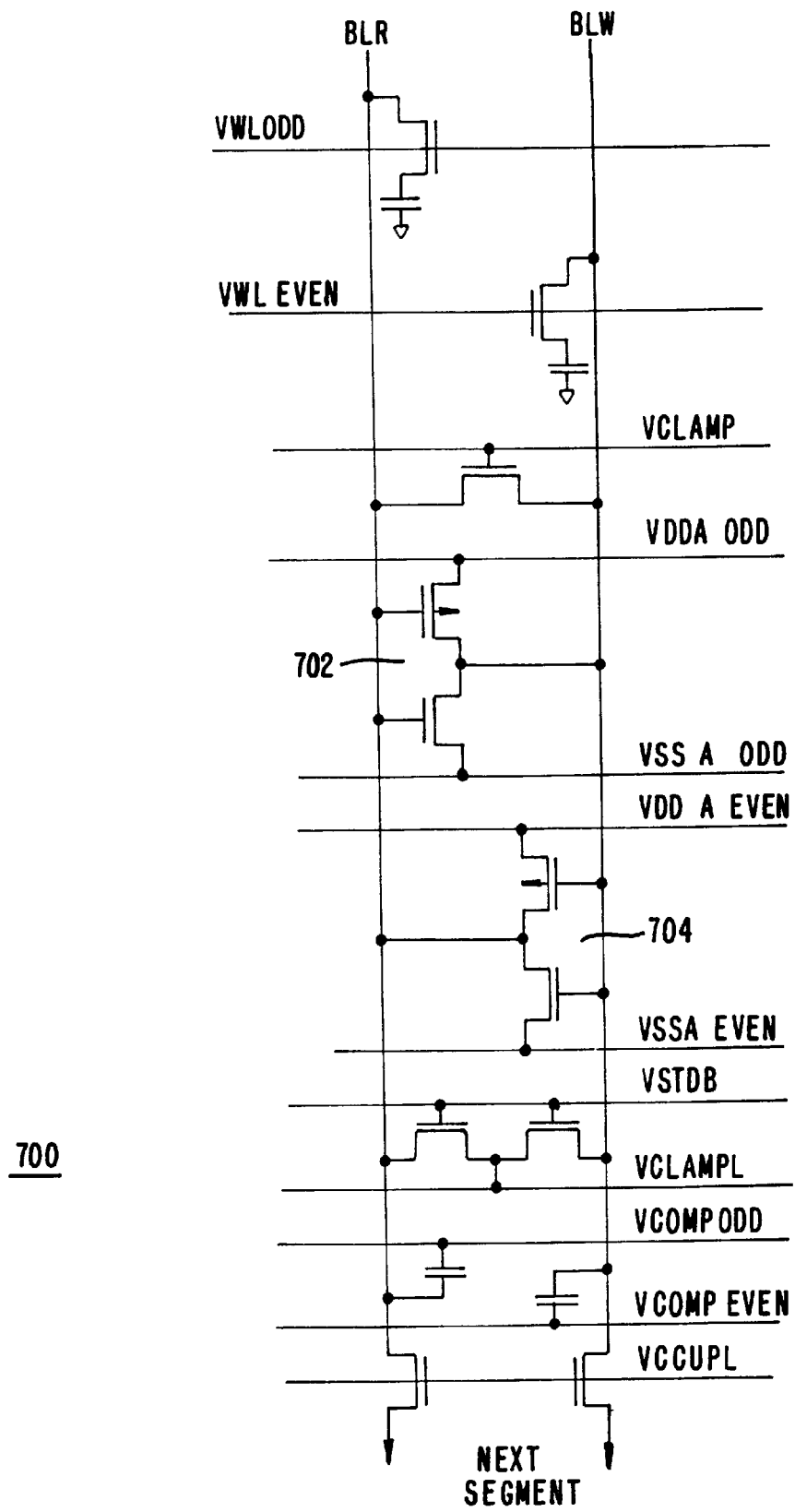
FIGS. 7A–E show circuit and timing diagrams of alternate embodiments of amplifier and control circuits according to the present invention.
Figure 7B:
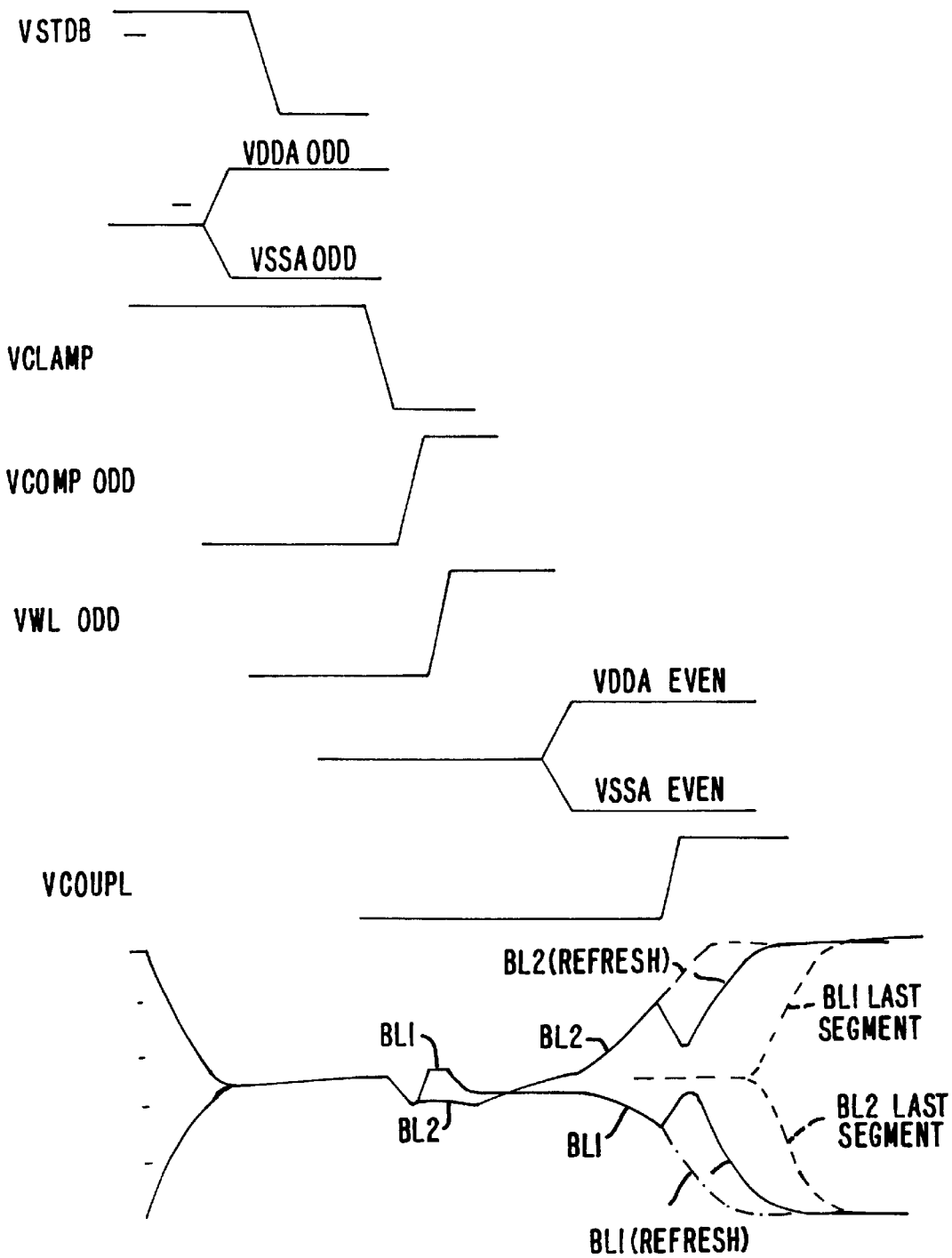

FIG. 7A shows memory cell 700 including an amplifier where while reading cell 701 power is first turned on to inverter 702, whose input is coupled to read bit line BLR holding the cell to be addressed by the word line. The bit lines are clamped while power is on, adjusting to the switching point of inverter 702. Due to capacitive coupling when VCLAMP goes low, the displacement on read bit line BLR is compensated by VCOMPODD going positive, as shown in FIG. 7B. The second inverter 704 in a selected segment may be powered up before the segments are coupled together by the VCOUPL signal. For reading and writing operations, this gives a large enough signal to overcome the combined error signals from the non-selected segments as discussed above. The non-selected segments will typically have the bit lines clamped late on the primary inverter 702 so that at time of coupling a very small signal has developed. The secondary inverter in non-selected segments is powered up only after the segments have been connected. Only in the refresh mode are both inverters 702 and 704 used the same way in all segments. The same principles regarding the inconvenience of turning power on and off applies to conventional DRAMs, so the same approach discussed for FIGS. 4A and 4B above can also be used here. The only difference is that, when used in connection with a fixed Vdd supply, the order of connection of the inverter amplifiers is determined on which bit line holds the addressed cell.

Figure 7C:
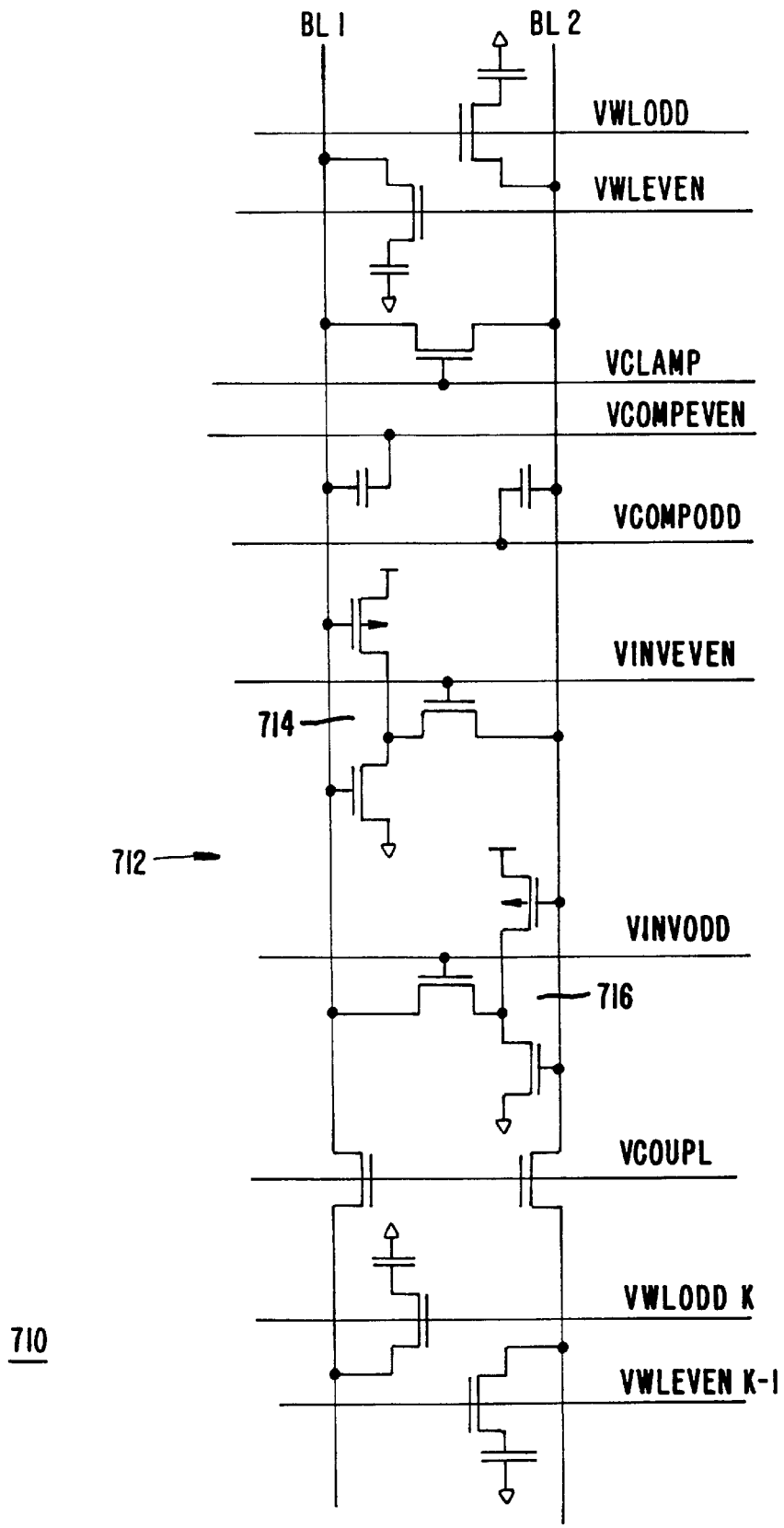
Figure 7D:
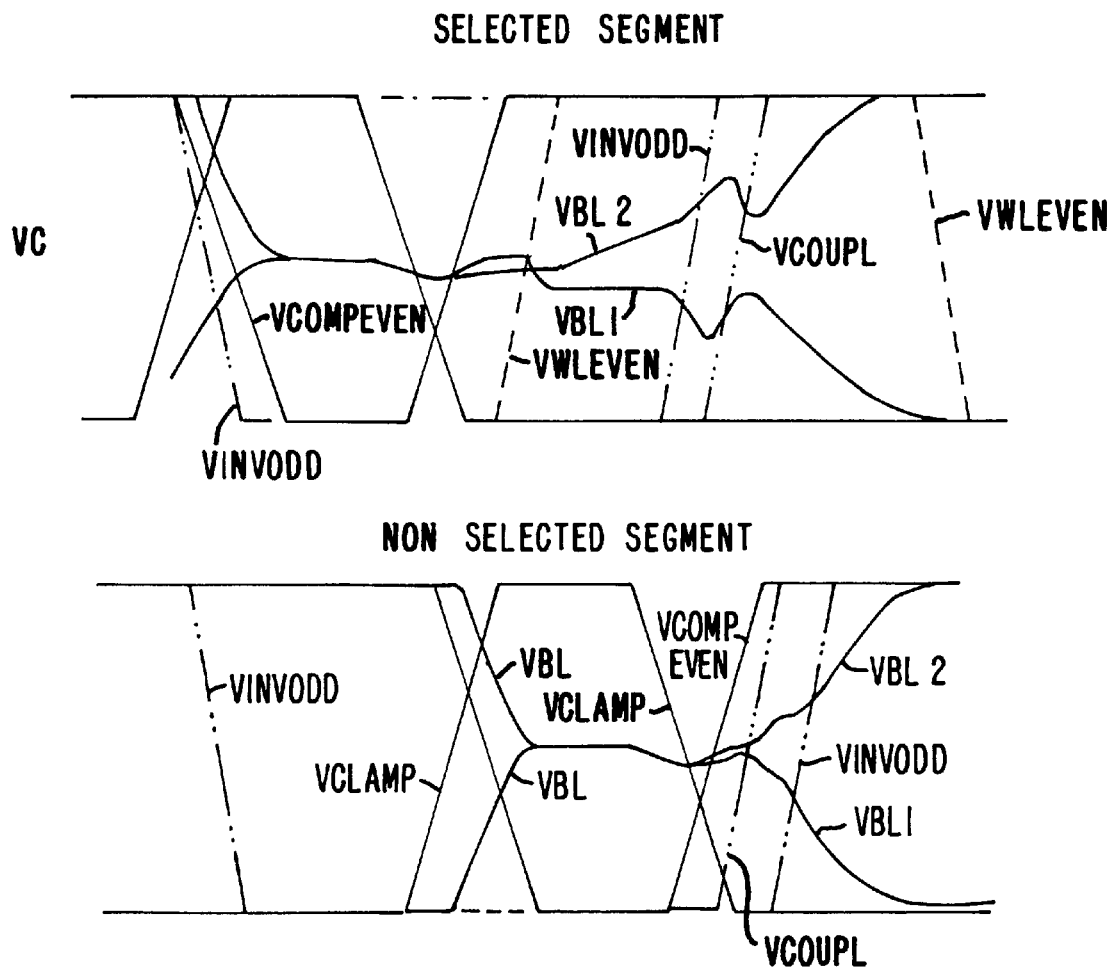

FIG. 7C shows a memory 710 including this type of amplifier 712, with capacitive compensation of the disturbance at the termination of the clamping. The first inverter 714, with its input connected to the first bit line BL1 has its output connected to the second bit line BL2 when VIN-VEVEN goes high, while the second inverter 716 connects its output to the first bit line BL1 at the time when VIN-VODD goes high. If, for example, the input of inverter 714 is coupled to the bit line of the selected cell, then inverter 714 is activated at the start of the memory cycle and is used in the clamping operation, which adjusts the bit line voltage to become close to the switching point of the inverter. The second inverter 716 is then activated late in the cycle, when the output from the first inverter 714 is much larger than any offset error due to device variation between the first and the second inverter. For selected segments, the second inverter 716 is activated some time before the signal VCOUPL is applied. This signal connects the segment to the neighboring segments for read and write operations only. In the refresh mode, all segments are selected and the read restore operation is completed with help of both inverters. The VCOUPL signal remains low during the refresh operation. In the read and write mode, as described above, the second inverter in the non-selected segments is turned on after VCOUPL has connected the segments. Some time is allowed to permit the first inverters in all the non-selected segments, in cooperation with the two inverters in a selected segment, to amplify the temporarily reduced signal enough to dominate over the coupling transient when the second inverters are activated. As indicated in FIG. 7C, the succeeding segment mirrors the previous segment, so that an even addressed cell is located on the right bit line if the even cell on the previous segment was located on the left. Likewise the inverter direction is reversed in the succeeding segment (not shown in the figure). The timing relations between the signals for selected and non selected segments are shown in FIG. 7D.

Figure 7E:
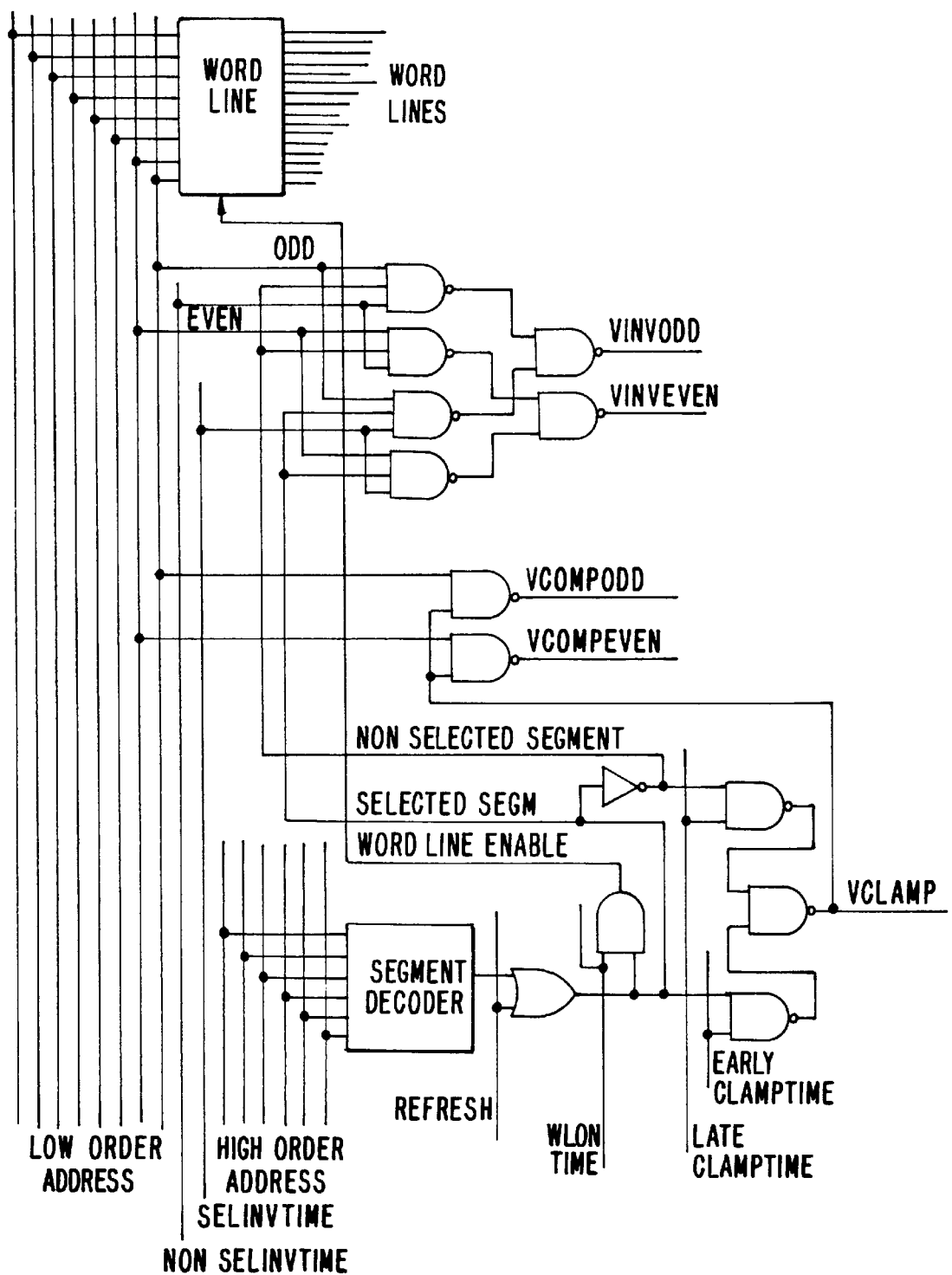

FIG. 7E shows the segment control logic for memories 700 and 710 discussed above. The segment control logic of FIG. 7E is similar to that shown in FIGS. 5A, 5B and 6C above, except for the separate control of odd and even inverter and clamp compensation.

Two Tier Memory

The DRAM of the present invention by its nature makes it possible to design a memory where the content of the memory can be read without any interference from ongoing writing, reading and refreshing. The memory is structured in "two tiers," meaning that in addition to the first tier, a regular DRAM of the present invention with normal addressing, reading, writing and refreshing, a second tier with separate addressing is used to read the contents of the cells in the first tier.

Figure 8A:
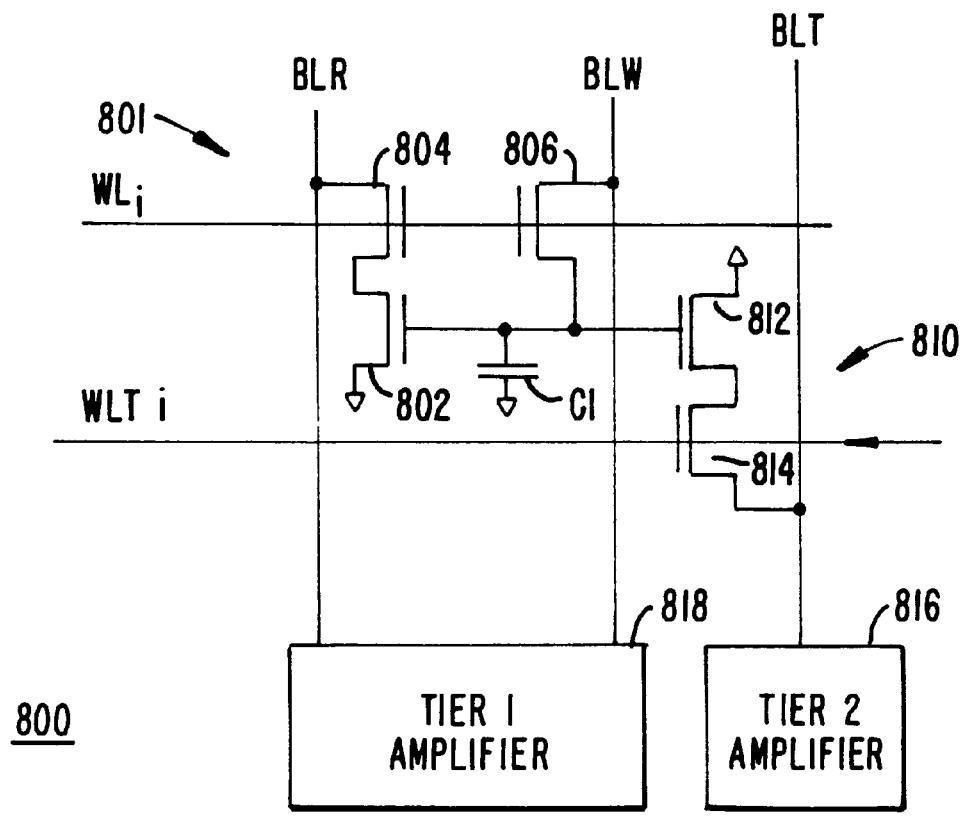
FIGS. 8A–H show circuit and timing diagrams of a two-tier memory.

FIG. 8A shows a two tier memory 800 with first tier memory cell 801. The DRAM cell, which includes transistors 802, 804 and 806 with memory capacitor C1, is addressed by its word line WLi and is treated as part of an independent memory in the reading, writing and refreshing operations. As discussed earlier, one of the features of this DRAM is that the stored data in the memory capacitor C1 is disturbed very little during the operation of the memory. As a matter of fact, the high state need not be disturbed at all, while the disturbance in the low state (the voltage on C1 close to zero) can be limited to around Vth. For higher operating speeds a slightly higher disturbance is acceptable. The first tier memory 801 can have any of the features discussed above, including being of the segmented bit line type.

In the second tier memory cell 810, transistor 812 is used to sense the state of C1 and transistor 814 acts as the read transistor. The second tier cell 810 is addressed by WLTi, by applying a high signal thereon. This connects second tier cell 810 to the bit line BLT, which in turn connects to a sense amplifier 816. Amplifier 816 may, merely by way of example, be a single-ended amplifier, as the signal amplitude is such that folded bit lines are not necessary for common mode noise suppression. However, folded bit line configurations 820 and 830, such as those shown in FIGS. 8B and 8C, respectively, are also possible. FIG. 8D shows a pair of memory cells 842 and 844, each having first and the second tier cell's, 846, 848 and 850, 852, respectively. The first and second tier cells share a common ground bus GND. The connections to the bit lines are common for neighboring primary cells. The second tier cells have separate connections to BLT, but using three level metal and different layouts, common connection points can be used.

It should be noted that the sense transistor in all the previous figures has the source connected to ground as in most cells discussed above. The reversed cell, where the select transistor has the source connected to ground and the sense transistor connected between the select transistor and the BLT, can also be used. This configuration is shown in FIG. 8E. As a rule, this cell requires a larger storage capacitor C1 than the cell with both sense transistors connected to ground. The gate capacitance of the sense transistor in the second tier cell in read mode will couple a disturbance to Cl, which may cause an error in the memory functions of the first tier cell. This is contrary to the normal (non-reversed) cell, where the major part of C1 actually is the sum of the gate capacitances of transistors 802 and 812 30 (FIG. 8A).

Figure 8B:
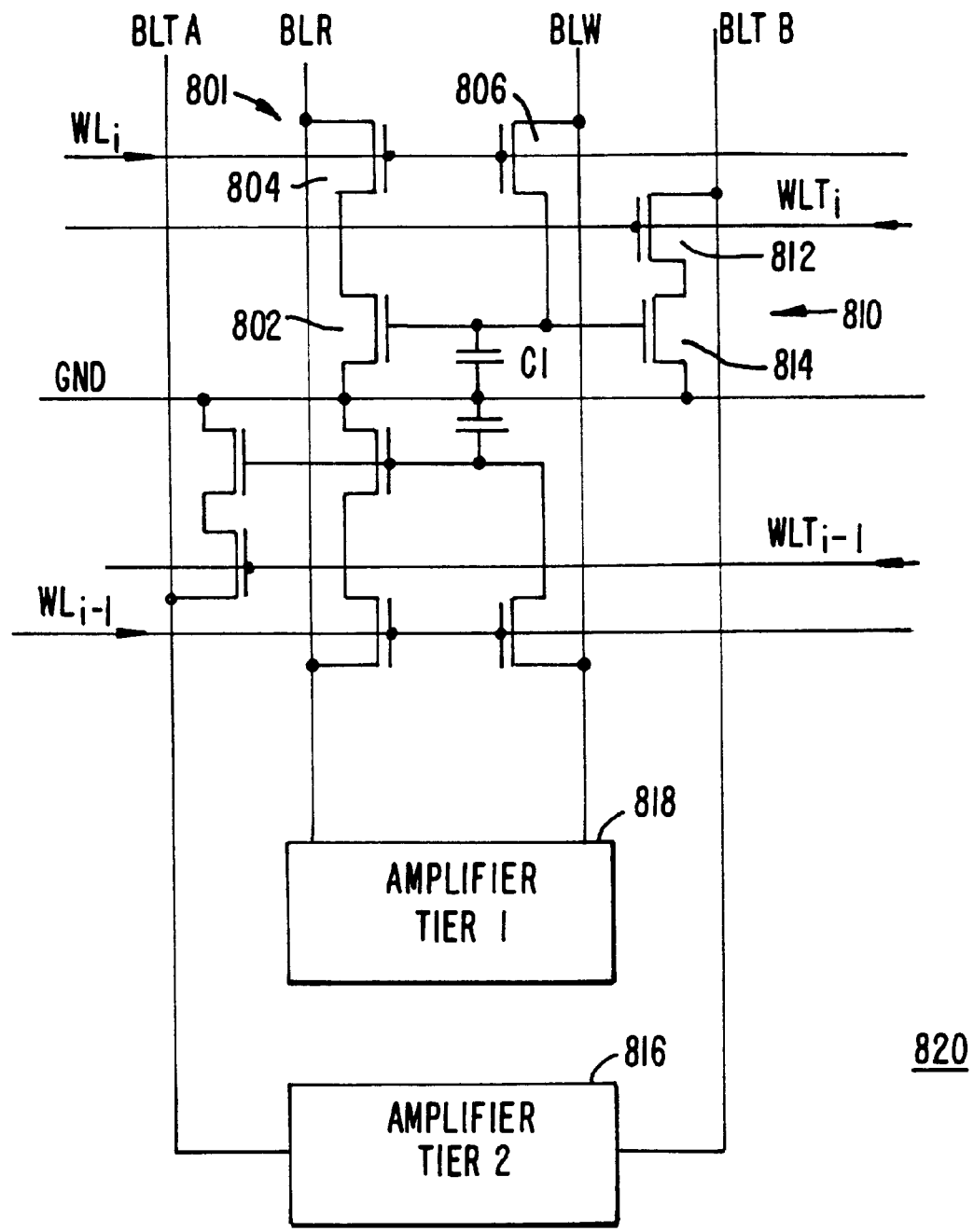
Figure 8C:
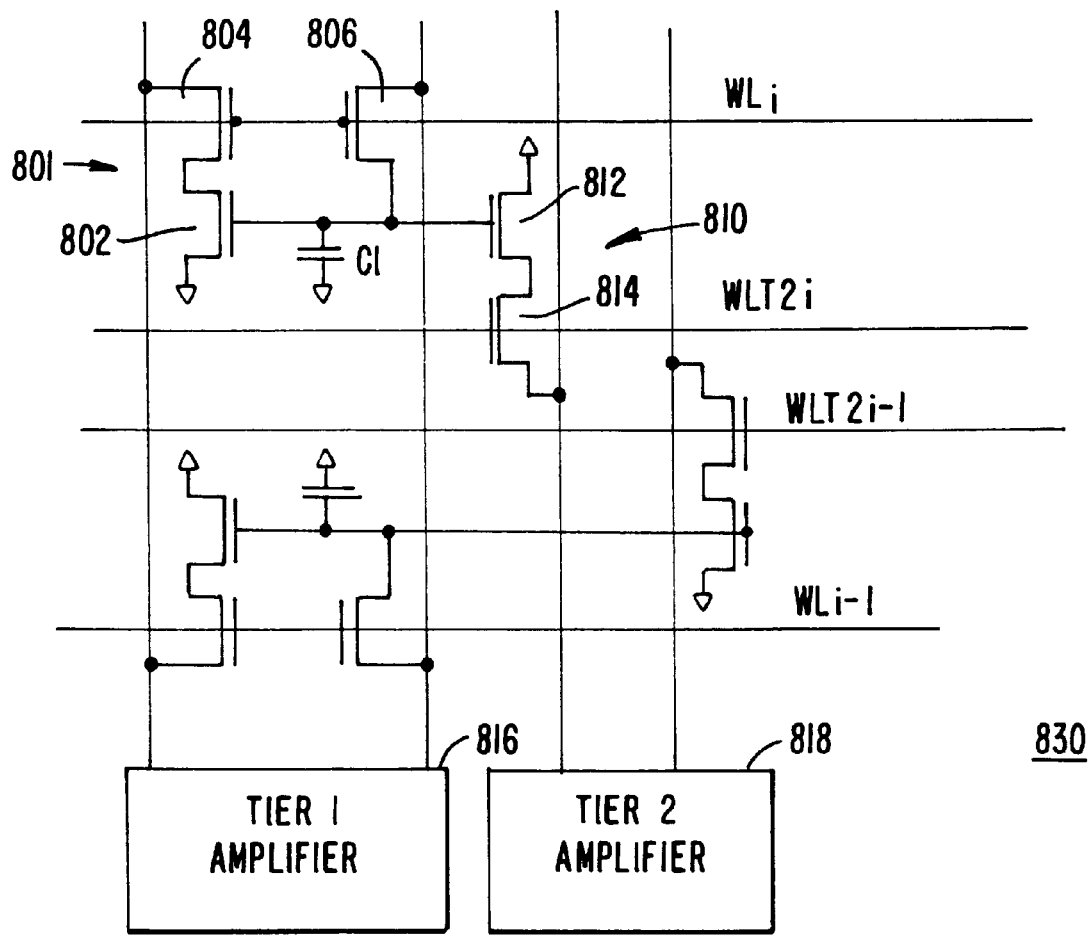
Figure 8D:
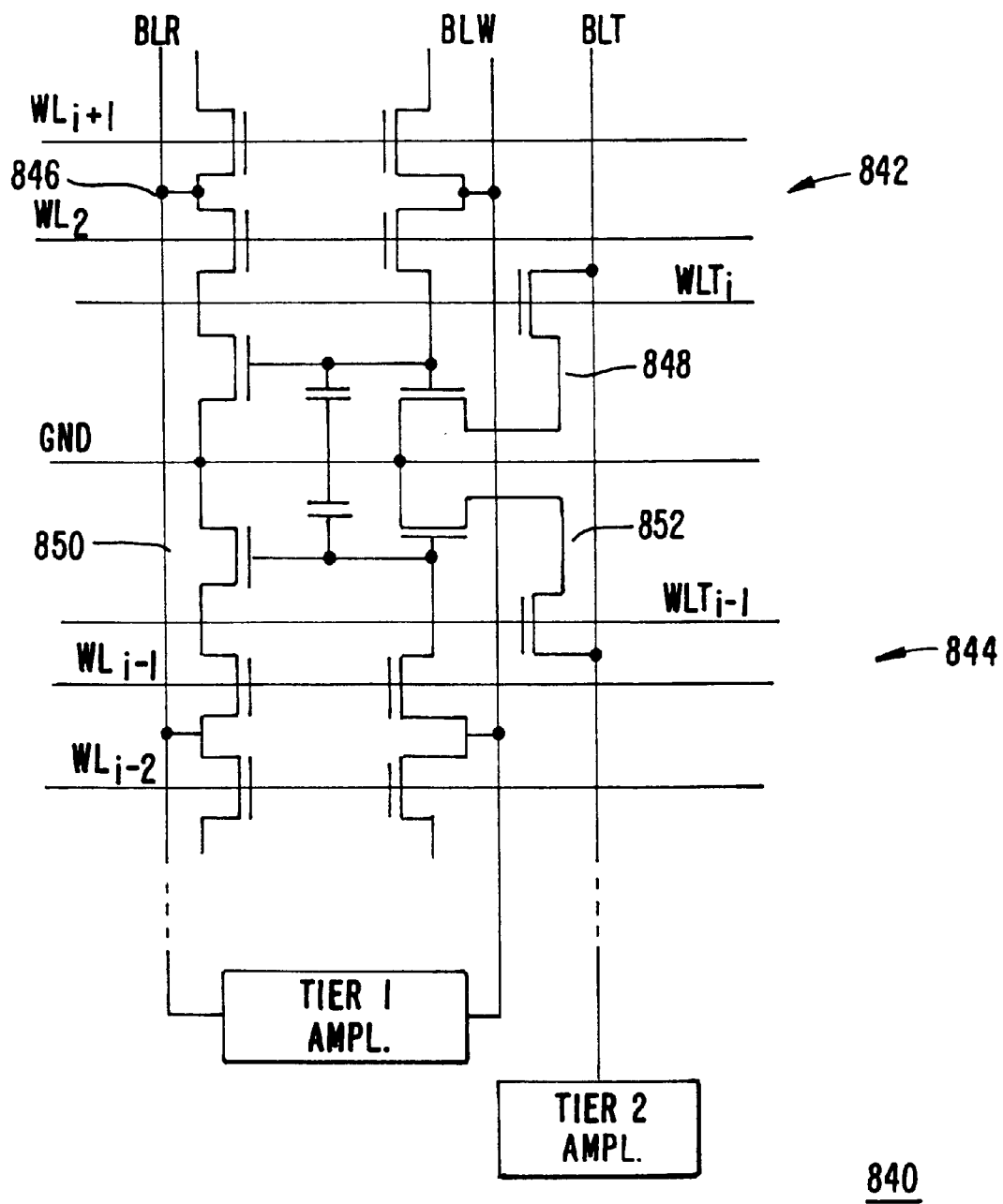
Figure 8E:
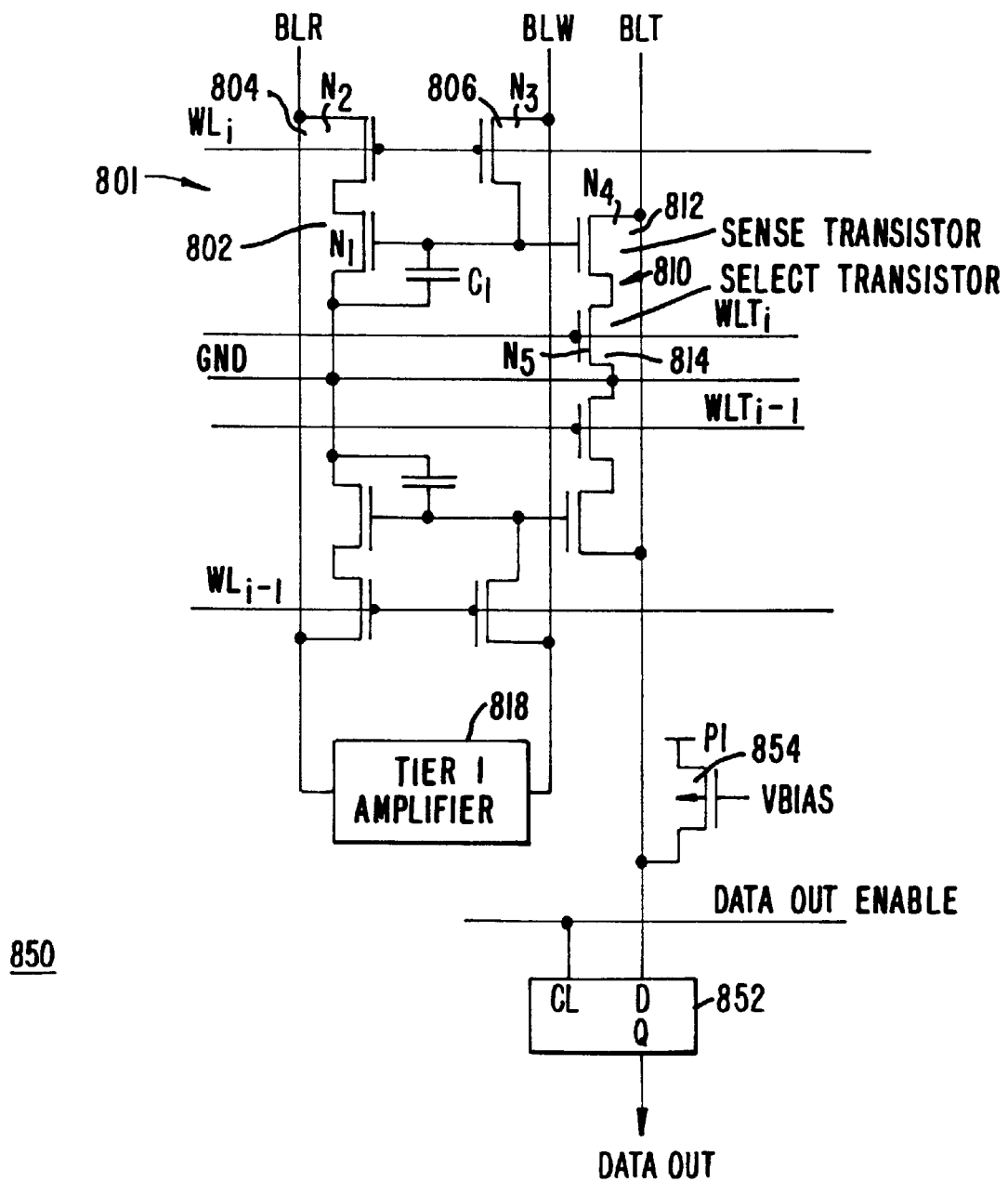

Again, the amplifier for the second tier may be of the folded bit line type, as indicated in FIGS. 8B and 8C. This amplifier would use the same techniques discussed above in conjunction with memories having only one tier. Segmented bit lines may be used in this configuration as well.

Figure 8F:
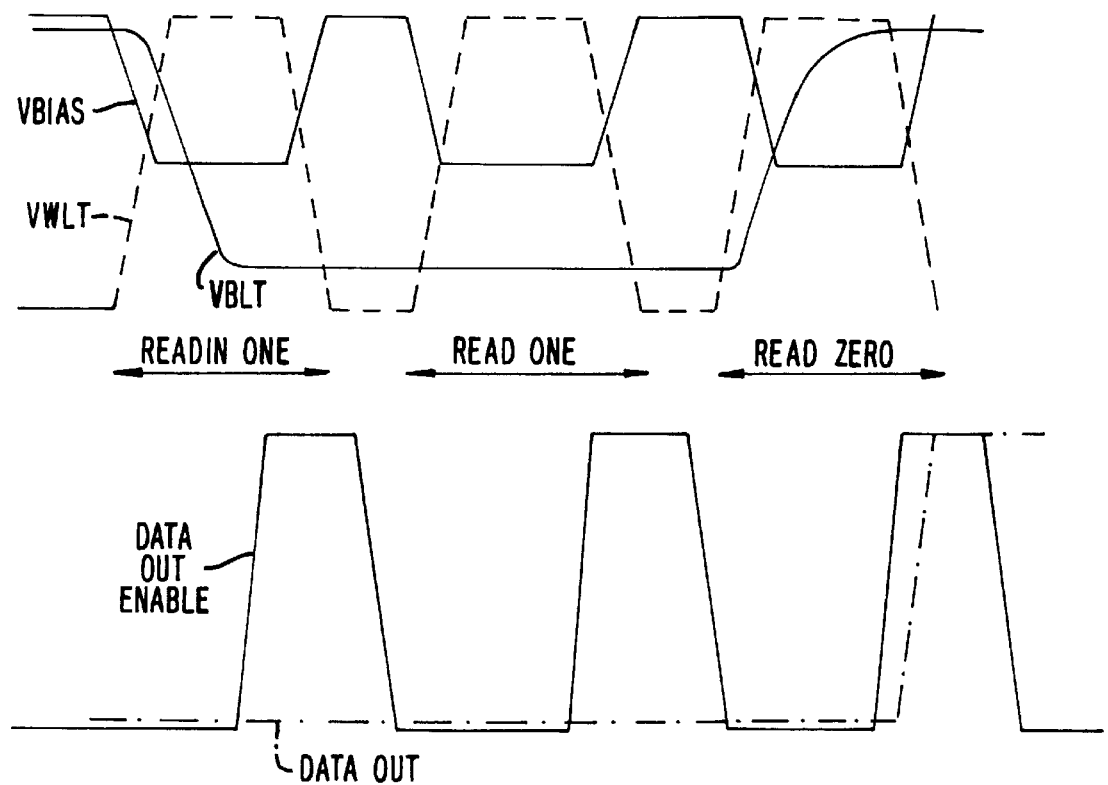

A single-ended amplifier 850 with a data out latch 852 is indicated in FIG. 8E, and a corresponding timing diagram is shown in FIG. 8F. The signal VBIAS is held at an intermediate level concurrently with VWLT. The current from P channel transistor 854 is approximately half of the sum of the cell currents for a zero cell and a one cell. Limiting the negative swing of VBIAS makes P transistor 854 act more like a constant current source than if the swing is larger. The circuit can be made to operate with somewhat lower margins if designed so that VBIAS goes to ground when activated. The D input on the flip flop is designed to have its switching point close to Vdd/2, and as long as the bit line voltage in the two states deviates a minimum amount from Vdd/2, the operational margins are satisfied. The actual moment of reading may in the worst case coincide with the reading of the first tier memory. At this moment C1 may have a disturbed Zero level. The amplifier design must take this into account and also plan for changes in the charge levels on C1 between refresh due to leakage. In the amplifier indicated in FIGS. 8E and 8F, no clamping of BLT to a neutral midpoint is made. Adding this feature reduces the access time of the second tier memory 810, but would not reduce the power consumption. The folded bit line approach has both speed and power advantages, but the gain is highly dependent on the bit pattern in the read data.

Figure 8G:
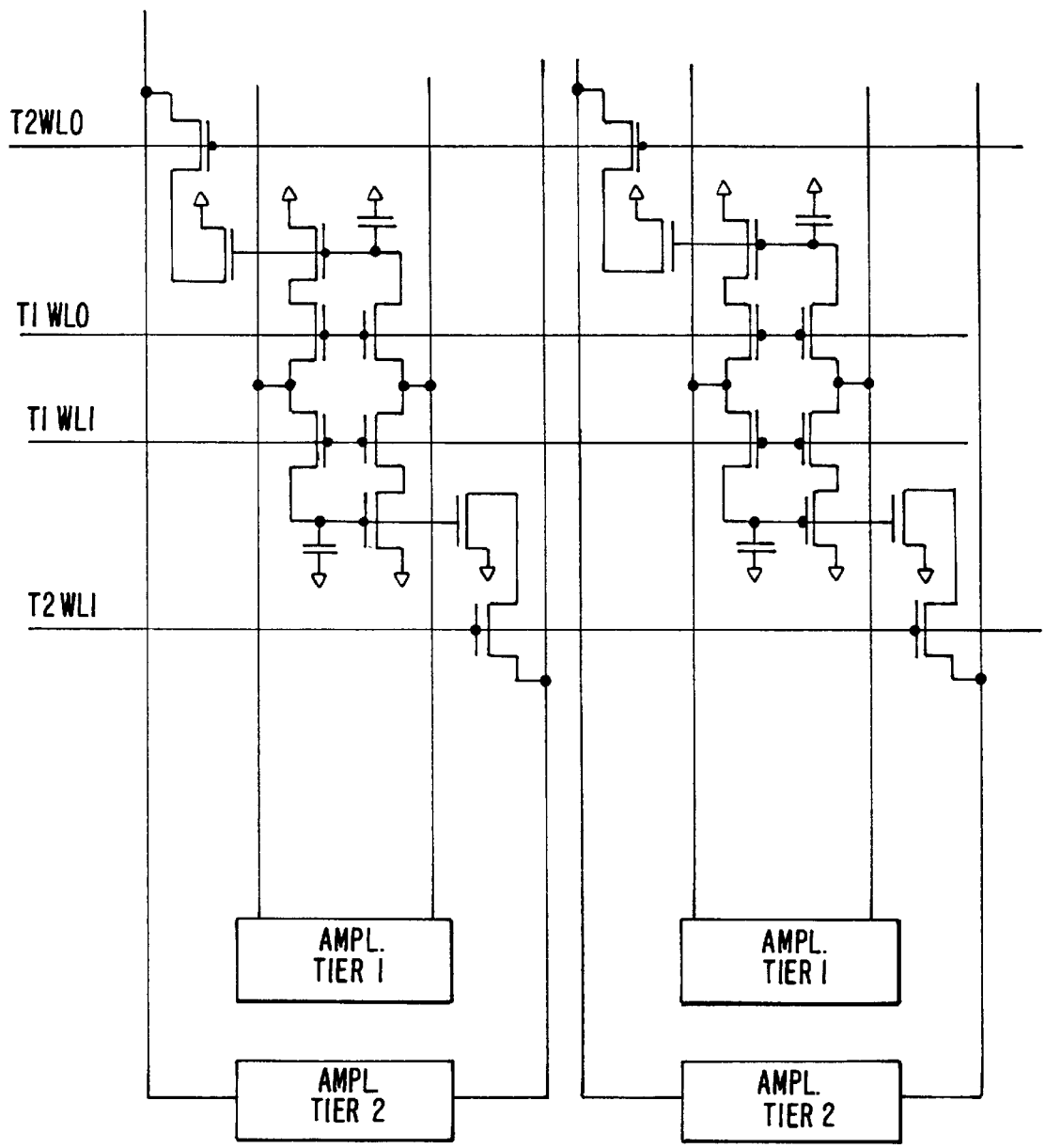
Figure 8H:
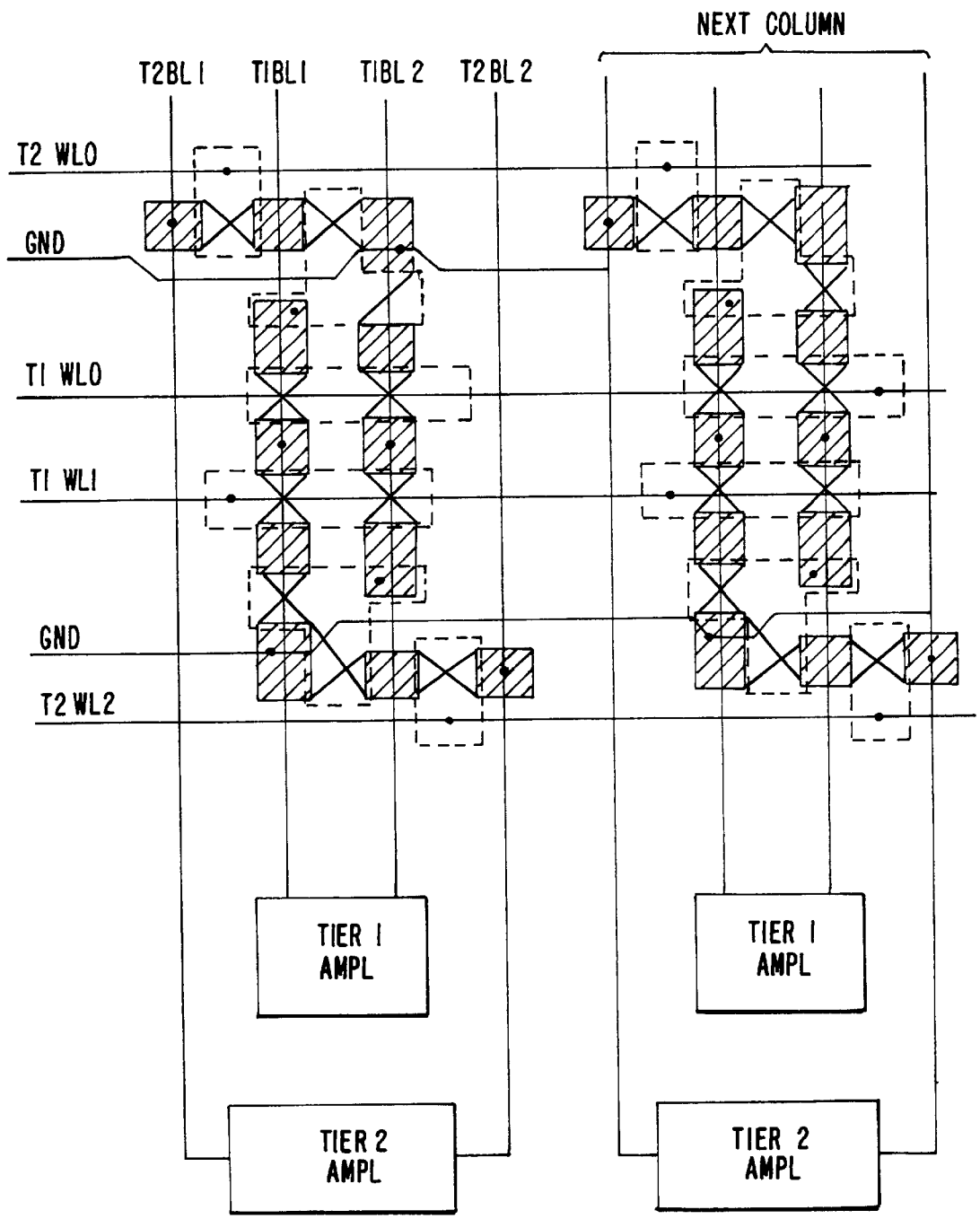

Denser layouts using a two-tiered memory may be achieved by using non-dedicated bit lines, which means that a given bit line can be used as a read bit line or a write bit line depending on if the address is odd or even. In this type of arrangement, the bit line capacitances remain equal. FIG. 8G shows part of such a memory using the DRAM cell of the present invention expanded to include a sense transistor and a select transistor for the second tier. In the configuration shown, each column of basic DRAM cells is combined with two folded bit lines for read out in the second tier. Read operations from this memory configuration are very fast. The bit lines are clamped to a mid level, the word lines swing to Vdd when reading, the amplifier is disconnected from the bit lines at an optimum time when the bit lines have just separated from the clamp level, and the reclamping is completed while data is read out from the amplifier. A preliminary layout for this circuit is shown in FIG. 8H. Other configurations may of course yield a denser layout.

Process for Reduced Area and High Speed

One of the features of the memory of this type is that the conventional CMOS process with three metal layers can be used for production of the memory. For dedicated memory chips, the cell area can be reduced substantially if the fused and thinned wafer approach is taken, as also described in U.S. Pat. No. 5,396,452. In logic circuits where memory and logic is mixed, even larger benefits can be achieved. The approach would be to prepare a wafer that, later in the process, would strictly follow a standard fabrication process. The added cost in the wafer preparation would be well compensated by the savings in area and the gain in speed.

Figure 9A:
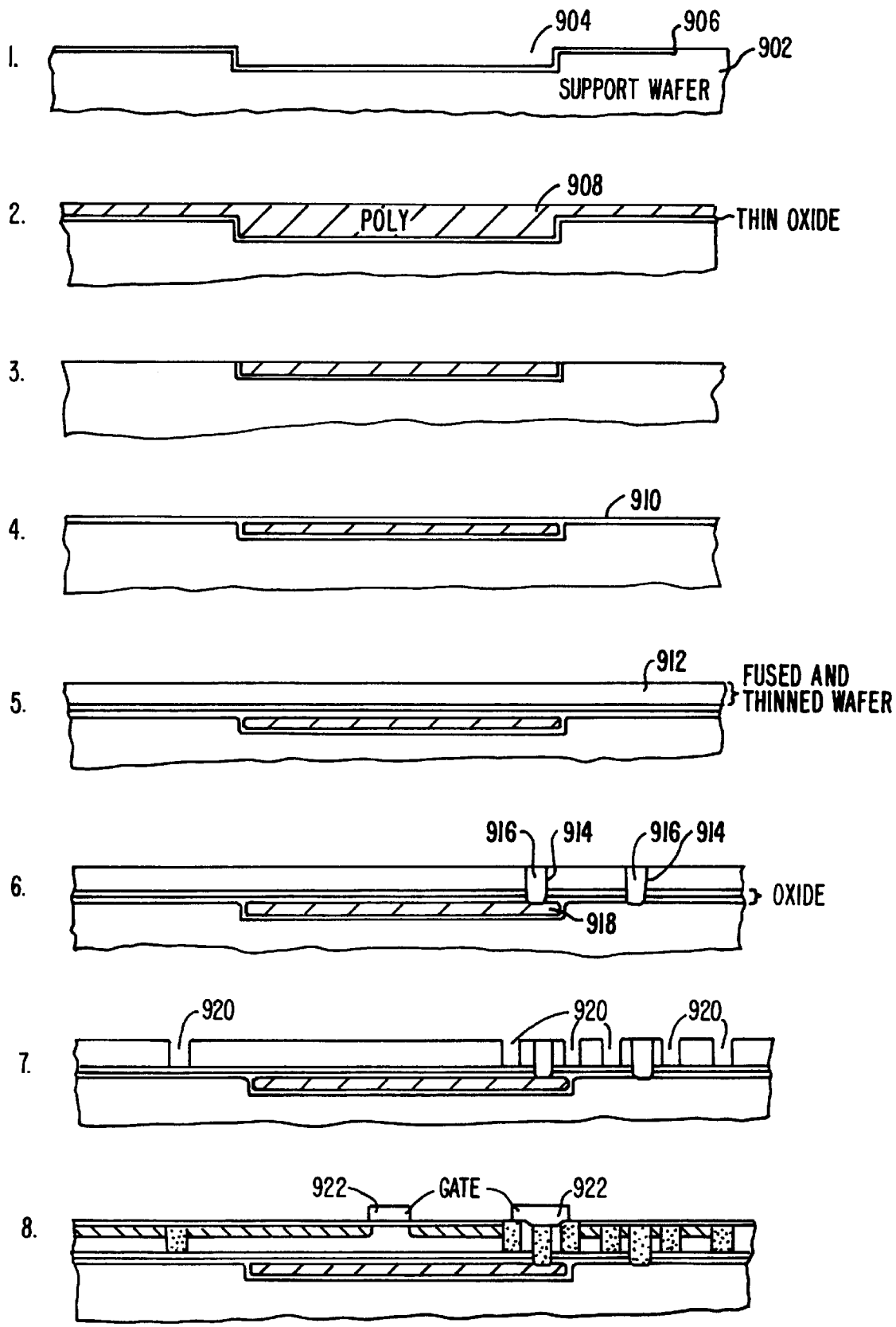
FIGS. 9A–F show process flow and layout diagrams for wafer preparation of the memory according to the present invention.

FIG. 9A illustrates steps in the wafer preparation as follows:

1. A support wafer 902 of low resistivity is used. The areas 904 where capacitors are to be located are etched down. A thin dielectric layer 906 is deposited or grown.
2. Polysilicon layer 908 is deposited over thin oxide layer 906.
3. The wafer is polished, so that the support wafer 902 and the polysilicon 908 have a common smooth surface.
4. Another thin oxide layer 910 is grown on the polished surface.
5. The epi layer 912 of a second wafer faces the top of the support wafer and is fused thereto. The assembly is then processed as described above so that only the epi layer remains on top of the support wafer.
6. Contact holes 914 are etched and plugs 916 are deposited to establish contact points to the embedded capacitor 918 and to the substrate.
7. If other means have not been used in the step above to isolate the plugs from the surrounding silicon, trenches 920 surrounding the plugs are defined and etched. In the same step, the individual transistors in the memory cell and in the rest of the logic are also separated from each other by trenches 920. The trenches are preferably back-filled with a form of glass.
8. P-channel transistors are exposed to N-type implant and are heat treated to a sufficient depth. The surface is next prepared for the gate oxide. If the capacitor is to be connected to the gate of a transistor, the gate oxide 922 is removed on top of the contact plug for the capacitor. To more closely follow a standard fabrication process, the capacitor connection can wait for the metal 1 step to connect the gate and the capacitor.

The wafer is now ready to be run in a known three layer metal process. The LOCOS isolation process step need not be completed, as the area under the poly contact can be isolated by a trench in step 7 above. This results in a planar metal 1 layer.

Multi-layer Memory Cell Controlling Logic

Programmable logic devices such as Field Programmable Gate Arrays (FPGA) have devices that must be controlled with relatively large capacitors. The pass transistors transferring signals from one data bus to another must be large enough for minimum voltage drop in passing the signals. The controlling capacitor must be significantly larger than the gate capacitance of the pass transistor, so that the voltage on the controlling capacitor is relatively constant during the signal transition. Using the multi-layer approach described above lends itself ideally to this purpose. The total area under the pass transistor and under the memory cell transistors can be used for the controlling capacitor.

Figure 9B:
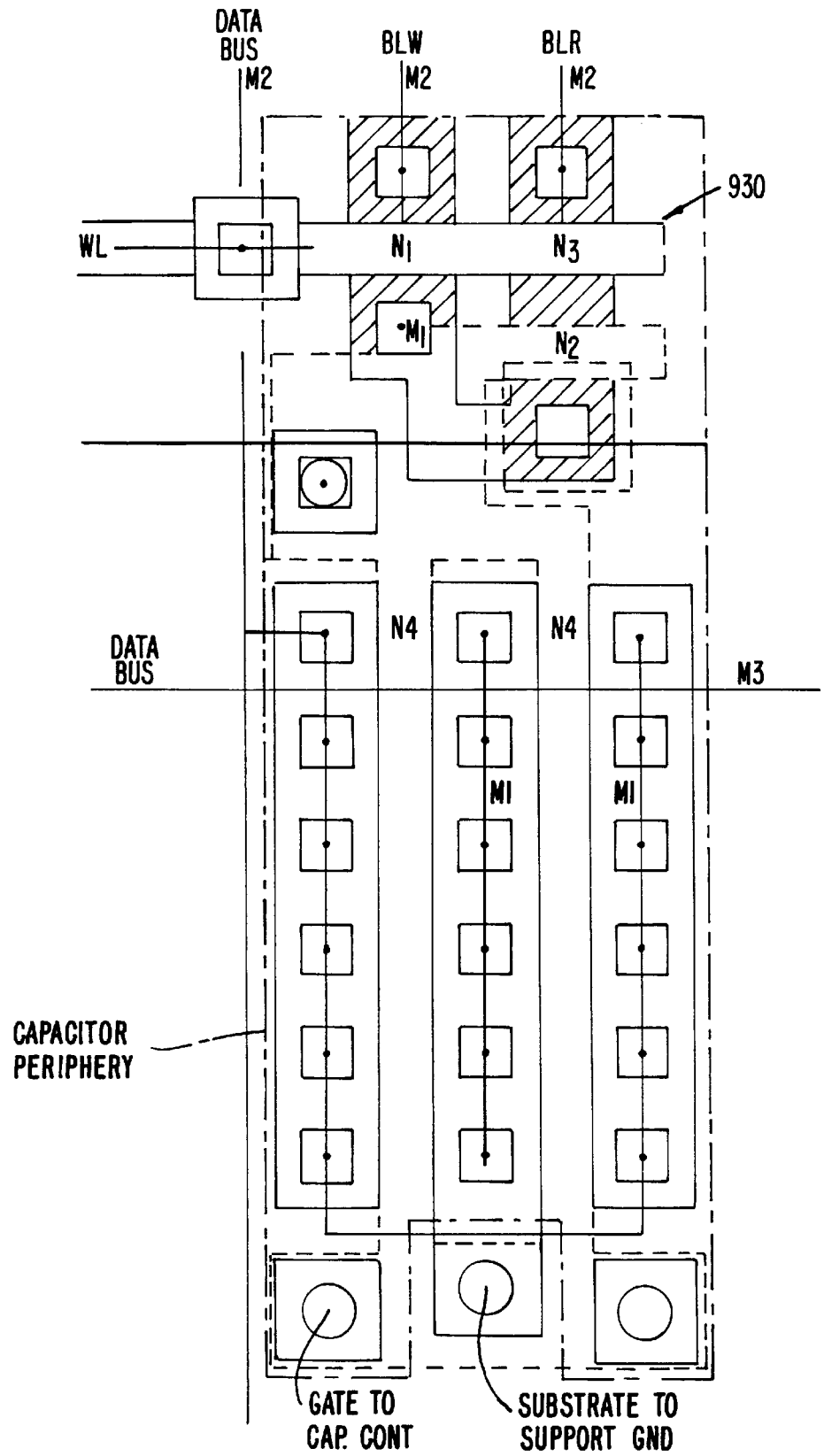
Figure 9C:
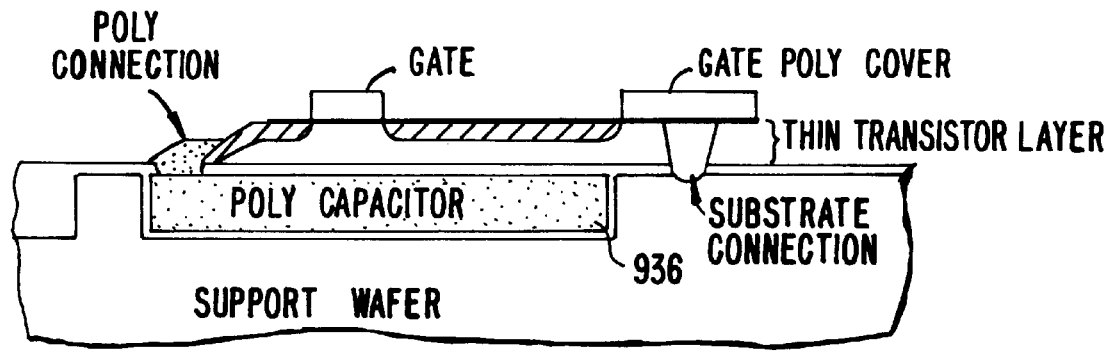

FIG. 9B shows one DRAM cell 930 controlling a pass transistor N4. The cell 930 includes transistors N1, N2, N3 and a large capacitor C1 located under both the cell and the pass transistor. The source of N1 is connected to the gates of N2 and N4 through first metal layer M1, with a silicon island used to support a feed through to the underlying capacitor. (The vertical connection is indicated on the left side of the figure.) The combined structure has three vertical busses, which may be in the second metal layer M2, with two busses reserved for the memory bit lines and one reserved for a vertical interconnect bus for data. The word line and local connections use layer M1, while ground and a horizontal data bus use the top metal layer M3. There are several options to make the connections between the different layers, including feed-throughs in the back-filled areas between transistors. The epi layer remaining after thinning the top wafer is usually thicker than a normal implanted source-drain diffusion. The transistors therefore have a remaining substrate portion. Provisions have therefore been made so that this substrate layer may be connected to the underlying support wafer which is at ground level for the N-channel transistors. The substrate layer may be connected to the underlying support wafer which may be at a ground level (FIG. 9C). The support wafer does have N wells to support the connection of the substrate of the P transistors for this reason.

The same procedure discussed in conjunction with FIGS. 9A and 9B can also be used for the memory cell shown in FIG. 9C. Adding a recessed capacitor 936 increases the storage time of the cell, which reduces the refresh frequency. The gate capacitance of the sense transistor is generally sufficient for reliable operation. With all three cell transistors in the top layer, no additional area is gained by adding a recessed capacitor.

Figure 9E:
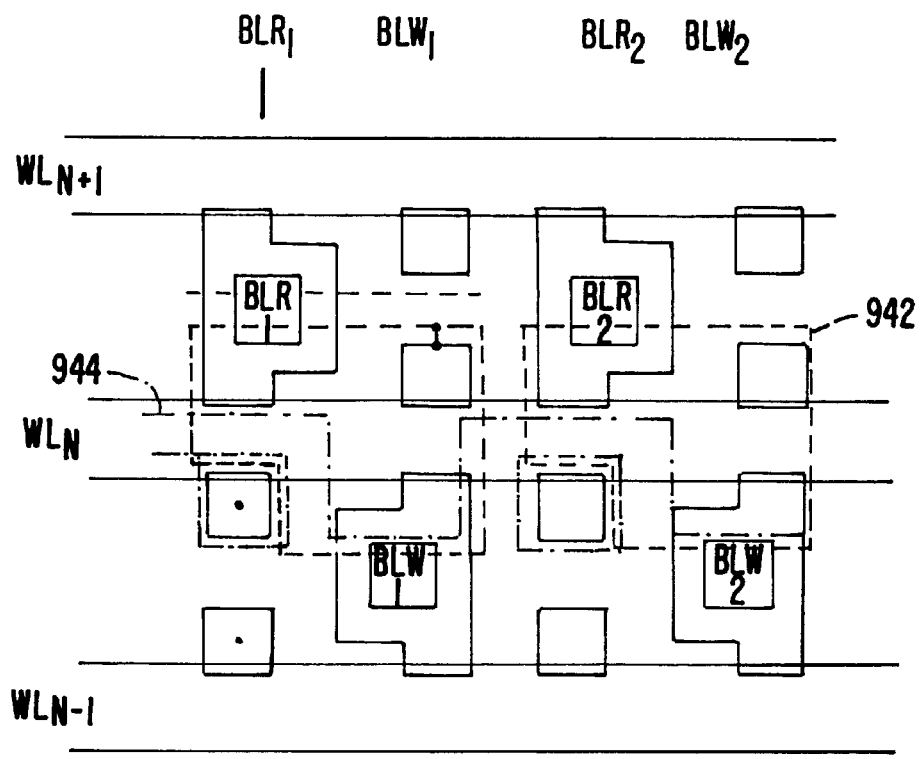
Figure 9D:
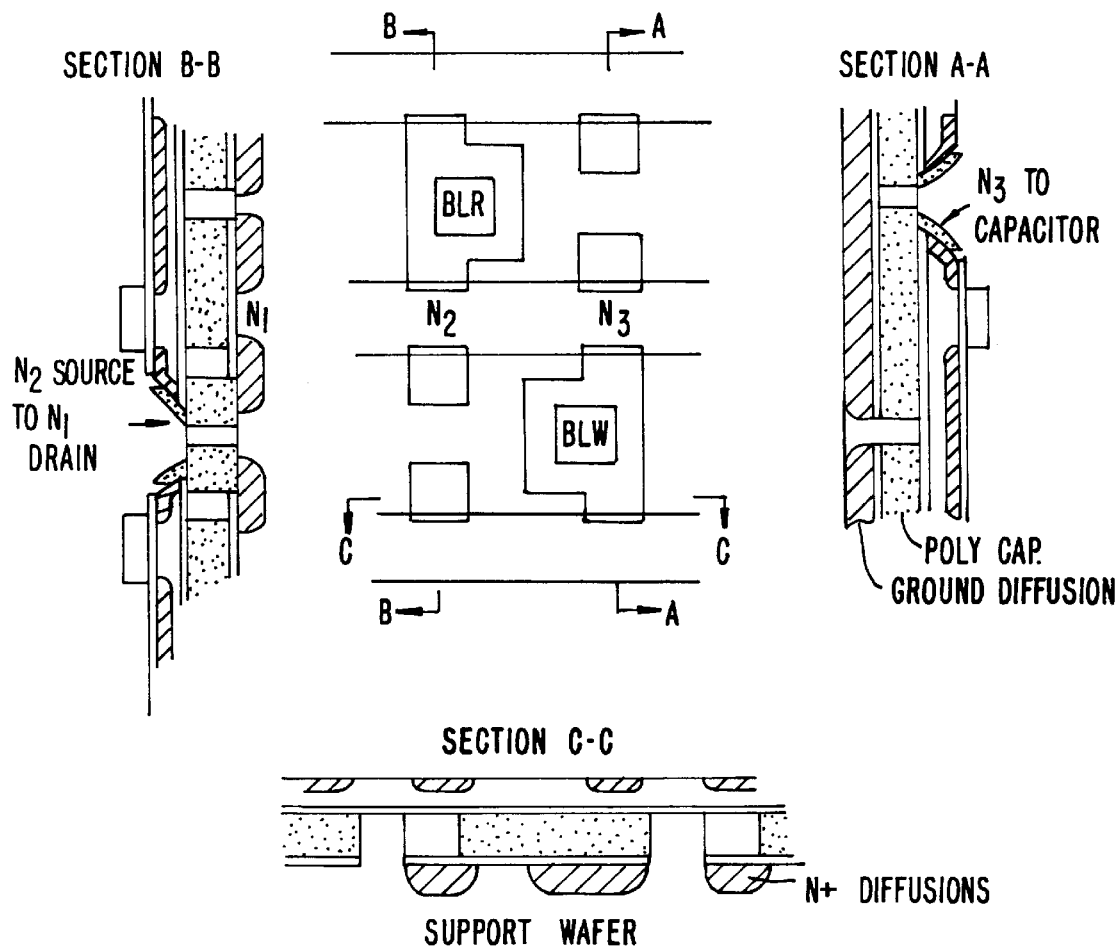

FIG. 9D shows in greater detail a compact cell utilizing a recessed transistor and a double-sided capacitor. The thin transistors in this figure are not fully depleted, which means that the transistor substrate must be tied to ground. It should also be noted that the transistor substrate is one side of a double sided capacitor and for that reason must have a relatively high conductivity. The surface of the wafer to be fused should therefore have a P+ top layer. With the transistor substrate grounded, the source and drain junction capacitances are as high as in the standard processes, while the area efficiency is increased as the devices are separated by trenches cut through the top silicon layer. The top transistor layer in this case is assumed to be formed by defining an etch stop by an epi layer with a much different impurity concentration and a different type. The etch rate in the bulk is therefore much higher with the right choice of etchant. The remaining layer is therefore too thick to permit full depletion by the junction implants while still maintaining the small device dimensions.

An alternative approach has been taken in FIG. 9E. Here the top wafer used for fusion is of a SIMOX type. The top of this wafer has a thin silicon layer separated from the bulk by an implanted layer of oxygen. Such a wafer after adding a relatively thick oxide layer, can be fused and thinned down to the buried oxide layer with high accuracy. The transistors formed in this thin layer will have fully depleted junctions and small junction capacitances. They will therefore be much faster than the transistors in FIG. 9D. The recessed capacitor will however have a thicker oxide layer on top, resulting in a value close to half of the fully double sided capacitor in FIG. 9D.

FIG. 9E is a supplement to FIG. 9D, where marker line 942 denotes the location of the capacitor and marker line 944 the location of the junctions in the support wafer. In the cells of FIGS. 9D and 9E, the bit line connections are not side by side. This permits the layout of a narrower cell than if the connection are side by side, which must be the case for single layer cells.

Figure 9F:
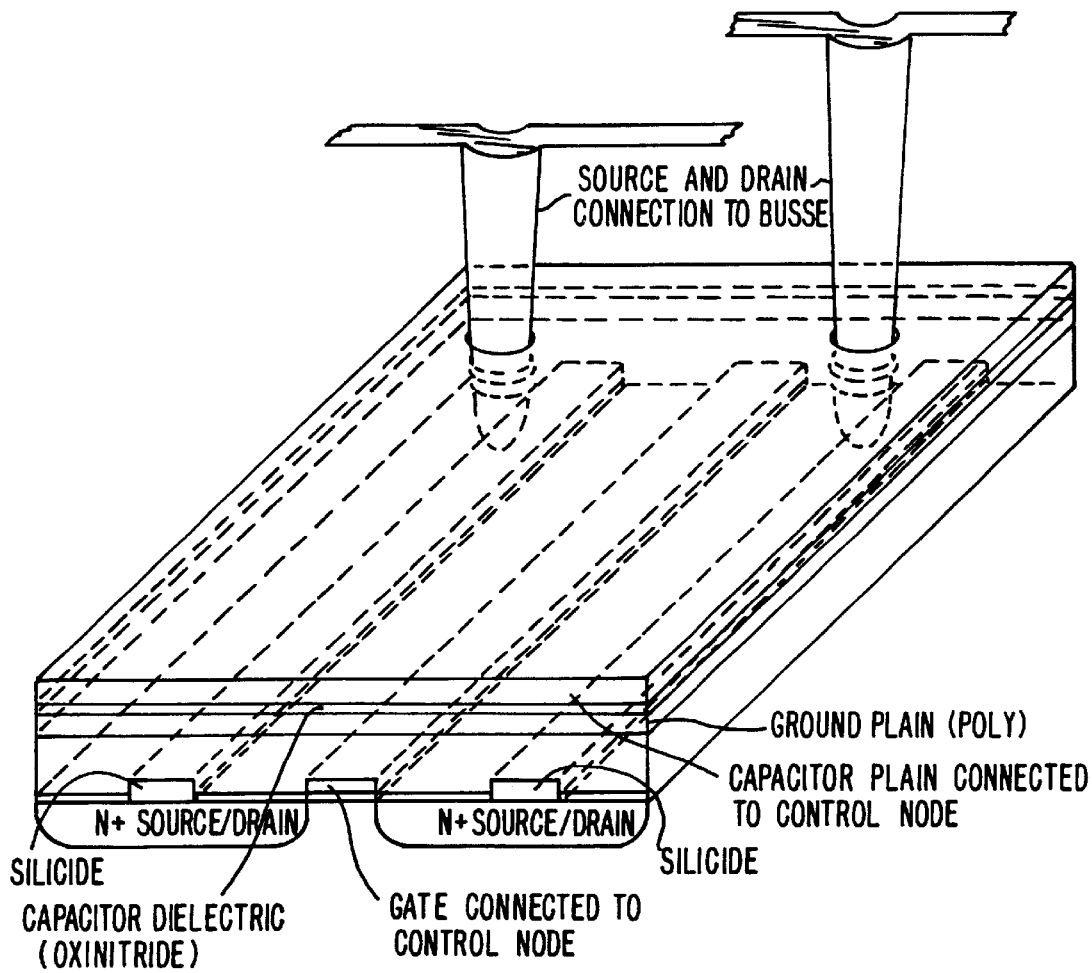

FIG. 9F shows another construction for a capacitor in combination with a pass transistor in a programmable logic device. In FIG. 9B, the capacitor was formed underneath the pass transistor. Here, the capacitor is instead formed above the pass transistor. In FIG. 9F, a flat capacitor covers most of the pass transistor area and typically comprises two polysilicon layers separated by a thin dielectric layer. One layer is coupled to a fixed potential, for example ground or Vdd, while the other layer is coupled to the control node from the DRAM circuit. The gate of the pass transistor is likewise coupled to the control node of the DRAM circuit.

Multi-layer Designs using Epitaxy and Simox

FIGS. 10A–10D show alternate methods of submerging capacitors and transistors below a thin epi layer added directly on top of a supporting wafer.

Figure 10A:
FIGS. 10A–E show alternate process flow and layout diagrams for wafer preparation of the memory according to the present invention.
Figure 10A:
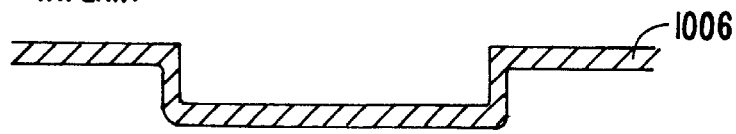
Figure 10A:
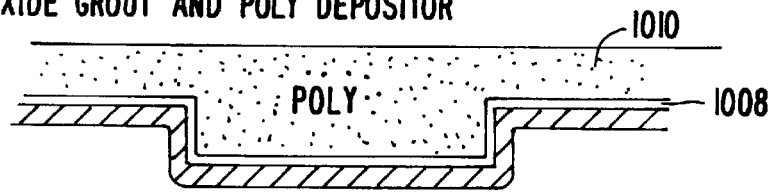
Figure 10A:
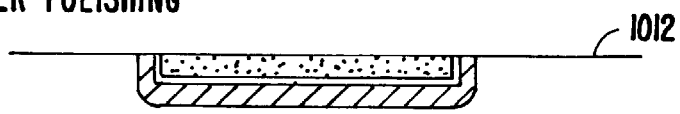
Figure 10A:
Figure 10A:
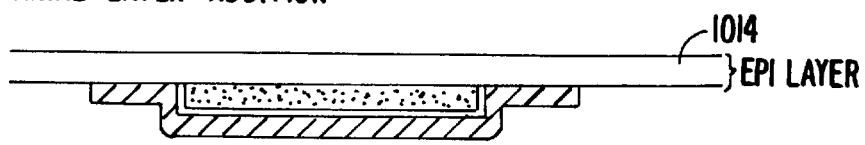
Figure 10A:

FIG. 10A shows the steps for making a capacitor with both electrodes accessible. The sequence of processing is as follows:

a) A recess 1002 is etched in the support wafer 1004, which is assumed to be P-type.

b) N+ material 1006 is implanted but not necessarily heat treated at this time. The purpose is to form an N-channel junction, which will isolate the bottom electrode of the capacitor from the support wafer when operating at levels positive in relation to the support wafer.

c) A thin oxide 1008 is grown which will become the capacitor dielectric layer. Polysilicon layer 1010 is then deposited until the recess is filled. This can be a blanket deposit (as shown) or a local deposit.

d) The wafer is polished so that the remaining surface 1012 is a continuous flat surface, but with no possibility to contact the buried N+ junction.

e) An area covering the capacitor and the intended junction contact regions is defined and another N+ implant 1006 is made.

f) An epitaxial layer 1014 is grown, which may require two steps to obtain a usable layer on top of the polysilicon. In the first step the layer is grown vertically and should give single crystal areas, at least where the starting surface is single crystal. In a second step some form of Zone crystallization may be used to include the areas above the poly into the single crystal.

g) In this step $O_2$ is implanted to a depth equal to the deposited epi layer. After heat treatment, an insulating layer of $SiO_2$ is formed. The remaining layer of the epi layer is then used for MOS devices of the type used in Silicon on Insulator technology. Connections from the device layer to the capacitor electrodes uses known methods.

Figure 10B:
Figure 10B:
Figure 10B:
Figure 10B:
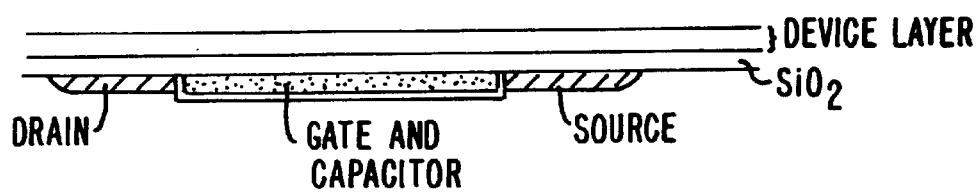

FIG. 10B illustrates how a transistor such as N1 in the memory cell can be submerged into the support wafer as follows:

a) A recess 1016 is etched in the P– wafer, poly is deposited and the wafer is polished.

b) The transistor area is defined and N+ 1018 is implanted.

c) The epi layer 1020 is grown as discussed above.

d) $O_2$ is implanted. When the wafer is heat treated, $SiO_2$ is formed, leaving a device layer insulated from the submerged transistor. The transistor channel goes from the edge of the source implant to the edge of the drain implant. The channel will go in a vertical direction close to source and drain, if the depth of the diffusions are less than the depth of the original recess.

Figure 10C:
Figure 10C:
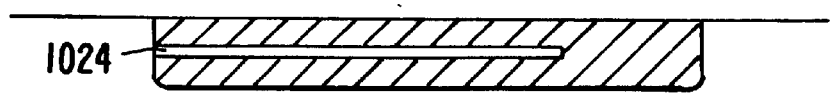
Figure 10C:
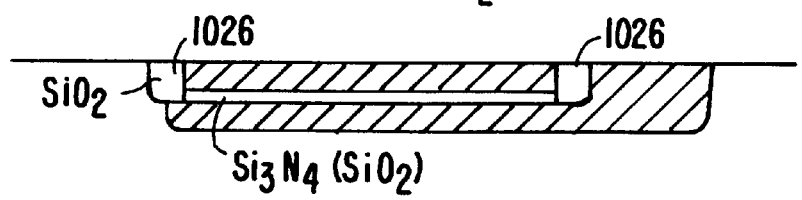
Figure 10C:
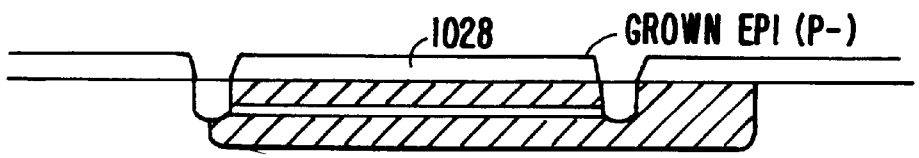
Figure 10C:
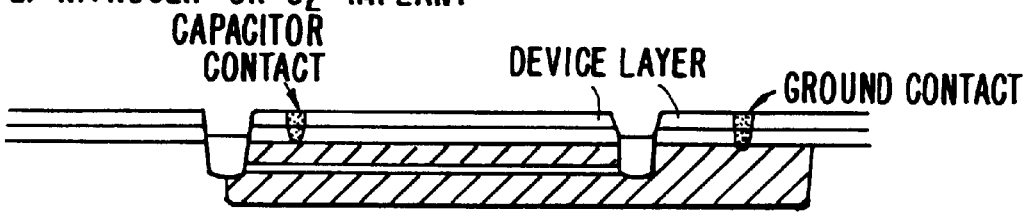
Figure 10D:
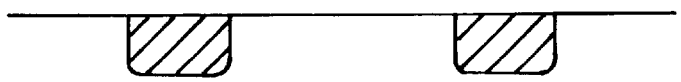
Figure 10D:
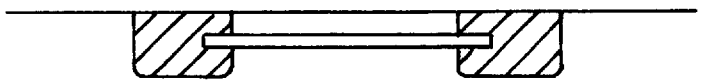
Figure 10D:
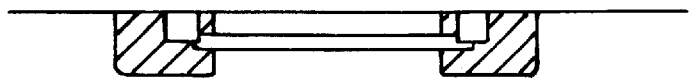
Figure 10D:
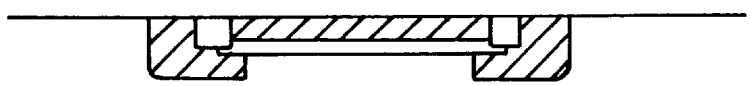
Figure 10D:
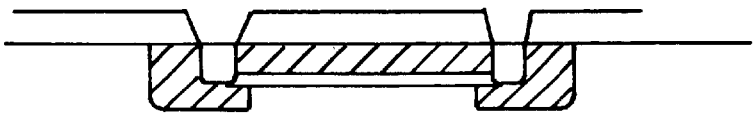
Figure 10D:
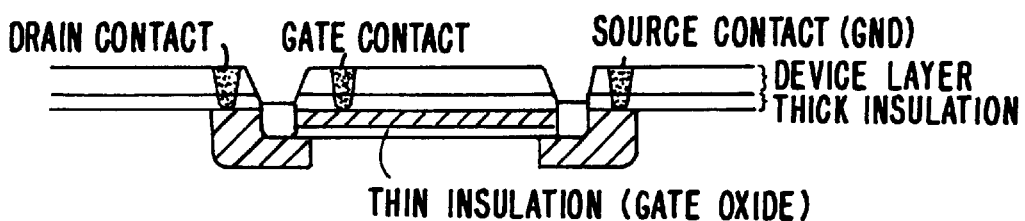

Since there is some uncertainty about the silicon quality in the epi layer above the submerged poly layer, it is desirable to consider the approach illustrated in FIGS. 10C and 10D, where the capacitor electrode is made from silicon. The process for FIG. 10C is as follows:

a) A deep N+ diffusion 1022 defining the area of the capacitor and its connection regions is made in a P type support wafer.

b) To form a capacitor, dielectric layer 1024, which may be, for example, $N_4$ or $O_2$, is implanted in a defined area.

c) To isolate the capacitor electrode from the rest of the wafer, a trench 1026 is cut around its edges. The trench is refilled with $SiO_2$ using known techniques.

d) Fields of epi layers 1028 are next grown on all silicon areas.

e) Oxygen or nitrogen is now implanted to the depth of the epi layer and the completed wafer is heat treated. The top layer will be used for devices and conventional steps are taken to contact the devices to the capacitor electrodes.

The method in FIG. 10D shows the process steps used to form a transistor with a large gate capacitor. As in FIG. 10C, the capacitor electrode (gate) is in crystalline silicon, isolated from the rest of the support wafer by implanting $N_4$ or $O_2$ and by trench isolation. It should be noted that a capacitor can be made using the same configuration, but by excluding the drain diffusion and connection.

Figure 10E:
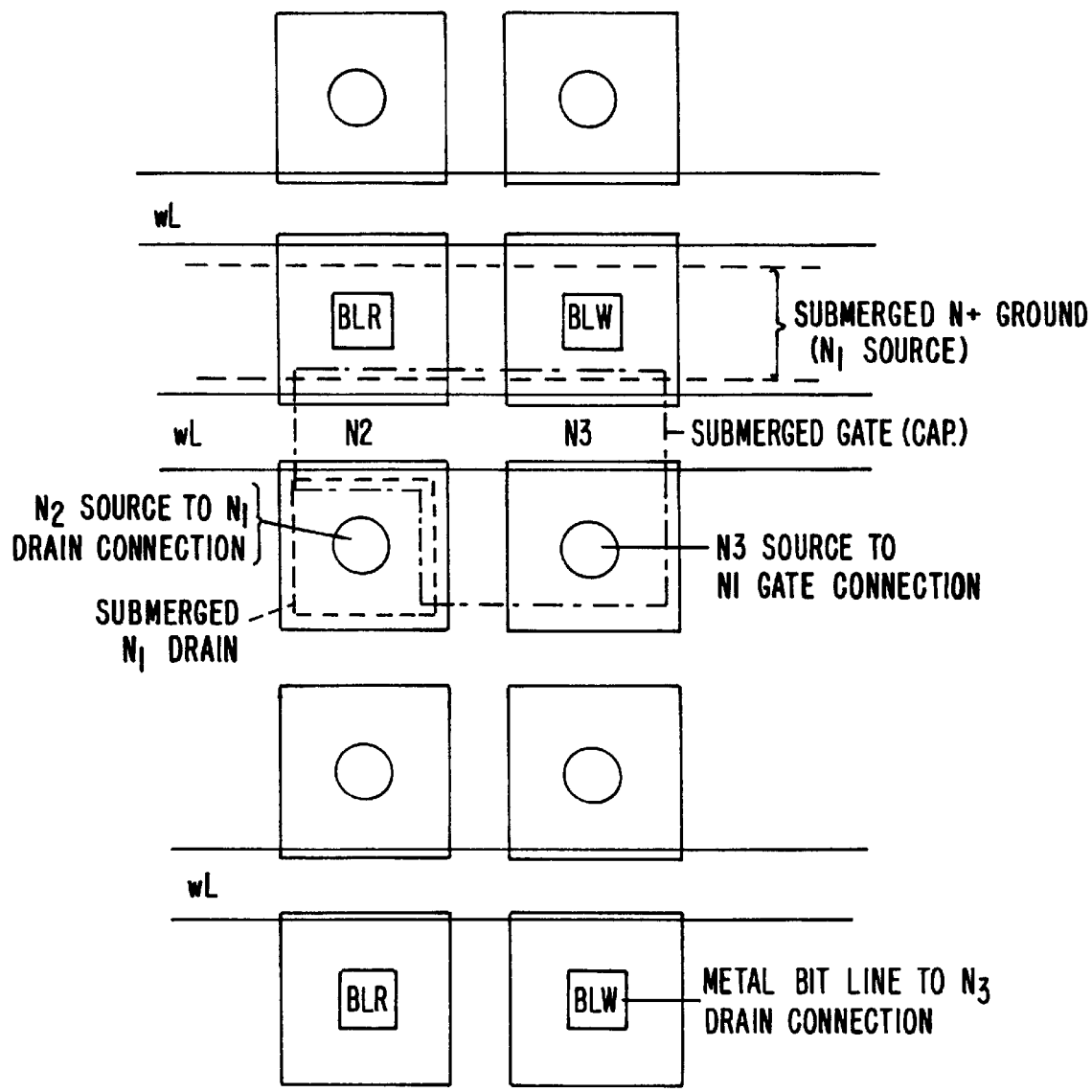

FIG. 10E shows a conservative layout of cells using submerged transistors.

Shared Bit Lines and Amplifiers

Figure 11A:
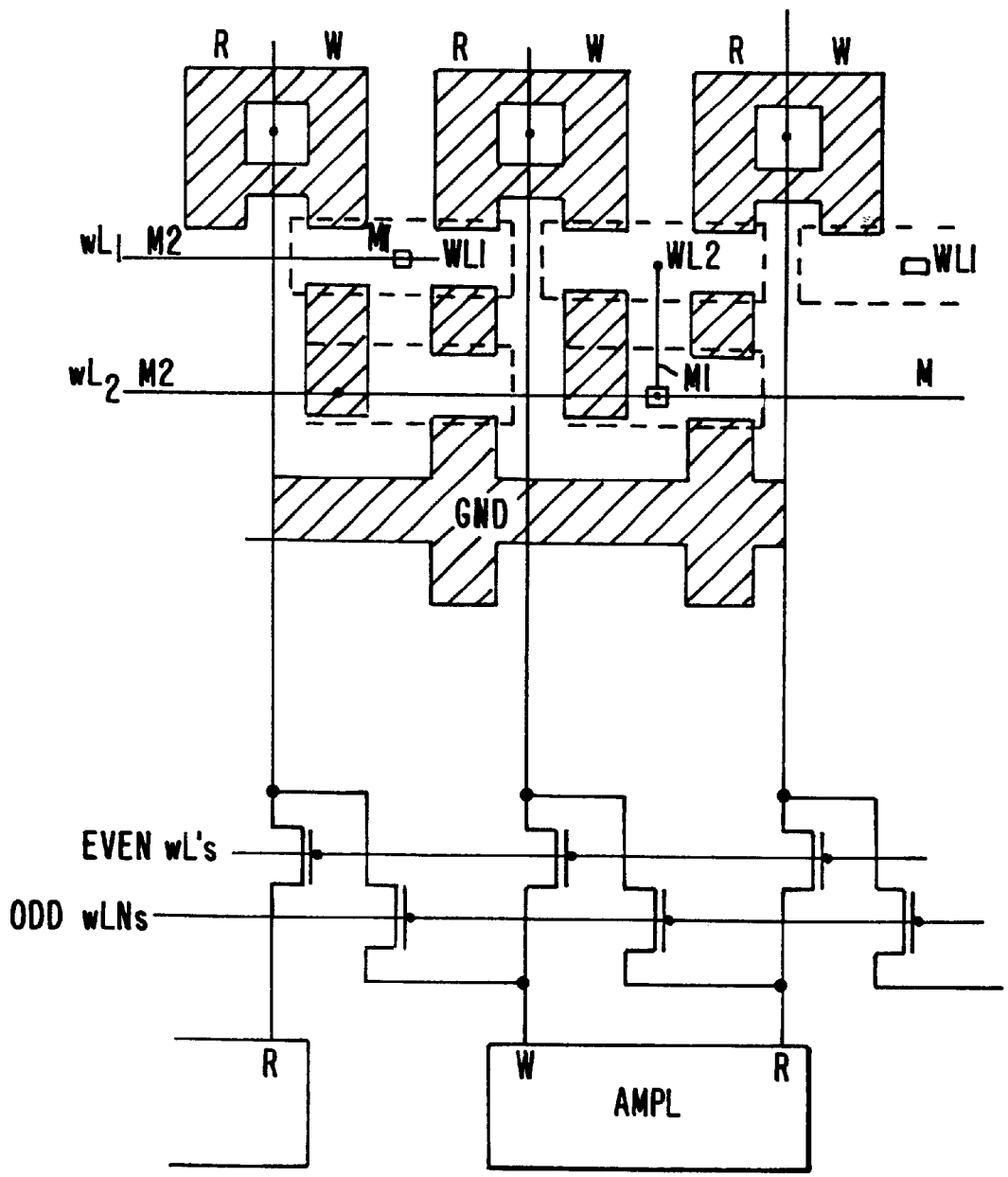
FIGS. 11A–C show layout diagrams of a shared bit line memory.
Figure 11B:
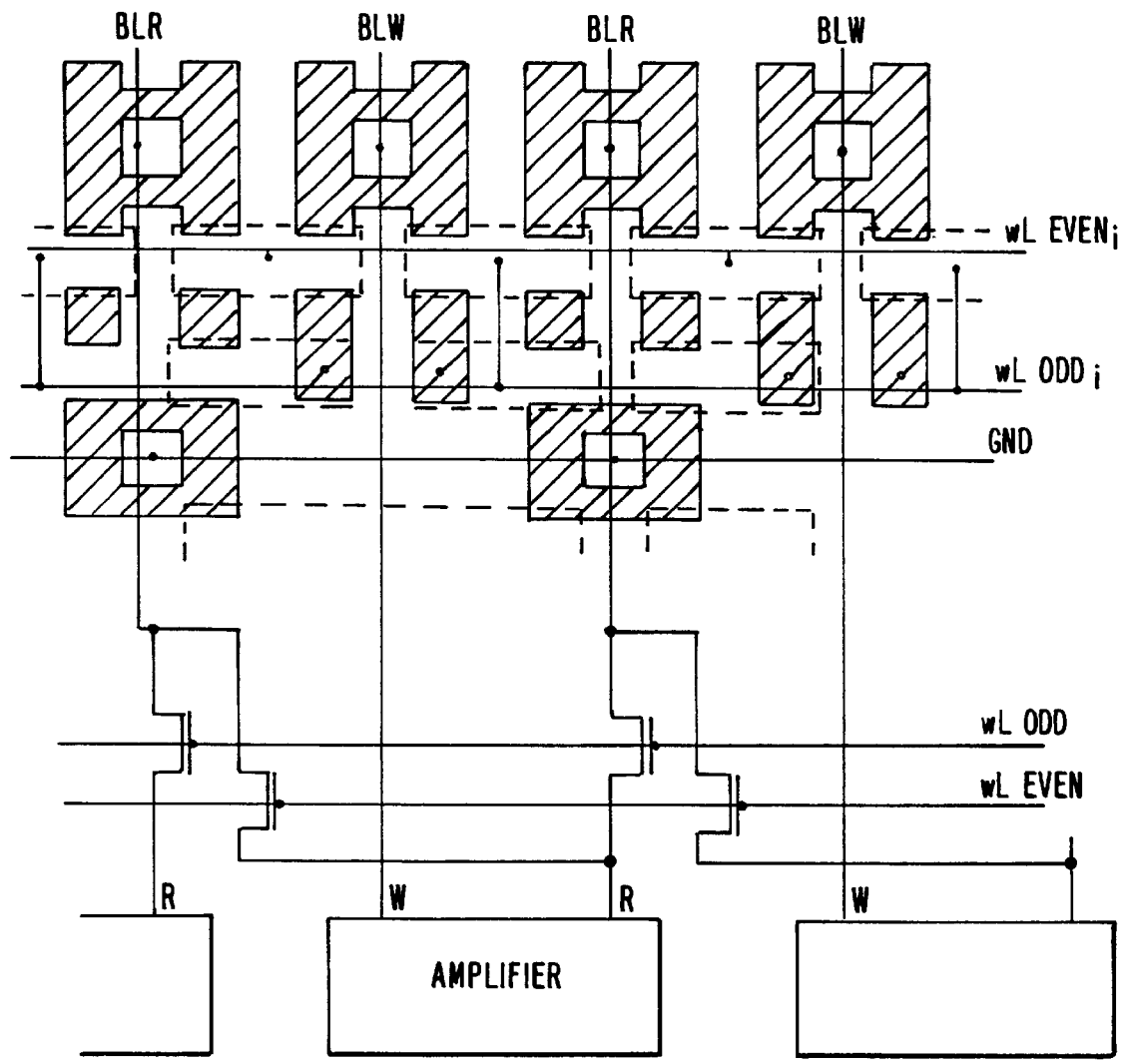
Figure 11C:
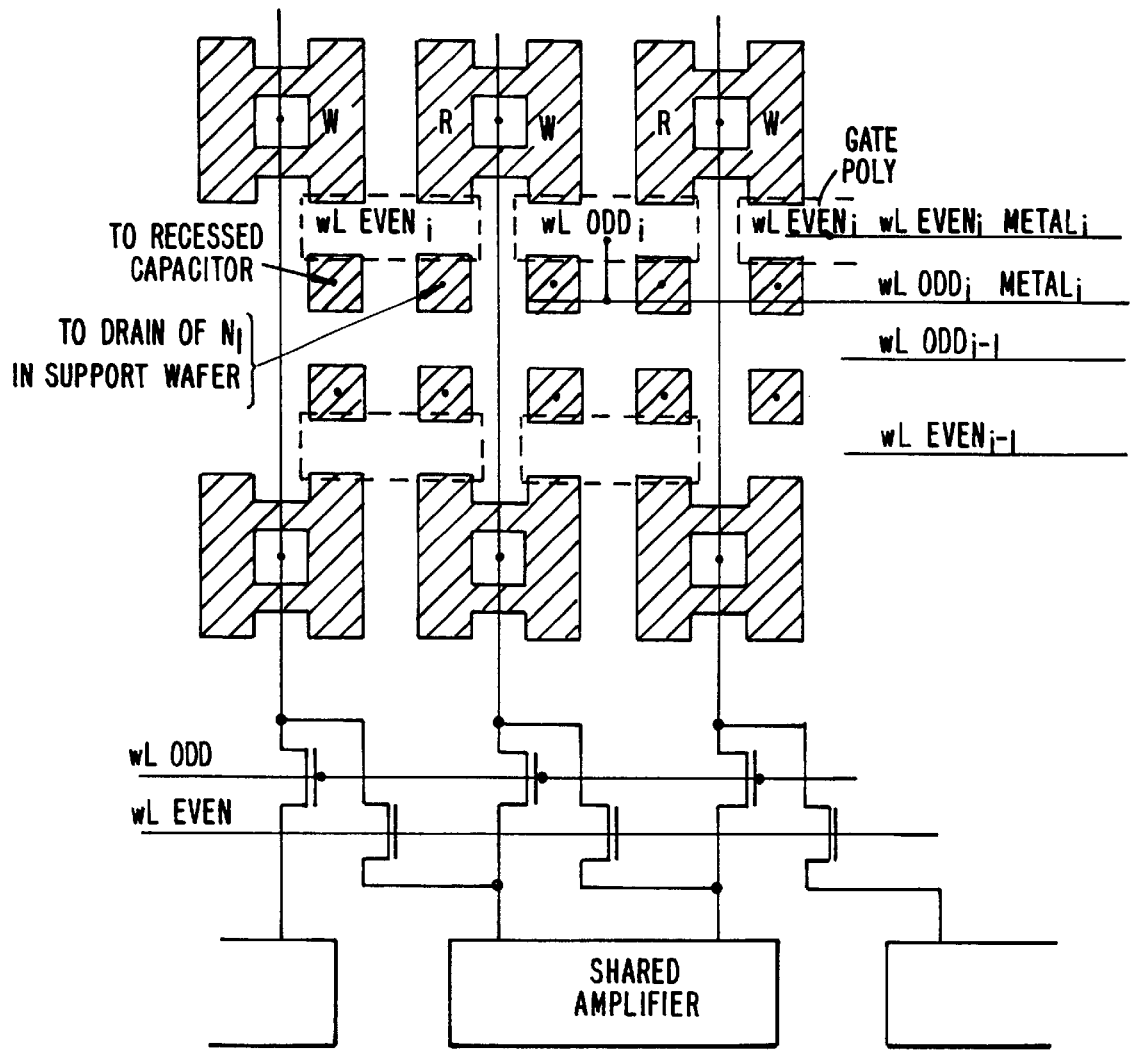

In the single layer cells the bit line connections are as mentioned above, side by side. FIGS. 11A–C show an alternate method by which bit lines are shared. This is possible if different word lines access successive cells and three metal interconnect layers are utilized. In FIG. 11A, each bit line can be a read or a write bit line depending on whether an odd or an even word line is addressed. For an odd word line (WL1), the left-most bit line serves as a write bit line and is therefore connected to the write bit line input of the amplifier (control line "odd wlns"). The middle bit line serves as a read bit line and is connected to the read bit line input of the same amplifier. For an even word line (WL2), on the other hand, the middle bit line serves as a write bit line and is connected to the write input of the amplifier and the third bit line serves as a read bit line and is connected to the read line input of the amplifier. At the same time, the left most bit line also acts as a read bit line and is connected to the read bit line input of the amplifier on the left (only the read line input is shown). In the figure, the word lines are routed across the array in Metal 2. The Metal 1 is then used to reach the Poly gates, with the gate connection located in the area of local oxide between the write and read transistors. In the serially segmented bit line configuration, the output from each segment amplifier connects to the bit lines in the next segment via a pair of pass transistors as shown for the dedicated bit line configurations discussed earlier. In FIG. 11B the bit lines are dedicated for read line or write line, but still with the feature of sharing. Here, the second bit line is used as a write bit line both for the cell on its left and the cell to its right. This bit line always connects to write bit line input on the same amplifier, while the read bit line input to the amplifier is connected to the first or the third bit line depending on if an even or an odd word line is addressed.

The cells in FIGS. 11A and 11B were assumed to be in a single level process. Further area savings will be achieved if the multi layer process is used also for the shared bit line configuration, as shown in FIG. 11C.

Refresh Read and Write in a Segmented Configuration

Figure 12A:
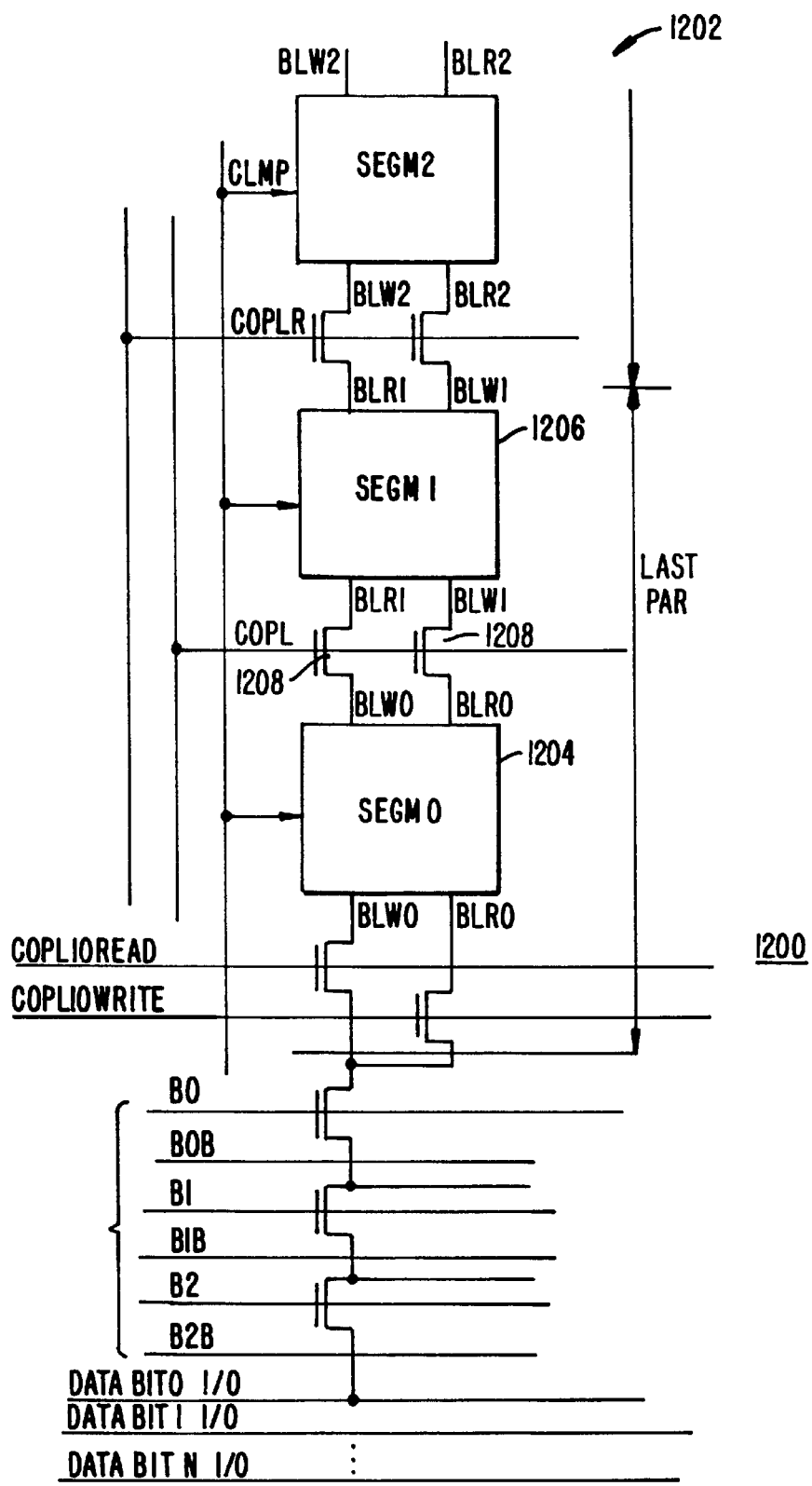
FIGS. 12A–M show circuit and timing diagrams for refresh read and write cycles in the memory of the present invention.

FIG. 12A indicates a portion of representative column 1202 in a segmented memory 1200 that may be selected for reading and writing. In the figure it is assumed that the first data bit in a data word of N bits can selectively be connected to one of the first eight columns in the memory. Three column address bits, B0, B1 and B2, and their complements are used for addressing. Data can be read from or written to either bit line in the last segment 1204 (SEGMENT 0) in column 1202, but there is a small advantage in writing to the read bit line and reading from the write bit line. The coupling is therefore done accordingly, controlled by the signals COPLIOREAD AND COPLIOWRITE.

The timing of the clamping and coupling signals for the segments are optimized for speed and performance. In read mode, it is preferred that an addressed segment be allowed to amplify its signal before any additional segments are connected. In one embodiment, a first increment of time is set aside for the addressed segment, such as, for example, segment 1204, to establish a signal. At the end of this first time increment, the second segment in the pair, which would be segment 1206 in this example, is coupled to first segment 1204 by a signal COPL. At the end of a second time increment, the remaining segments are interconnected.

However, if an inverting amplifier is used in the memory segments, the segment pairs may be allowed to be connected at the outset of a read operation. Furthermore, if the dimensions of coupling transistors 1208 are chosen correctly, all segments may also be connected at the outset of a read operation. This results in simplified logic and in a higher operating speed. In this simplified scheme, all segments are clamped at the same time at the beginning of the cycle followed immediately by an active coupling signal COPL that connects the segments. With inverting amplifiers, memory refresh occurs in segment pairs; all segment pairs are refreshed at the same time. The signal COPL connects the two segments in the pair. This signal may also be applied after a delay that giving the selected segment signal time to establish itself, compensating for any disturbance introduced by the clamp signal. On the other hand, coupling the two segments in a pair with COPL just after the CLMP signal is active is equally reliable, as both segments are disturbed equally. The fact that read bit line BLR in one segment connects to write bit line BLW in the next segment results in nearly full compensation, without using a compensating signal as discussed earlier. The COPLR signal, which is used to connect one segment pair to an adjacent segment pair, is not applied in the refresh operation. For reading and writing, both COPL and COPLR are applied after CLMP at the beginning of a cycle. A write operation must apply a signal to segment 1204 which is larger than the signal in the addressed cell if the cell happens to hold data of opposite value. If the topmost segment in column 1202 is being written to, the written signal would have to travel through all the segments in column 1202 to reach the segment at the top of the column. At the same time, a signal of the opposite value may be travelling from the top segment in column 1202 toward the bottom segment 1204. At some point, probably near the middle of column 1202, the two opposite-going signals would meet, and the difference between the two signals would then proceed in both directions. If the written signal dominates, the addressed segment at the top of column 1202 will have the correct data written. The larger the written signal, the faster the write bit line in the addressed segment will reach a safe write level.

Only selected columns are addressed for the purposes of reading and writing data to the memory segments in the selected column. In both operations, the stored data in the non-selected columns is not modified. All columns are exposed to the same "horizontal" signals such as COPL, COPLR, CLMP, WL and DUM (defining the dummy current level).

FIGS. 12B through 12E are simulation outputs. A memory array was simulated that included 256 columns with 16 segments per column arranged in 8 segment pairs, where each segment had 64 memory cells. A 0.5 micron industrial process at normal operating conditions was used. A 15 ns cycle time was simulated, which provides sufficient margins for reliable operation.

Figure 12B:
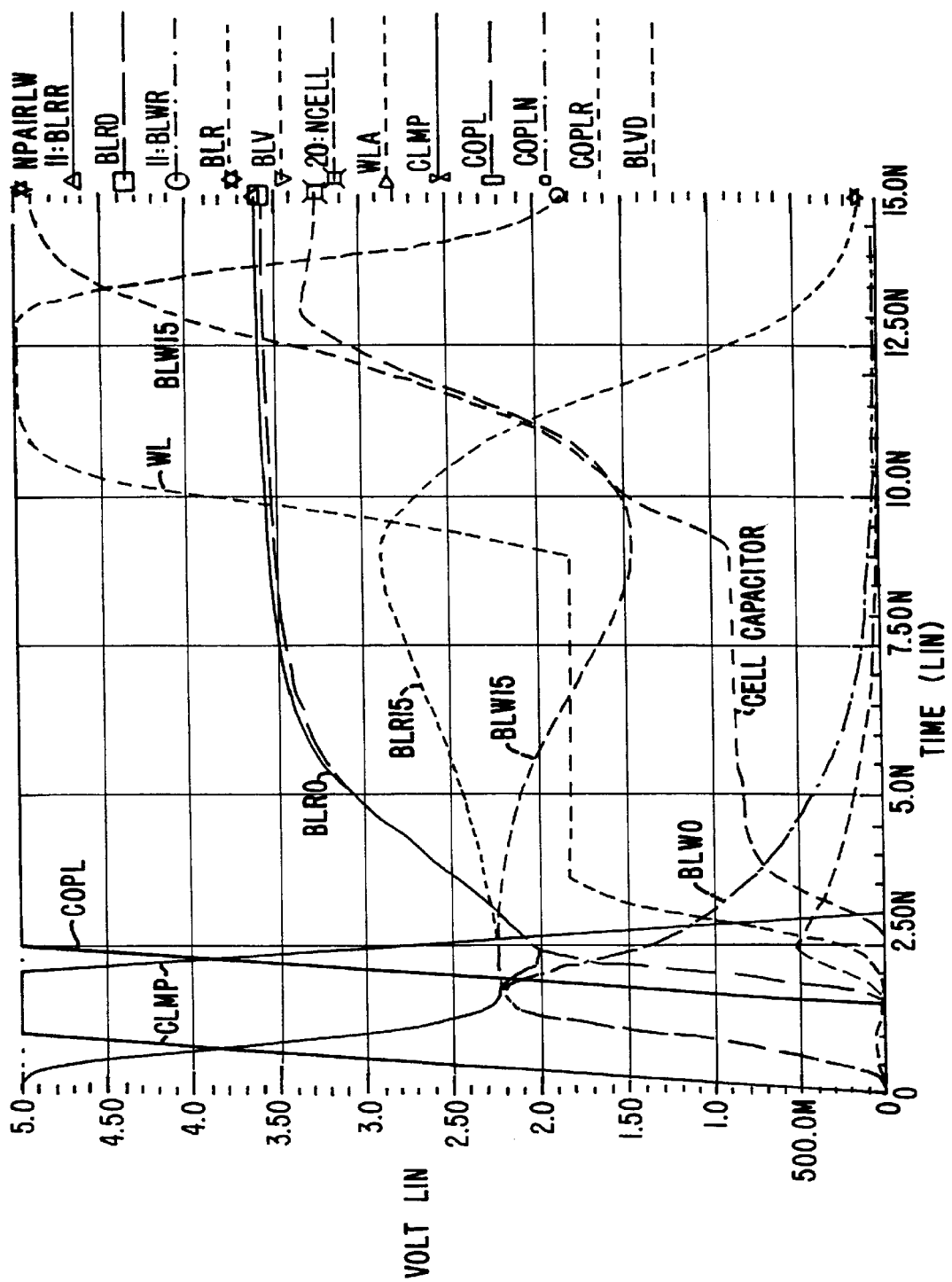

In FIG. 12B, the simulation shows the results when a memory cell storing zero volts on the cell capacitor is addressed by a word line in the top segment. The write signal is applied to the bottom segment, with a polarity such that the stored zero will become a one. After the clamp and activation of the coupling signal, the dummy current dominates over the cell current and the read bit line for the addressed segment (BLR15) starts going positive and write bit line for the addressed segment (BLW15) goes negative. At the same time BLW0 is pulled low, causing BLR0 to go high, thereby initiating writing of a one in the addressed cell. After approximately 9 ns the written signal reaches the top segment, causing BLR15 and BLW15 to change direction of transition. BLW15 reaches the full 5 V level at the end of the cycle and the cell is charged to about 3.3 V, which is well above the level of 2.5 V that is generally required to store a one in the cell capacitor.

Figure 12C:
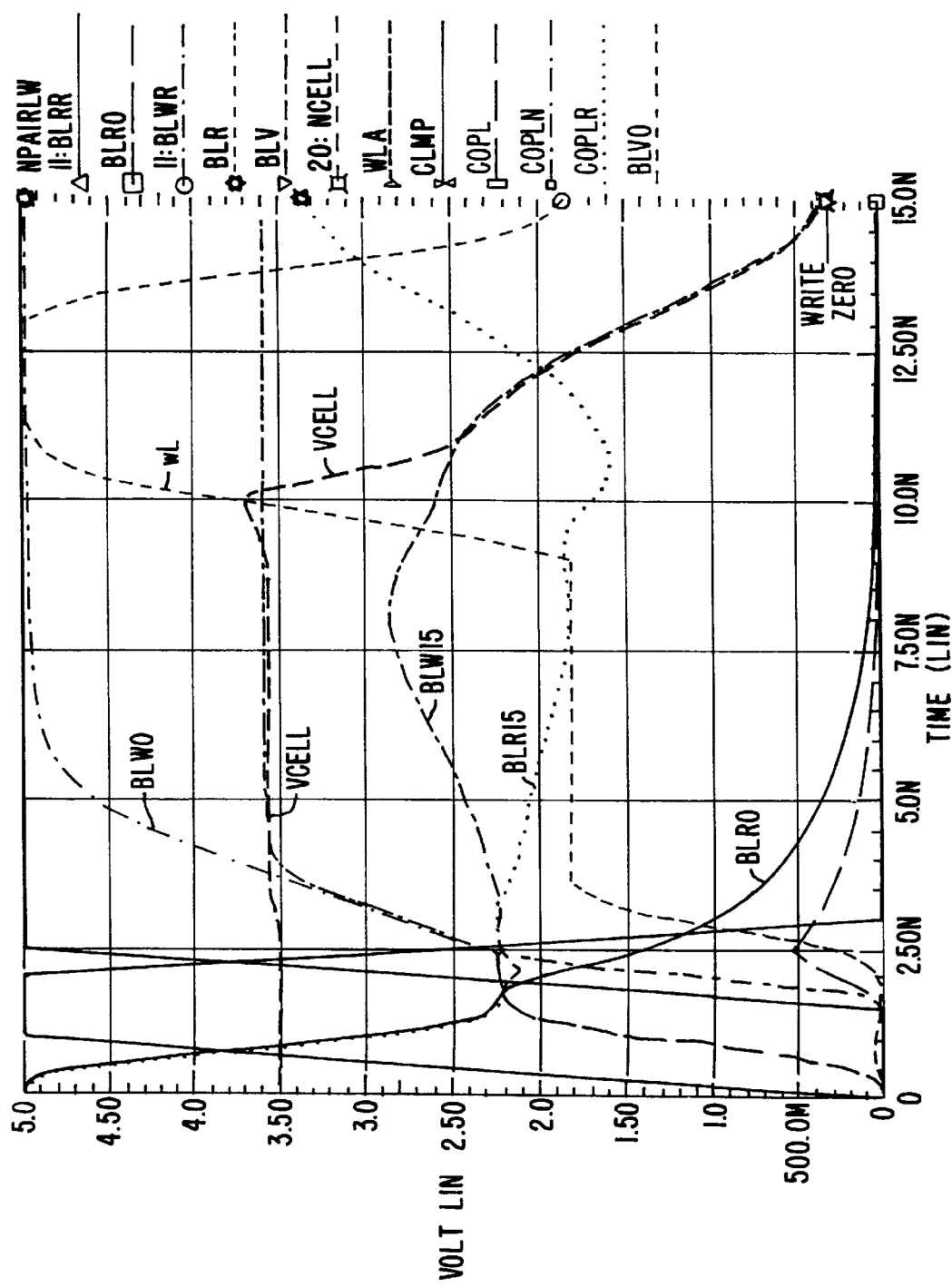

In FIG. 12C, the simulation result is shown for the operation of writing a zero over a stored one in the cell capacitor in the top segment. The cell has a stored voltage level of 3.5 V, which is the highest stored one voltage level that can be written without boosting the word line level. This gives the highest possible gain contribution from the stored cell, which is acting against the written data input applied to the bottom segment. The direction of BLW15 starts turning around after 8 ns and reaches 0.3 V at the end of the cycle. The cell voltage tracks BLW15 after 11 ns and reaches 1.5 V after 13 ns. A cell voltage of 1.5 V is marginally acceptable for a stored zero level, so the 15 ns cycle time provides sufficient margin at normal operating conditions.

Figure 12D:
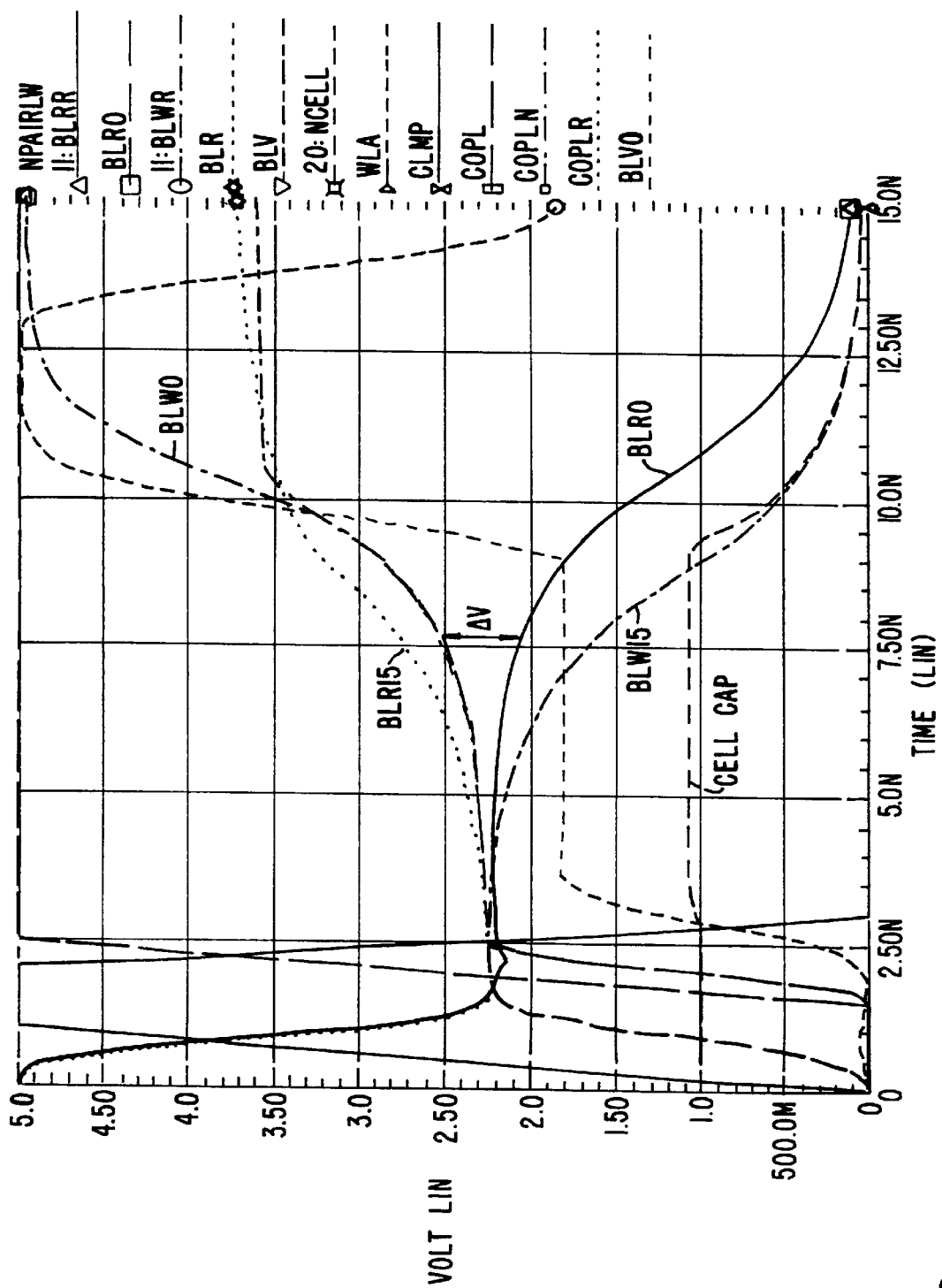
Figure 12E:
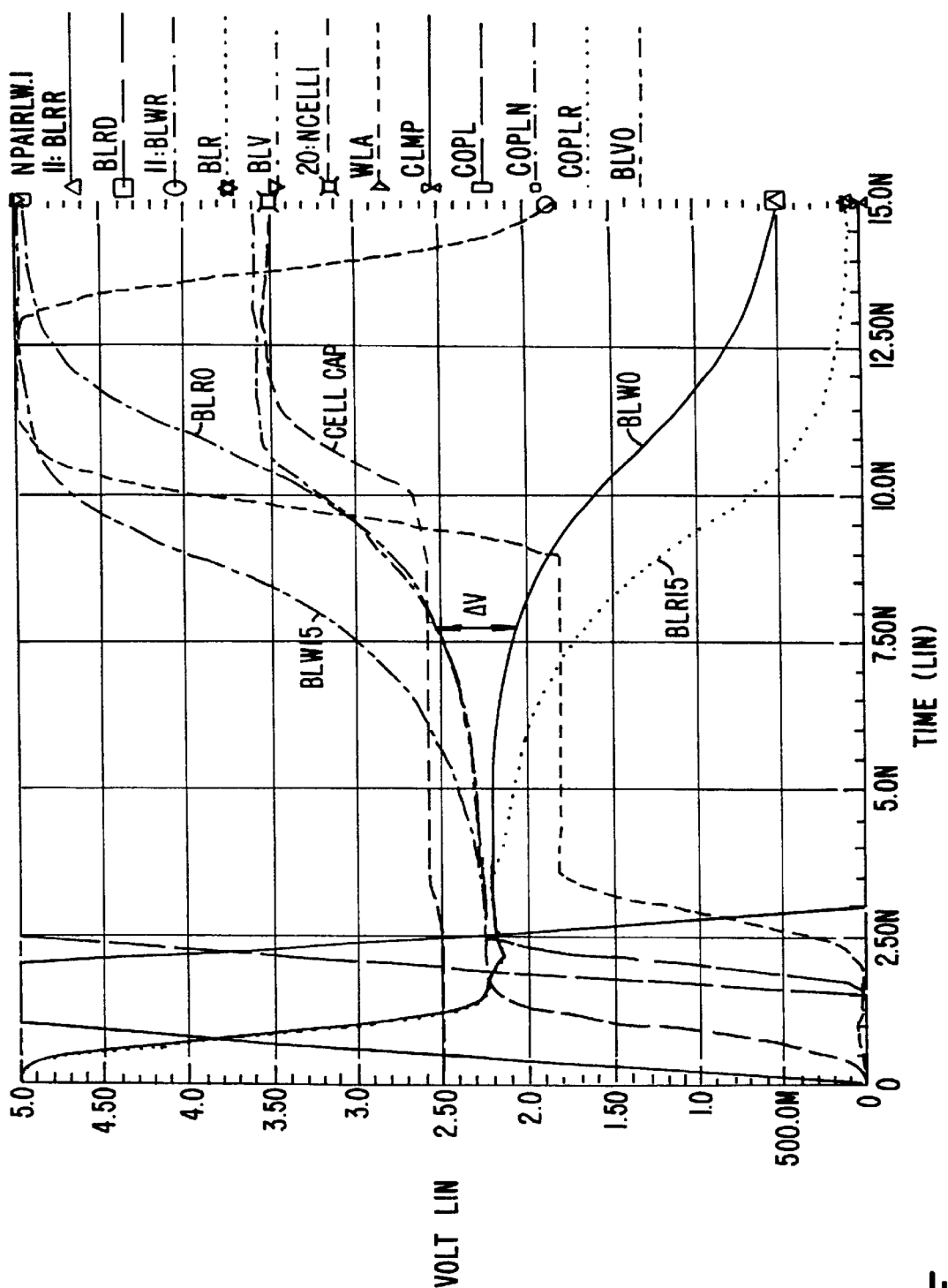

The stored data in non-selected columns is not disturbed, as illustrated by the simulation results shown in FIGS. 12D and 12E. In FIG. 12D, a stored zero at a level of 1 V is originally present in the addressed cell in the top segment. Bitlines BLR15 and BLW15 are the first to move due to the dominance of the dummy current to the selected segment over the current from the selected cell. BLW15 falls below 1 V after 9 ns and reaches close to 0 V at the end of the cycle. There is less than a 2 ns delay between BLW15 and BLR0 and an actual crossover between BLR15 and BLW0, caused by the fact that the coupling signal amplitude is limited to 5 V in the simulation. The coupling transistors are not conducting higher than one threshold voltage below 5 V. Due to a high body effect of the transistor, the threshold voltage Vth at 3.5 V is actually 1.5 V. As the same control signals are used for both reading and writing on non-selected columns, FIG. 12D also illustrates the read operation. The differential signal between BLW0 and BLR0 represents the stored data. FIG. 12E shows the simulated result when a stored one at 2.5 V is read. The differential signal between BLW0 and BLR0 also here represents the stored data.

It is apparent that the read data can be read out long before the end of the full memory cycle. This is a very important feature of this type of memory. A memory read or refresh cycle can be interrupted at any time in the cycle without destroying the stored data. A read cycle can therefore be terminated as soon as a detectable differential signal between the bit lines in the bottom segment is transferred to the output. The only disadvantage is that the read cell level will not be refreshed in an interrupted cycle, but the level will remain the same as at the start of the cycle. The voltage level in the cell will therefore remain the same until the next refresh cycle.

Figure 12F:
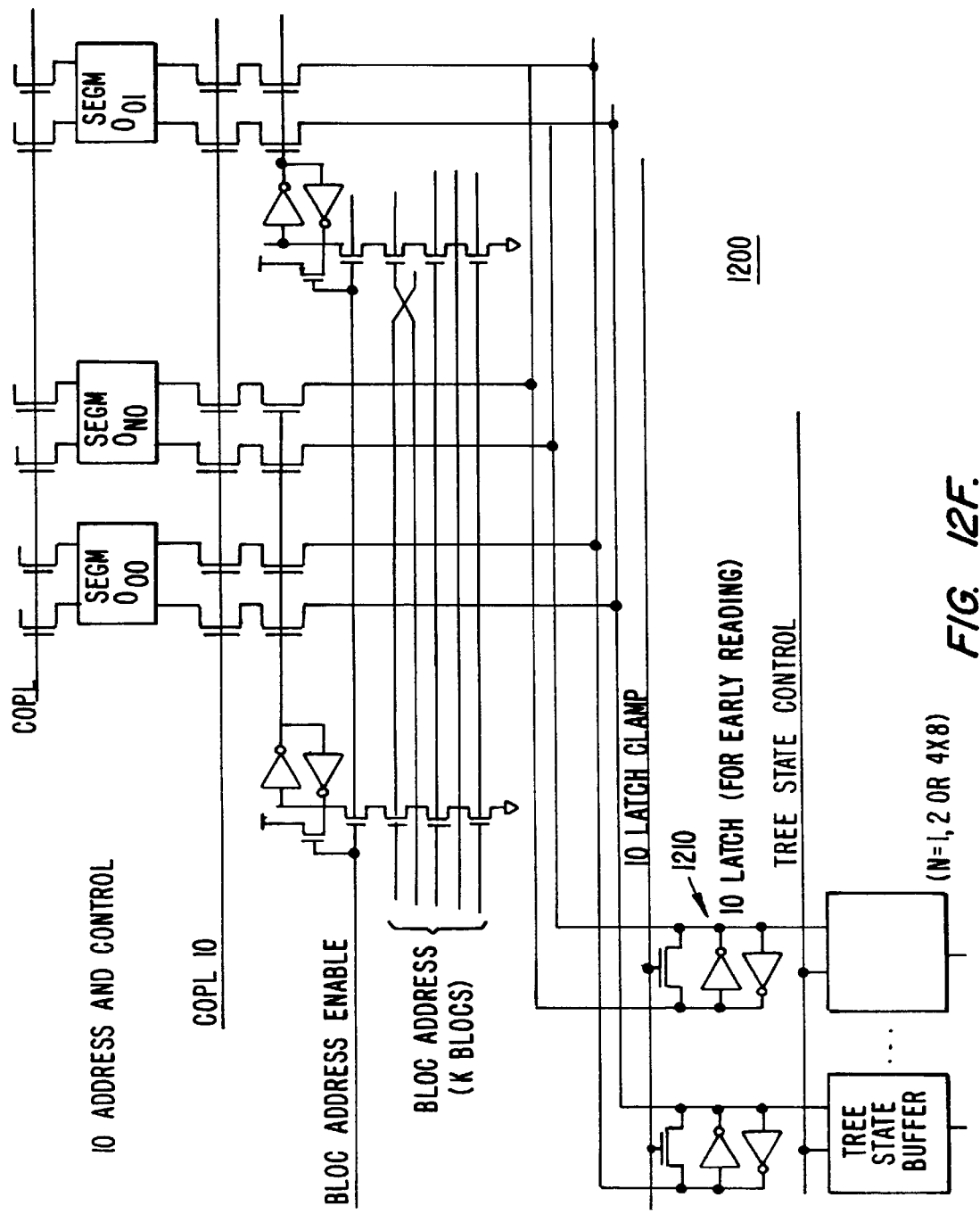

If an I/O latch 1210 is added to memory 1200 from FIG. 12A, as indicated in FIG. 12F, the delta V in FIGS. 12D and 12E can be allowed to be as low as 100 mV. This would mean that data could be transferred to the latch after only 5 ns. Additional time is naturally required to forward the data to the output, but a read access time of less than 8 ns is practical for this array configuration.

Figure 12G:
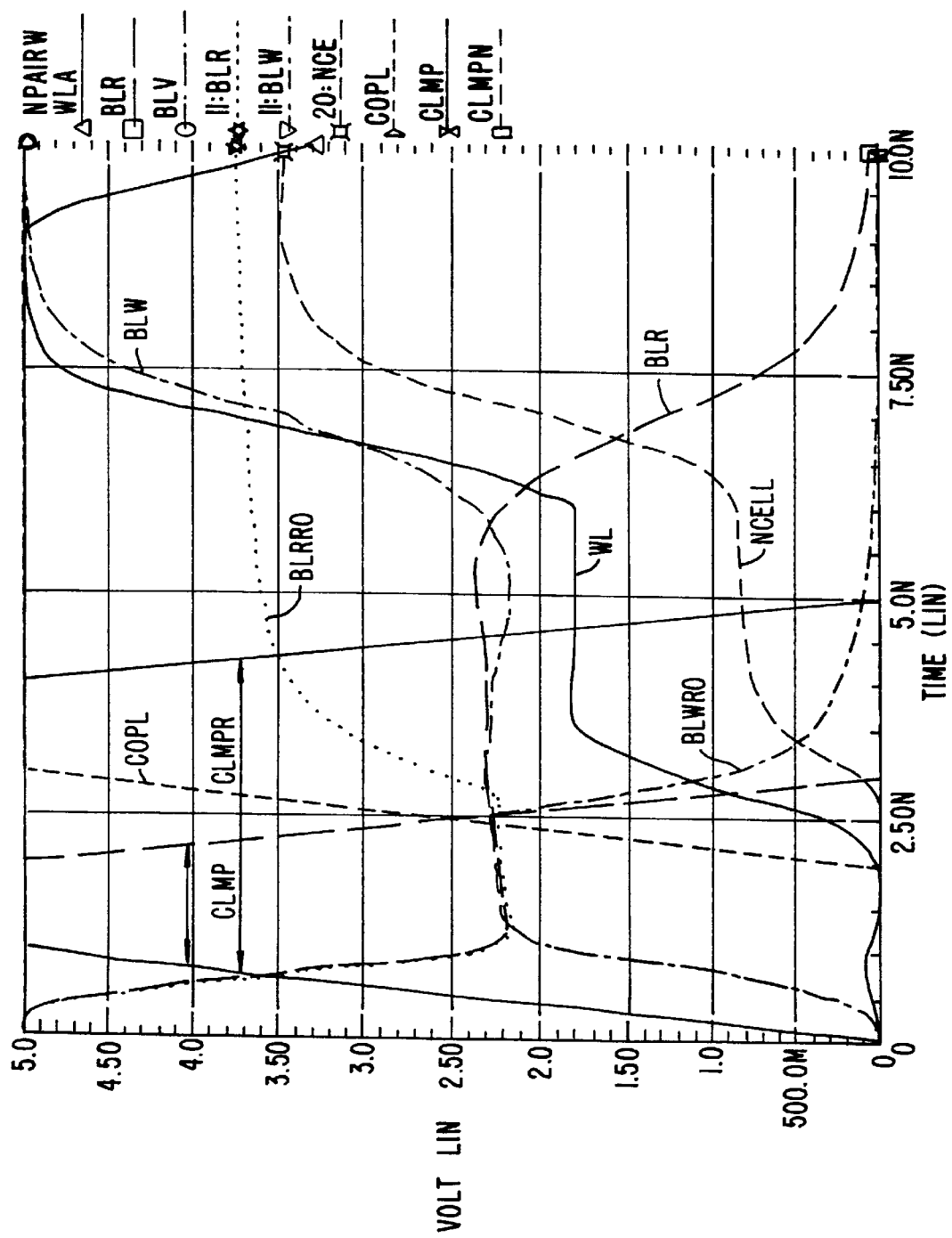
Figure 12H:
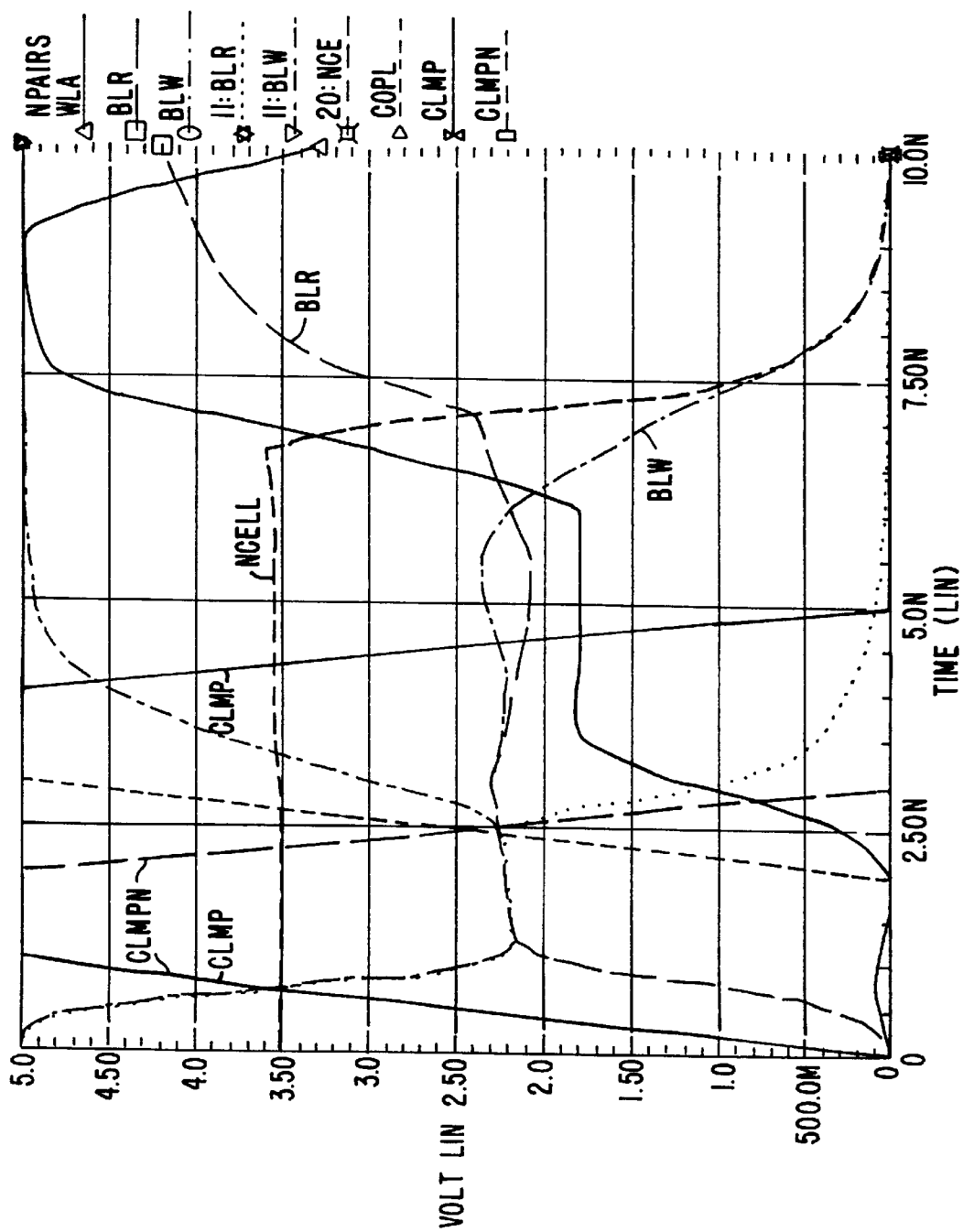

The number of cells per segment has an impact on speed, which makes it possible to reduce the cycle time for reading and refreshing if the number of cells per segment are reduced. The delay through the coupling transistors combined with a limited gain in the amplifiers makes it difficult to write over previously stored data in the most remote segment without making special arrangements. Simulations run on a memory structure with 256 columns, 8 segment pairs (16 segments) and 32 cells per segment are shown in FIGS. 12G–12L. If a cell in the most remote segment is addressed for writing, a read cycle to this segment will progress quite far before a write signal of opposite polarity reaches the addressed segment. On the other hand, if the bitlines in the segments of the addressed pair are held clamped for an extended time, while awaiting the arrival of the write signal, then the change of polarity between the bit lines will be faster. In FIG. 12G, the clamp signals CLMP and CLMPR for the selected pair are allowed to stay on 2 ns longer than the clamp signals for all other segments. All segments are coupled together at the same time indicated by COPL becoming active. The write inputs are applied to the bit lines in the bottom segment (BLRR0 and BLWR0). The write signal proceeds from segment to segment toward the top of the array. Before it reaches the addressed segment, its clamping is terminated and the write signal overcomes the small signal from the cell. At a time of 7.5 ns, the previously stored zero has been changed to an acceptable one. After 10 ns, a maximum level for a stored one is reached. FIG. 12H shows the signals for writing a zero over a stored one.

Figure 12I:
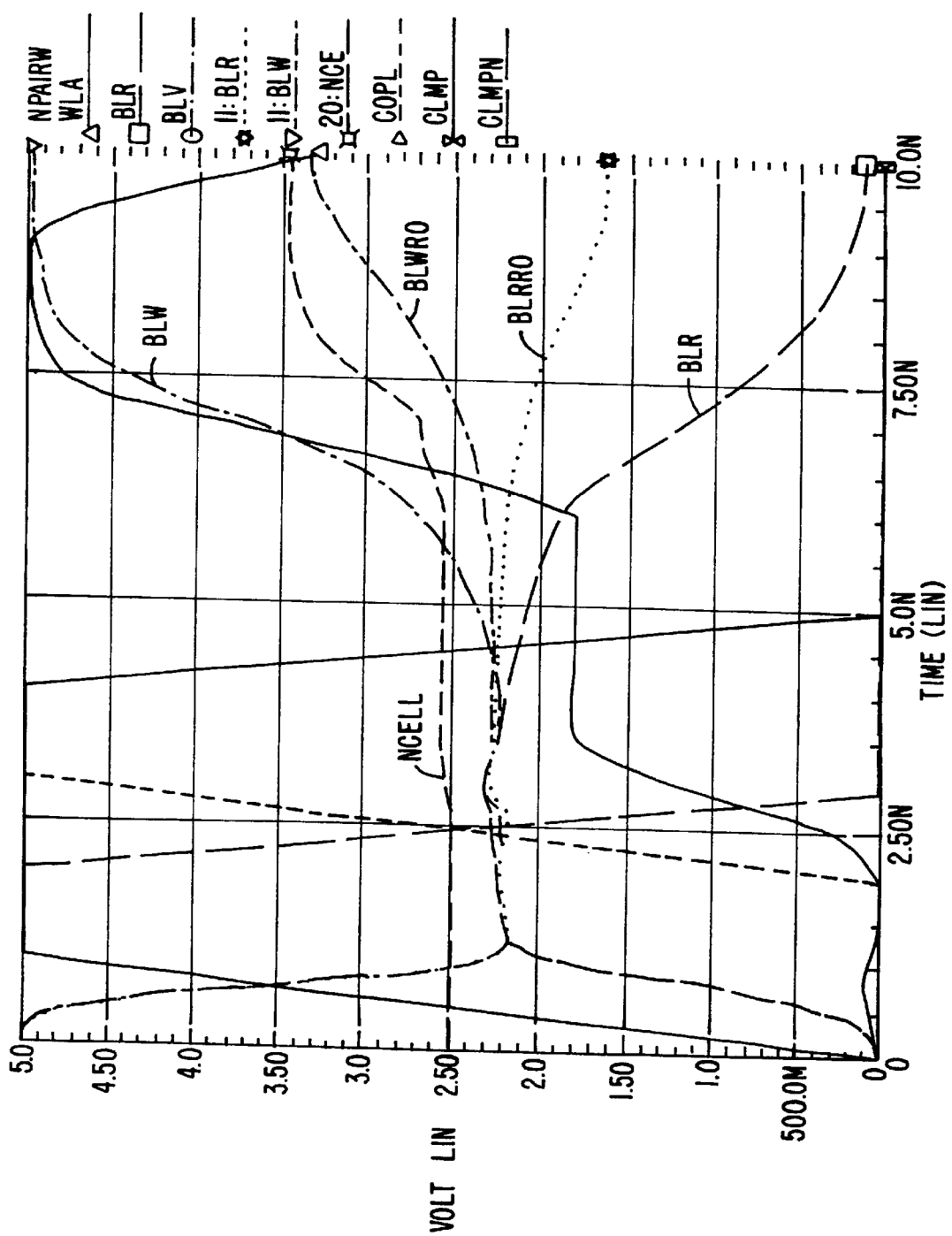
Figure 12J:
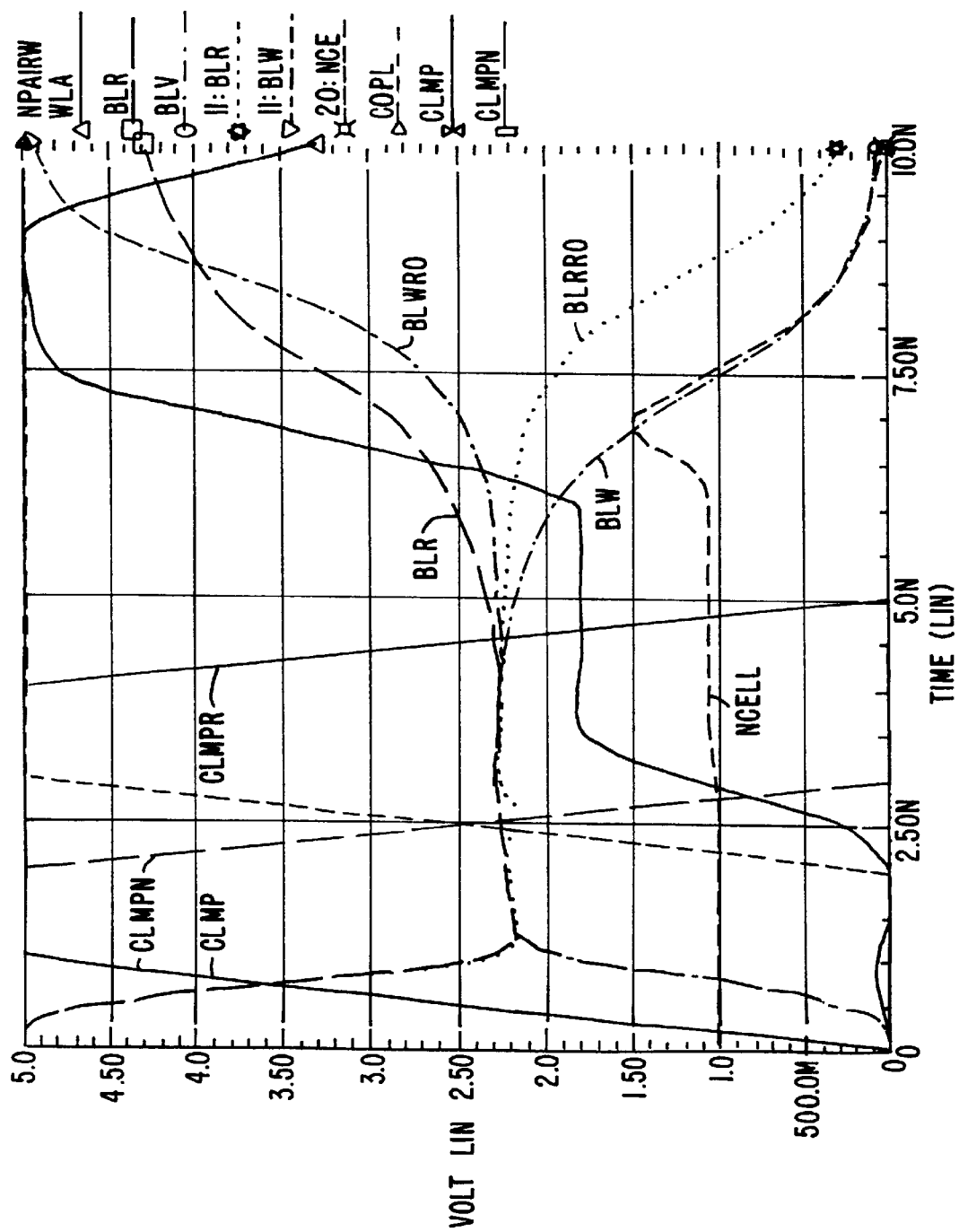

It is important that the columns not selected by the column decoder for writing still preserve the stored data in their addressed cells. FIG. 12I shows how a stored one is actually restored to its maximum value in the non-selected column. BLR and BLW in the top segment still have enough time to reach their full value. There is however not enough time for the signal generated in the top segment to proceed down to the bottom segment and overcome a noise-generated signal therein. The polarity of the bit line signals in this case does not matter as the output is not used in this mode. FIG. 12J shows how a stored zero is restored in a non-selected column during the write operation. In this case, the noise signal in the bottom segment happened to go in the same direction as the signal coming down the line from the addressed segment. The noise source for the bottom segment will be discussed in connection with the read mode below.

Figure 12K:
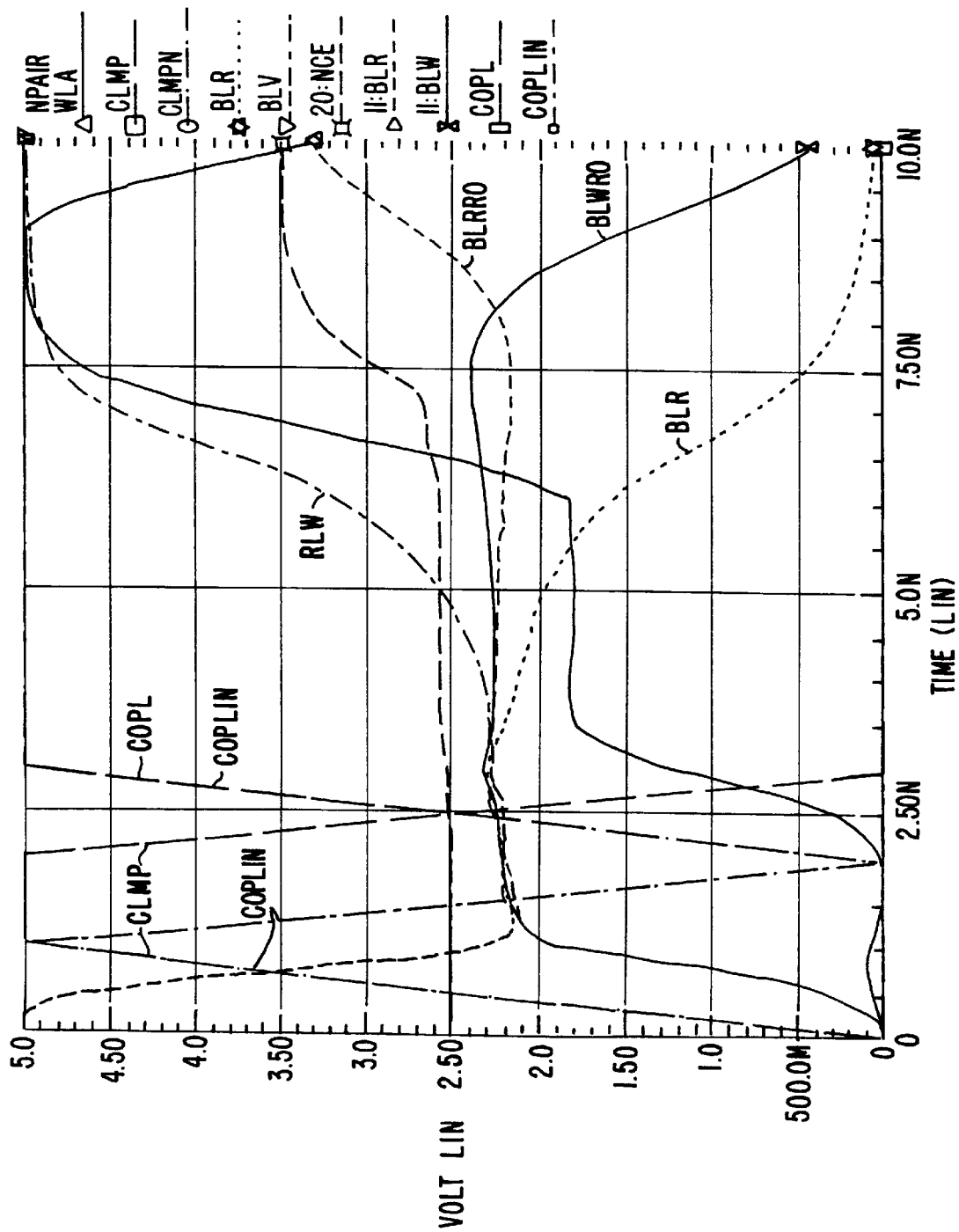
Figure 12L:
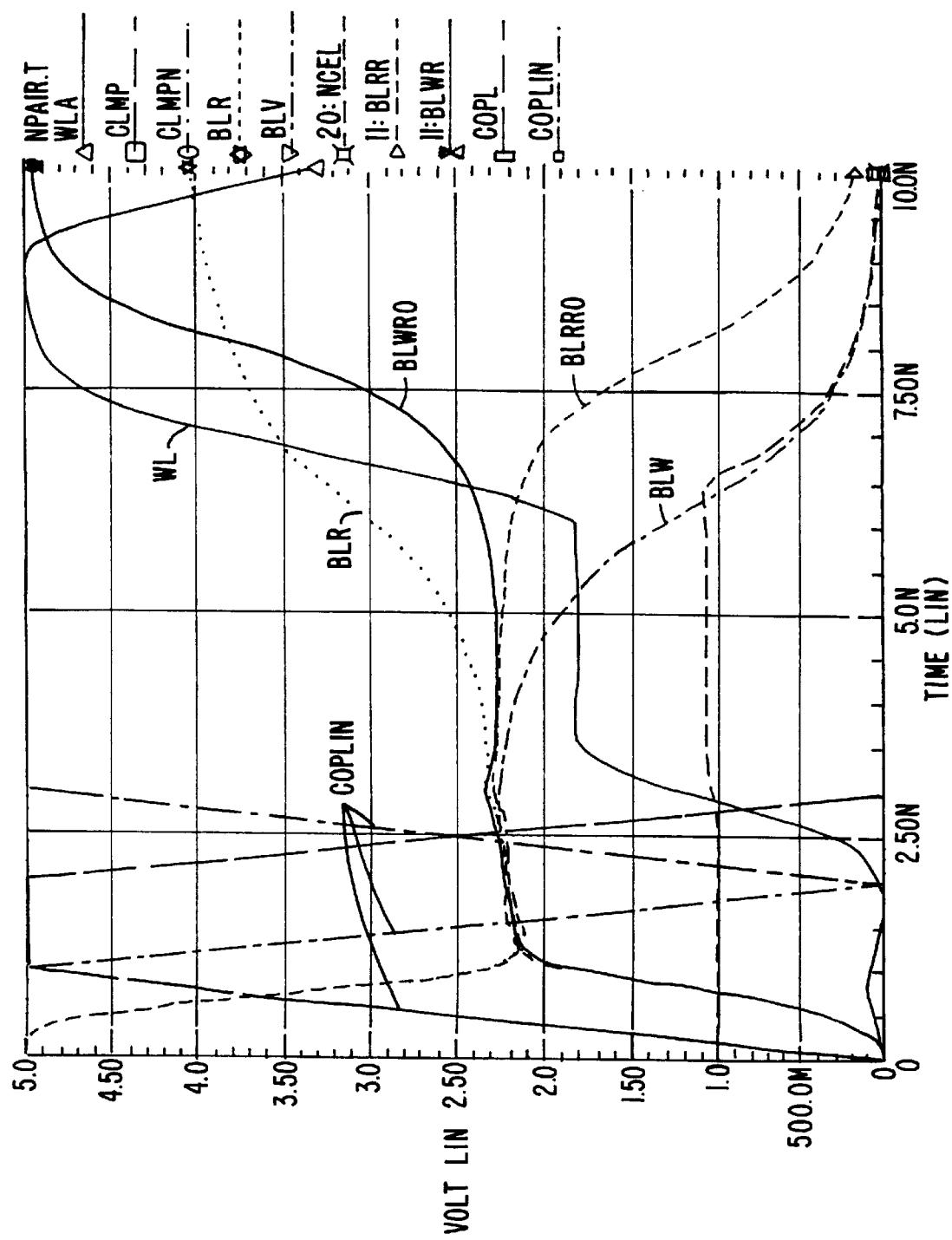

FIGS. 12K and 12L show simulations of the read mode. To make sure that a signal from the top segment reaches the bottom segment and is correctly presented to the I/O circuits some improvements have been made compared to the sequence used for the 64 cells/segment sequence described in connection with FIGS. 12B–12E. The negative-going clamp signal will, as discussed earlier, introduce a small negative displacement of both bit lines. In a disconnected segment this would cause the write bit line to move positive with the read bit line remaining stationary. In a long chain of segments, write and read bit lines are alternately connected, so the inside of a long chain is more or less self compensated. The problem arises in the segments at the ends of the chain. For all segments the coupling signals adds a positive compensation. The top segment is exposed to one half compensation from the coupling signal, while the internal segments each are exposed to full compensation. The bottom segment in read mode is coupled to the I/O circuit through some form of decoder or to an output latch. In either case the coupling transistors controlled by the signal COPLIN connect to nodes with unknown potential and capacitance. It is therefore desirable to connect these nodes to the bit lines during clamping to equalize the potentials. The COPLIN signal is turned on momentarily at the beginning of CLMP and turned on again at the same time as all other coupling signals. Using this technique, FIGS. 12K and 12L show how the bottom segment bit lines BLRR0 and BLWR0 correctly reflect the stored data.

Figure 12M:
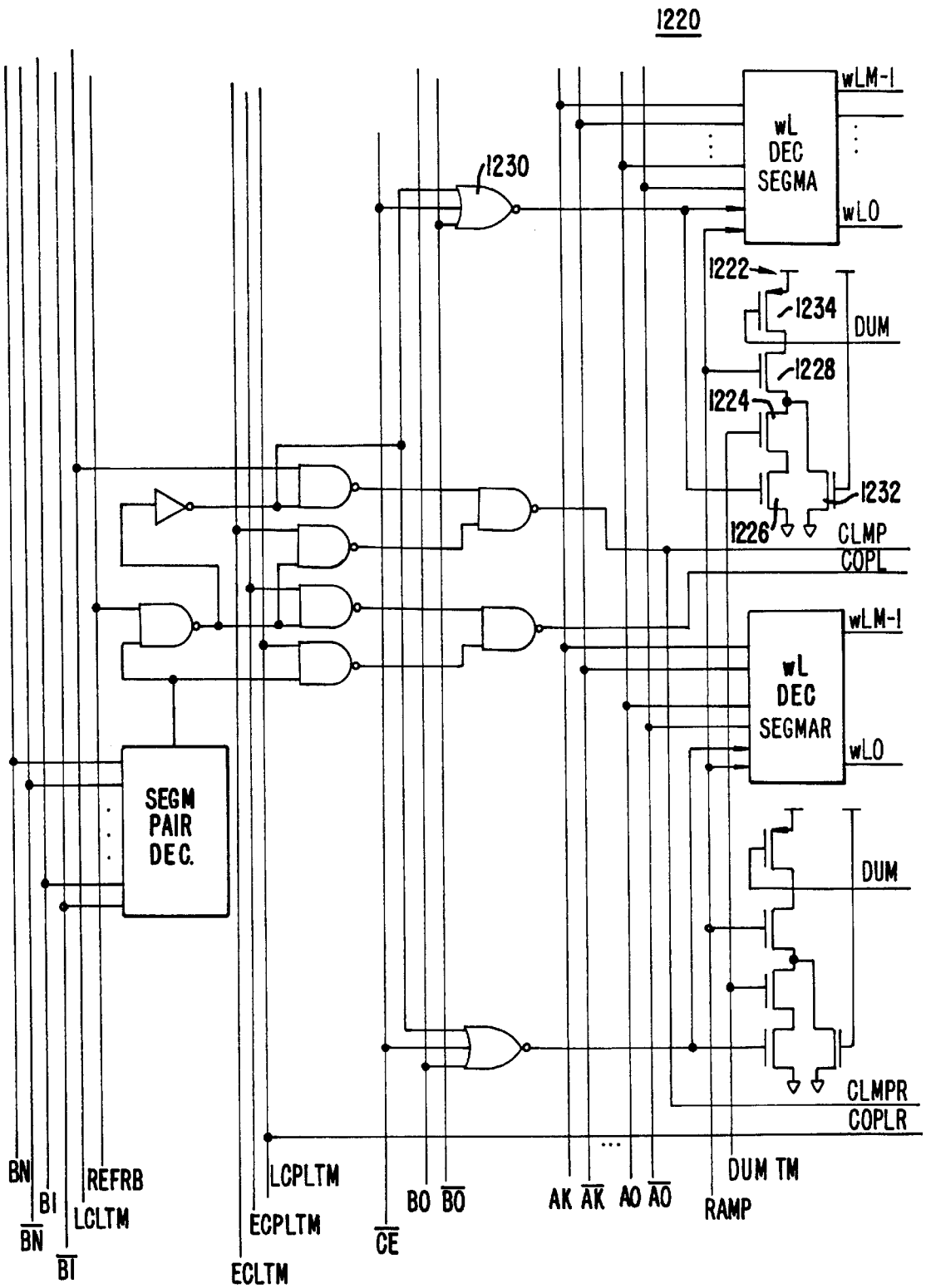

In the previous discussion, it was assumed that the segments operated in pairs, so it is reasonable to use a segment pair decoder 1220 shown in FIG. 12M. The low order bit B0 in the segment address is used to select one or the other segment after the higher order bits select the pair (B1 . . . Bn). The dummy current for instance is applied only to the selected segment, so each segment has its own dummy voltage generator. The dummy transistor in the selected segment actually mirrors the current flowing through the dummy voltage generator. The current through the dummy voltage generator 1222 is primarily a function of the RAMP voltage and increases the dummy current proportional to how the cell current varies with the RAMP voltage. The two transistors 1224 and 1226 between the RAMP-controlled transistor 1228 and ground are larger and serve mainly as switches. Transistor 1224 is used to define how long the dummy current is to stay on during the cycle and transistor 1226 is turned on only during memory activity and when the specific segment is selected. A three input NOR gate 1230 combines the selected pair signal with the ODD/EVEN selection by B0 and its complement to select the segment and associated dummy voltage generator. The fourth N-channel transistor 1232 in the dummy voltage generator is very small and in standby barely keeps the P-channel mirror transistor 1234 conducting.

A number of global timing signals are connected to all segment pairs. Specifically, DUMTM defines the active dummy current time, ECLTM defines early clamp time, LCLTM defines late clamp time, ECPLTM defines early coupling time, and LCPLTM defines late coupling time. The complement of the refresh command (REFRB) is also a global signal. REFRB (low level) bypasses the segment pair decoder and applies an early clamp signal to both segments through signals CLMP and CLMPR. An early coupling signal is also applied to the top segment in each pair, connecting the two segments in the middle. The LCPLTM signal is not delivered in the refresh cycle, thus keeping all pairs separated.

Control of Logic Cells with DRAMs

U.S. Pat. No. Nos. 5,375,086 and 5,317,212, both hereby incorporated by reference, describe methods for controlling the function of logic by using the capacitors in DRAMs as the controlling element. The DRAM of the present invention lends itself to control of logic with some advantages over the previously disclosed method.

The control capacitors that are also storage capacitors in the memory cells are typically larger than what is required for memory functions. With the leakage currents in the dielectric of-the capacitors much smaller than the leakage in the write transistor, successive refresh cycles can occur less frequently. As most of the power at refresh is consumed moving the bit lines, the refresh power is inherently low. However the power consumption can be further reduced by using segmented bit lines, as the power consumption is inversely proportional to the number of segments.

The control capacitor Cc, which principally replaces an SRAM cell, must in its high state be at least at a level of Vdd. The cell capacitor is typically connected to the gate of a large pass transistor, which has a gate capacitance of Cgp. Any signal Vsig passed by the pass transistor will be coupled to Cc through a capacitive voltage divider. The variation on the voltage on a programmed cell is described by Dvc=Vsig× Cgp/(Cgp+Cc). The signal Vsig typically has an amplitude of Vdd. If Vdd is 5 V and Cc=4×Cgp, then Dvc will be 1 V. The programming is asynchronous to any signals in the controlled system. If programming occurs when the passed signal is at Vdd and the programmed cell voltage is Vcellp, then the cell voltage will be reduced by Dvc, when the passed signal has returned to ground. The gate to source/ drain voltage will go from (Vcellp−Vdd) to (Vcellp−Dvc) during the negative transition. Conversely at a following transition the gate to source/drain voltage will go from (Vcellp−Dvc) to (Vcellp−Vdd).

If the programming occurs when the passed signal is at ground level, then the cell voltage will increase by Dvc when the passed signal goes from 0 to Vdd. The gate to source/drain voltage will go from Vcellp to (Vcellp+Dvc− Vdd) during the positive transition. If the design goal is to equal the performance of SRAM control, then Vcellp is at a level of Vdd. The SRAM has a relatively high output resistance, so in a negative transition the gate voltage will drop and recover with a time constant of (Routput×Cgp). If it is assumed that this slows the negative transition approximately as much as the transition would be slowed by reducing the gate to source voltage to Vdd−Dvc at the end of the transition, then a relatively high value such as 2 V could be chosen for Dvc. When the positive transition occurs (assuming that the programming was done when the signal was at Vdd level) the gate to source voltage would go from 3 V to 0 V, while the SRAM-controlled gate to source voltage would go from Vdd to a positive voltage caused by the same time constant of (Routput×Cgp), but limited by the forward-biased diode from the drain of the P-channel transistor to its N-well (approximately 0.6 V).

If the programming had occurred at a low signal, both transitions would have been faster than for the SRAM case, with the gate to source voltages (assuming Vdd+5 volt) 5 V and 7 V in the two extremes of the transitions. To program Vcellp to 5 V, the supply voltage to the word line of the amplifier must be approximately 6.6 V due to the high body effect on the short channel transistors. If Dvc=2, the cell voltage would peak at 7 V. The pass transistor gate would however be exposed to a maximum of 5 V, while the full 7 V would stress the gate of the sense transistor and the extended storage capacitor. If 7 V is the specified maximum voltage, the word line voltage would also be permitted to go that high. The amplifier supply could then be 5.4 V and a Dvc of 1.6 would be chosen. The cell capacitance is determined by the relationship Cc=(5/1.6−1)×Cgp=2.125×Cgp. A pass transistor may have W=20µ and L=0.5µ, or a total gate area of 10 µsq. The cell capacitor area would be 21.25 µsq or in the form of a full transistor with W=4.6µ and L=4.6µ. The pass transistor would occupy about 70 µsq, while the capacitor would occupy 35 µsq. A capacitor with a source in the middle would only occupy 25 µsq. It is apparent that Dvc could be reduced even further at relatively small area cost. The actual voltages and capacitor sizes depend on process limits and design criteria.

The DRAM cell of the present invention has been described as using three N-channel transistors, but it should be understood that three P-channel transistors can naturally also be used, with associated circuits and signals modified to fit the reversed requirements.

The addressing of a memory used for control of logic need not be as fast as for a conventional memory. Data and addresses can be fed serially through shift registers in both vertical and horizontal directions. Recent requirements for higher speed of loading uses byte wide data shifting and for more advanced applications random addressing for the writing of control data is used.

Figure 13A:
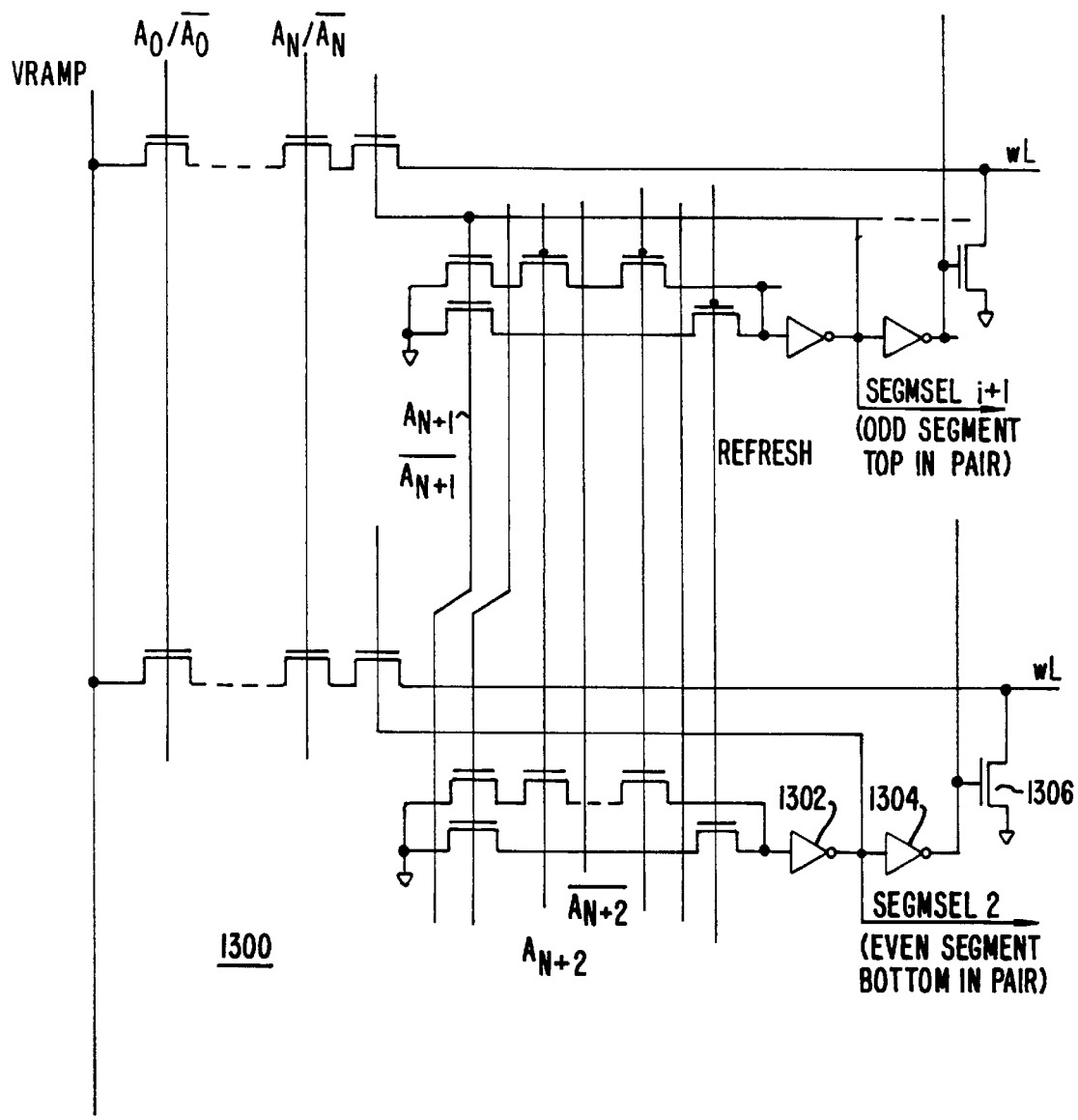
FIGS. 13A–G show circuit and timing diagrams of control circuitry for the memory according to the present invention.

FIG. 13A shows a decoder 1300 that may be used to address the word lines. The decoder is operated by N pairs of signals, both true and complement, selecting a desired word line. The SEGMSEL signal may be global for non-segmented memories or may be derived from a combination of a global enabling signal and a segment decoder. The low order bit An+1 and its complement selects one segment in a pair to be fully decoded for read and write operations, while the higher order bits are bypassed for the refresh operation. The input to the first inverter 1302 in the segment select circuit is assumed to have a weak pullup device normally. With the decoder activated, the input node is pulled low and the output of the first inverter 1302 enables all word line decoders in the selected segment. However only the word line selected by A0 to An and their complements will track the global VRAMP signal. The output of second inverter 1304 goes low on the selected segment, thus allowing the selected word line to go high.

The active time for the cycle is superimposed on An+1 and its complement such that both are low between cycles. Then at the end of the cycle, the input to the first inverter 1302 will go high, as will the output of the second inverter 1304. Transistor 1306 will then pull down the selected word line and hold it and all other word lines to ground. To reach a word line voltage of 7 V, VRAMP need not go higher than 7 V, but the address inputs and the output of the first inverter must reach one threshold higher, which means close to 9 volt. This type of decoder 1300 would therefore be used in connection with a large ratio between the cell capacitance and the load capacitance (gate capacitance of the pass transistor), so that the operating voltage could be reduced.

Figure 13B:
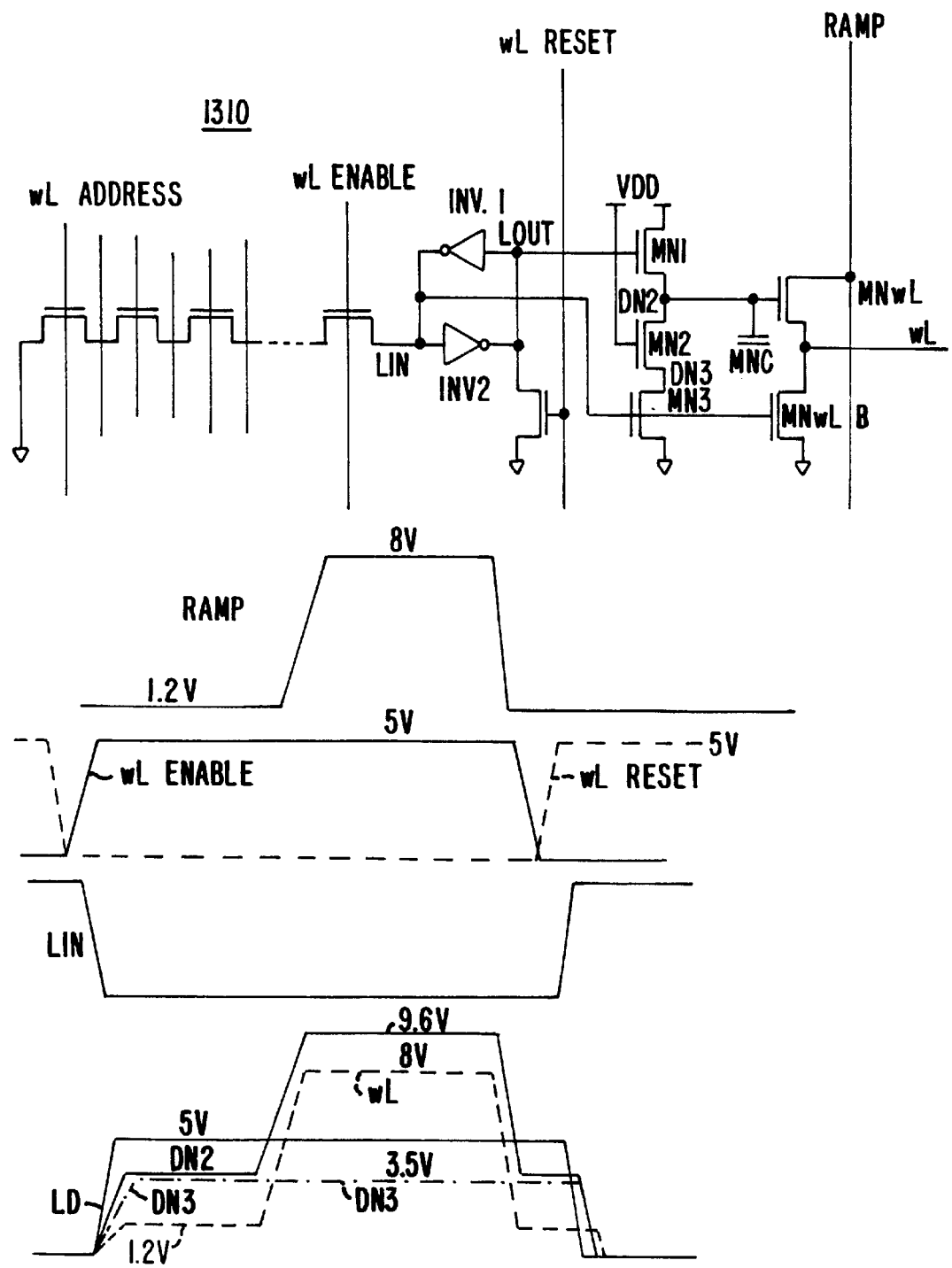

FIG. 13B shows a decoder 1310 with a boosting feature which allows most of the circuits to operate at normal Vdd levels. A WLENABLE and a complement WLRESET is applied globally or from a segment select circuit. In the enable mode, LIN on the decoded circuit is pulled low, setting the previous reset latch. When the LIN signal is low and the LOUT signal is high, nodes DN2 and DN3 are elevated to a level that is one threshold voltage below Vdd (e.g., 3.5 volt). The timing diagrams in FIG. 13B show the levels of the different nodes. The RAMP signal starts out at a low voltage level of approximately 1.2 V, and WL is brought to that level by fully turning on MNWL. Late in the cycle, RAMP moves from 1.2 V to 8 V, in this particular case. The capacitor MNC is much larger than the capacitance of node DN2, so DN2 will track the rise of the RAMP and the word line. DN2 will end up higher than the RAMP by one threshold voltage, so the word line will go as high as the RAMP signal (e.g., 8 volt). DN2 at 9.6 V might expose the gate oxide of MN3 to the break down limit. Thus, MN2 acts as a barrier in that its gate is at 5 V, as is the gate of MN1. By returning the RAMP voltage to 1.2 volt before resetting the word line, the protection of the devices is maintained. The voltage of a stored one with this conditions would be approximately 6.4 V, provided the amplifier supply voltage is also at 6.4 V. The maximum stress on gate oxides in the cell is 6.4 volt plus Dvc.

Figure 13C:
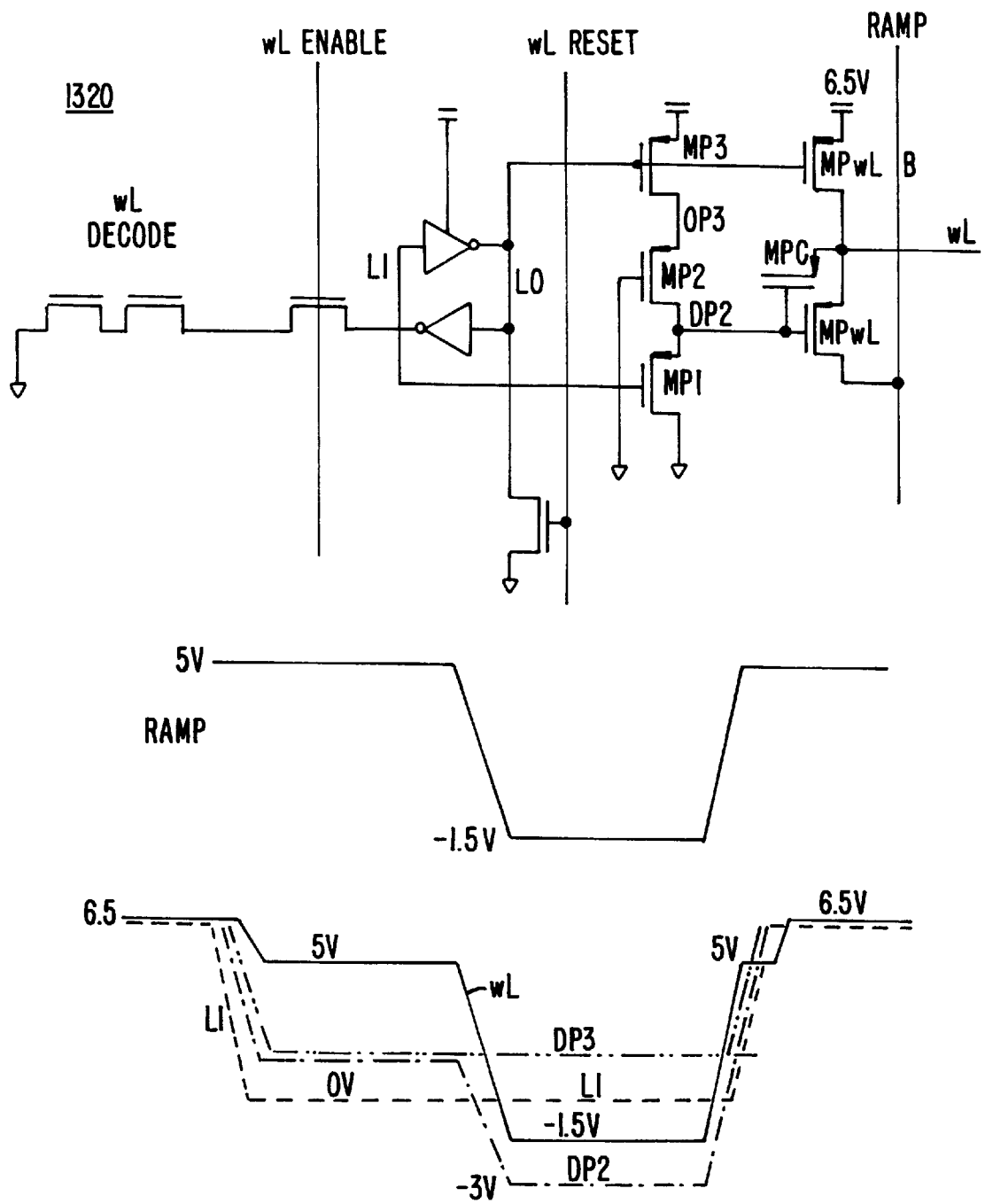

When controlling logic, the high voltage on the cell is of most concern, even when an stored zero at a level of about 1 V may be acceptable. Another alternative is, therefore, to implement a decoder using P-channel devices only. FIG. 13C shows decoder 1320 that is the equivalent of FIG. 13B, but with the polarities reversed. The common node for the sense transistors and cell capacitors in the cells are connected to the 6.5 V supply indicated in the figure. The low RAMP level is −1.5 V in relation to 6.5 V or the 5 V Vdd supply. To approach the Vss level in the controlled circuits, it is desirable for the RAMP to go to −1.5 V, thus overcoming the high threshold voltage due to the body effect of the P-channel write transistor in the cell. The negative swing on the RAMP signal could be limited to 0.5 volt below Vss. The refreshed high voltage on the controlling capacitor will be at 6.5 V, but in the read phase of the refresh operation the voltage will drop slightly. For cells with large capacitors that are used for controlling pass transistors, this voltage drop is very limited due to the long time constant in the combination of the write transistor and the cell capacitor. In other words, the write bit line will reach the 6.5 V level before the cell capacitor has been disturbed more than a small fraction of 1 V. The refresh phase with the RAMP and word line at its negative extreme is made long enough to fully refresh both a high and a low cell level. The original storing of control data may require extra long write times or multiple write cycles for very large storage capacitors. All cells can also be precharged to an intermediate level by turning on all word lines, with the bit lines clamped to the intermediate level. The writing will then only need to displace the cell voltage slightly to indicate the stored data. The refresh operations will later gradually charge the capacitors to their full values.

Switched Power Amplifier

Figure 13D:
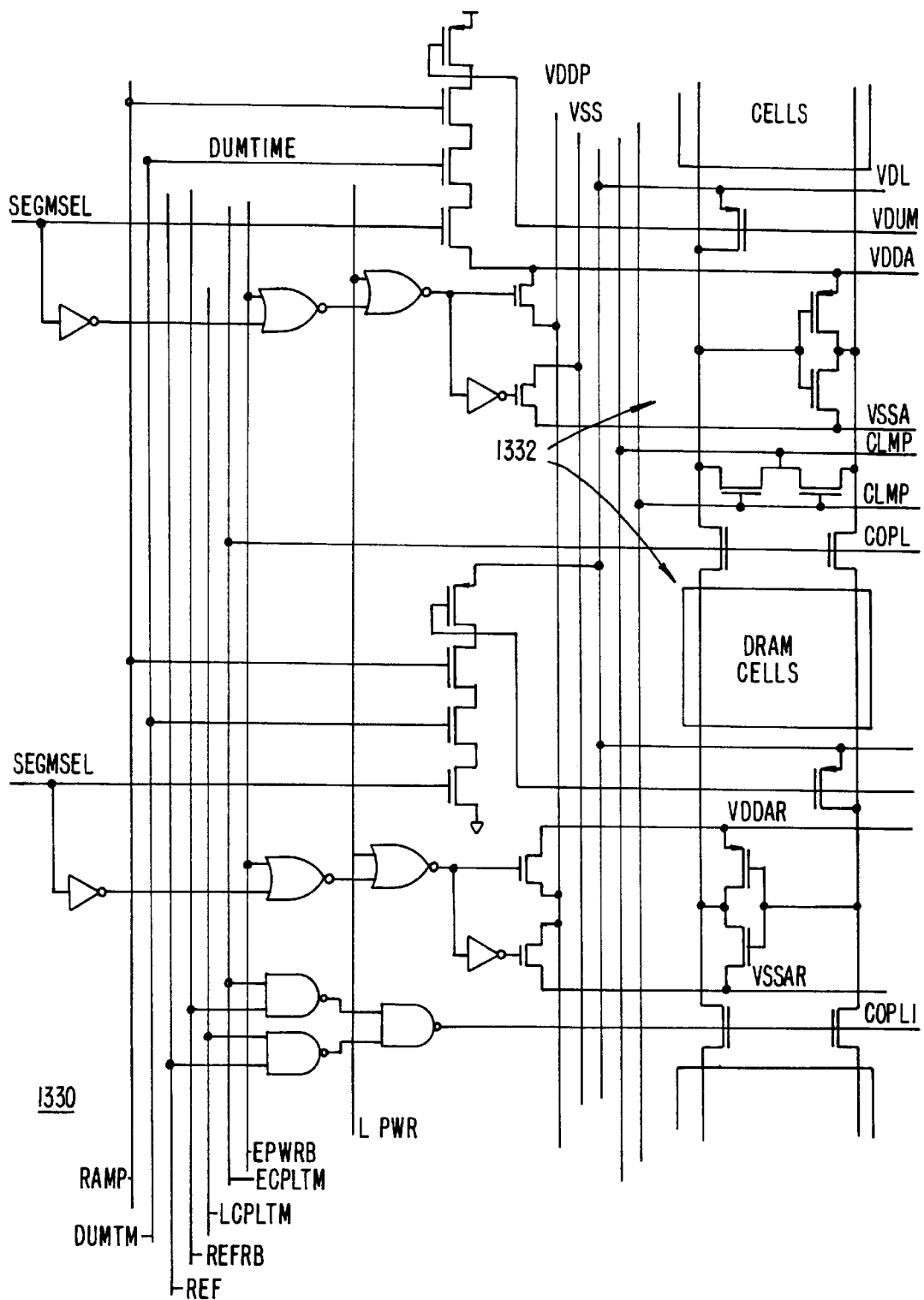
Figure 13E:
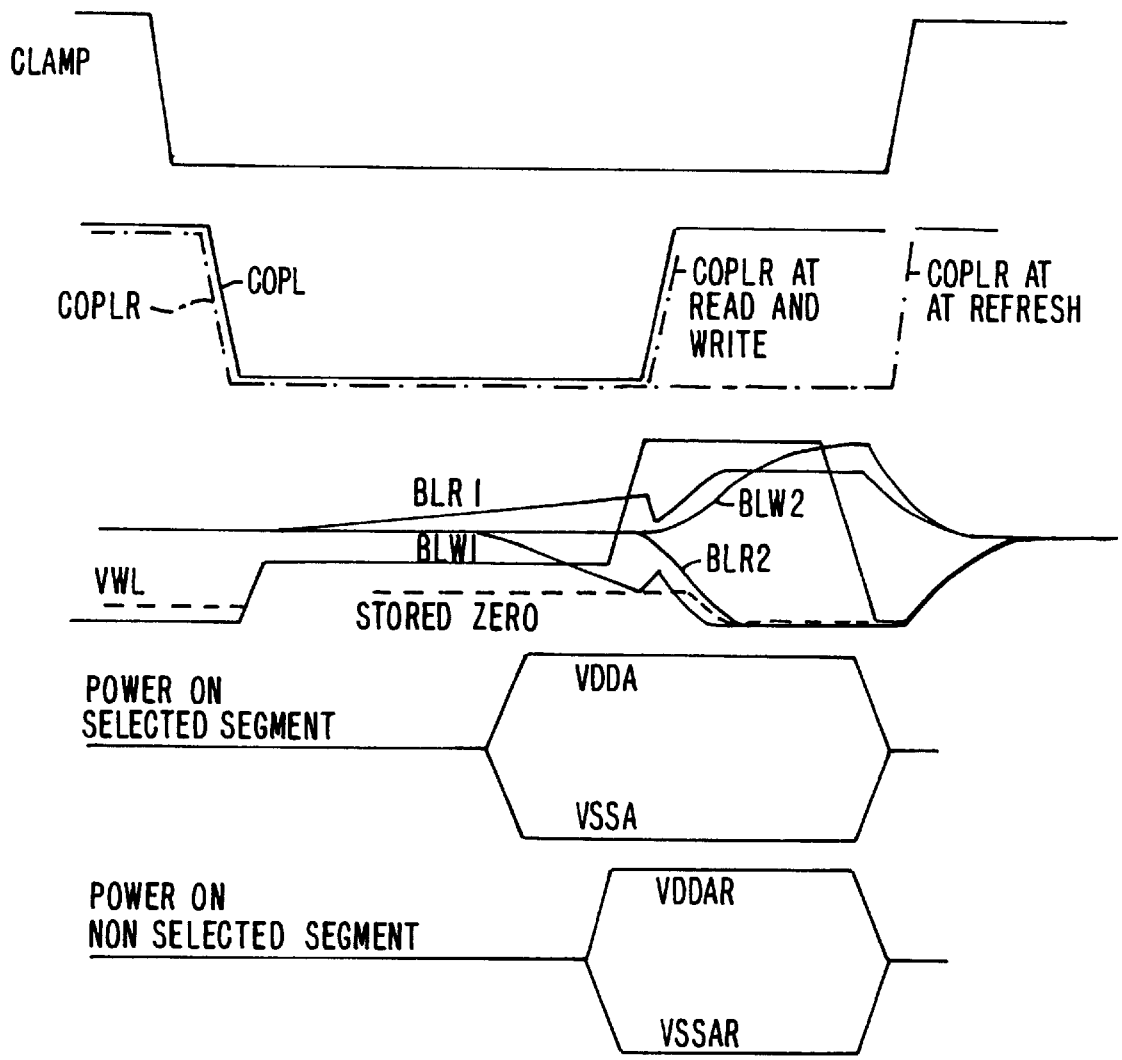

In order to further reduce the power consumption in the control memory, it is desirable to let the cell current or the dummy current displace the read bit line as much as possible before the amplifier is powered up. FIG. 13D shows a memory 1330 where each pair of segments 1332 contains only one common clamp circuit. The associated timing diagrams are shown in FIG. 13E. Clamping to an intermediate clamp level is done without power to the amplifier and further timed so that at least the two segments in each pair are coupled together during the clamping. All four bit lines will therefore be floating close to the clamp level at the beginning of the memory cycle. Applying the low ramp level to the word line starts the displacement of the read bit line in the selected segment. When the selected bit line has been displaced sufficiently for good operating margins, the power is applied to the selected segment. This is controlled by an early timing signal, EPERB, which is negative true. When the inverting amplifier in the selected segment has displaced its write bit line a certain amount, power is applied to the non selected segment in the pair (controlled by LPWR) and the two segments 1332 in the pair are coupled together to form a full amplifier. After increasing the ramp voltage and holding it at its high level for a time, the cell is refreshed and the cycle is terminated by turning off power, clamping, and coupling all segments together. In the read and write modes, indicated as REFRB, all segments are coupled together at the early coupling time (ECPLTM). As described in connection with a regular memory, a very large signal is applied to the bottom segment of a selected column which dominates over the signal detected at the selected segment.

Mixed Cell Types on Common Bit Lines

Typically large cell capacitors are required to control the gate level on pass transistors. At the same time, the bit line capacitances can be kept low by utilizing the segmented bit line approach. The ratio of the cell capacitance and the bit line capacitance will in such cases be high enough to impose a large bit line displacement at reading a conventional DRAM cell. In other circuits controlled by the control memory, such as look up tables, the cell capacitor can be very small and the preferred cell is of the new DRAM type. It is possible to have both types of cells on common bit line pairs, as indicated in memory 1340 shown in FIG. 13F. Here, an approach with non-dedicated bit lines has been used, which means that a given bit line can be used as a read bit line or a write bit line depending on if the address is odd or even. In this type of arrangement, the bit line capacitances remain equal. The dummy current is applied to the bit line that is active for reading a new type of cell and is applied to the bit line to which the selected conventional DRAM cell is connected.

Figure 13F:
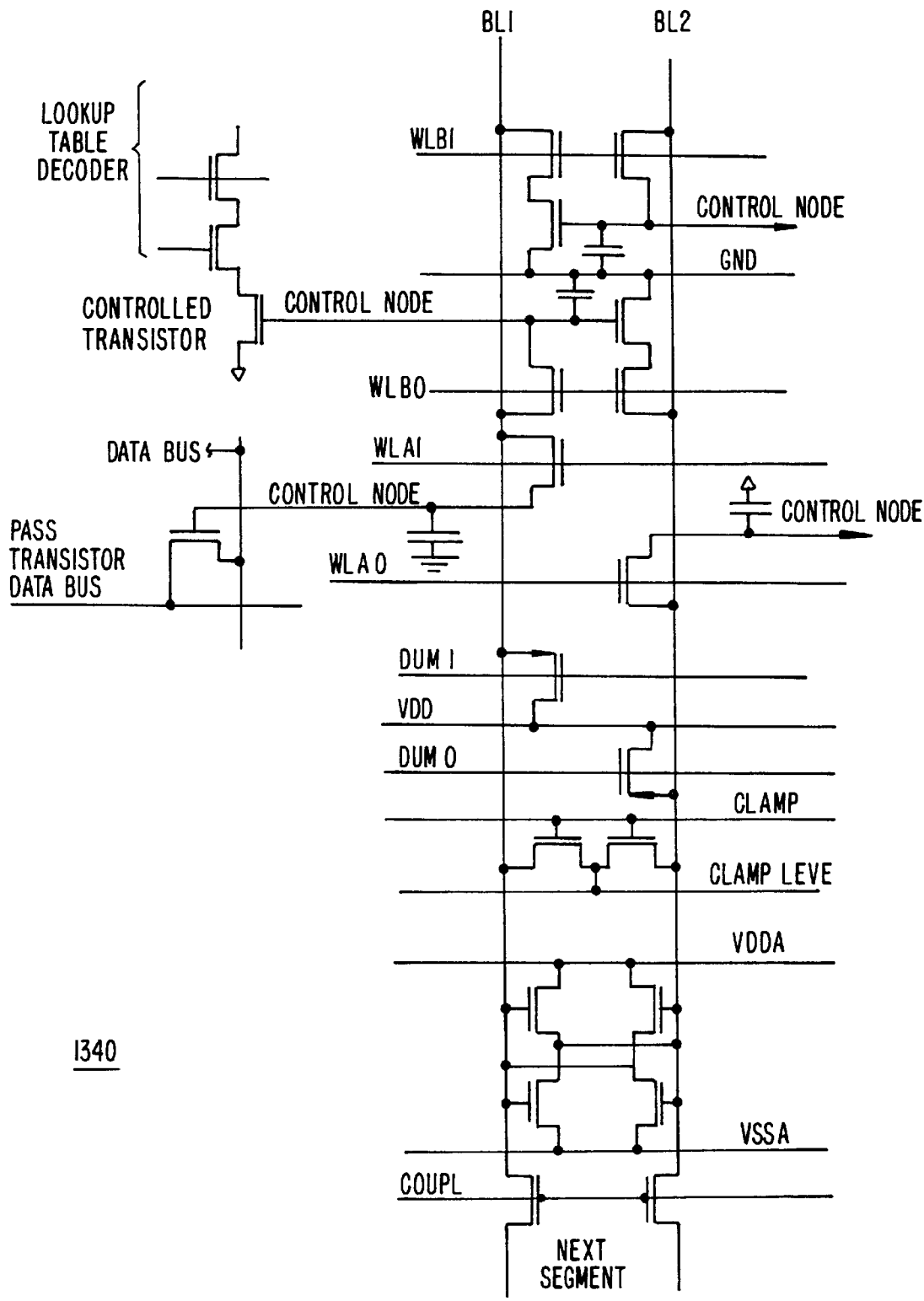

The dummy charge at reading a conventional DRAM cell is the product of the dummy current and the dummy current on-time, which operates with the same margin as for the new DRAM cell of the present invention. The bit lines are clamped to an intermediate level (e.g., 3.5 V) at the start of the cycle, which is higher than the first RAMP level of 1.2 V. A fully charged conventional cell capacitor (e.g., 5.6 V) will also be well above the word line voltage of 1.2 volt. The cell transistor is off and the dummy current increases the bit line voltage at the same rate as at reading a new type of cell. If, on the other hand, the cell capacitor is discharged to a low level (e.g., 0 V), charge is drawn from the bit line, reducing the bit line voltage more than the dummy current is able to compensate before the amplifier dominates the displacement of the bit lines. With a normal RAMP signal, the word line voltage is increased later in the cycle bringing the cell capacitor to its refreshed level, also for a stored one. In the word line, addressing is sequential without regard to what type of cell is used. In FIG. 13F, WLA0 and WLA1 indicate even and odd word lines addressing conventional cells, and WLB0 and WLB1 indicate even and odd word lines addressing the new type of cells. The dummy voltages DUM0 and DUM1 are active negative and turn on the dummy current on BL2 and BL1 respectively. Note that to write a one (high voltage on the capacitor) on an even cell of the new type, BL1 must be forced high by the write circuit, while on the other hand BL2 must be forced high to write a one on an even cell of in a conventional DRAM. The programmer must therefore take this into account when preparing the control data. Only if cells of the same type are used for a given range of addresses an alternative approach can be taken. In that case, using the figure as a basis for the discussion, even addresses would apply to conventional cells placed on BL1 and DUM1 would be activated for all even addresses calling this type of cells. This would however place unnecessary restrictions on the cell distribution.

Figure 13G:
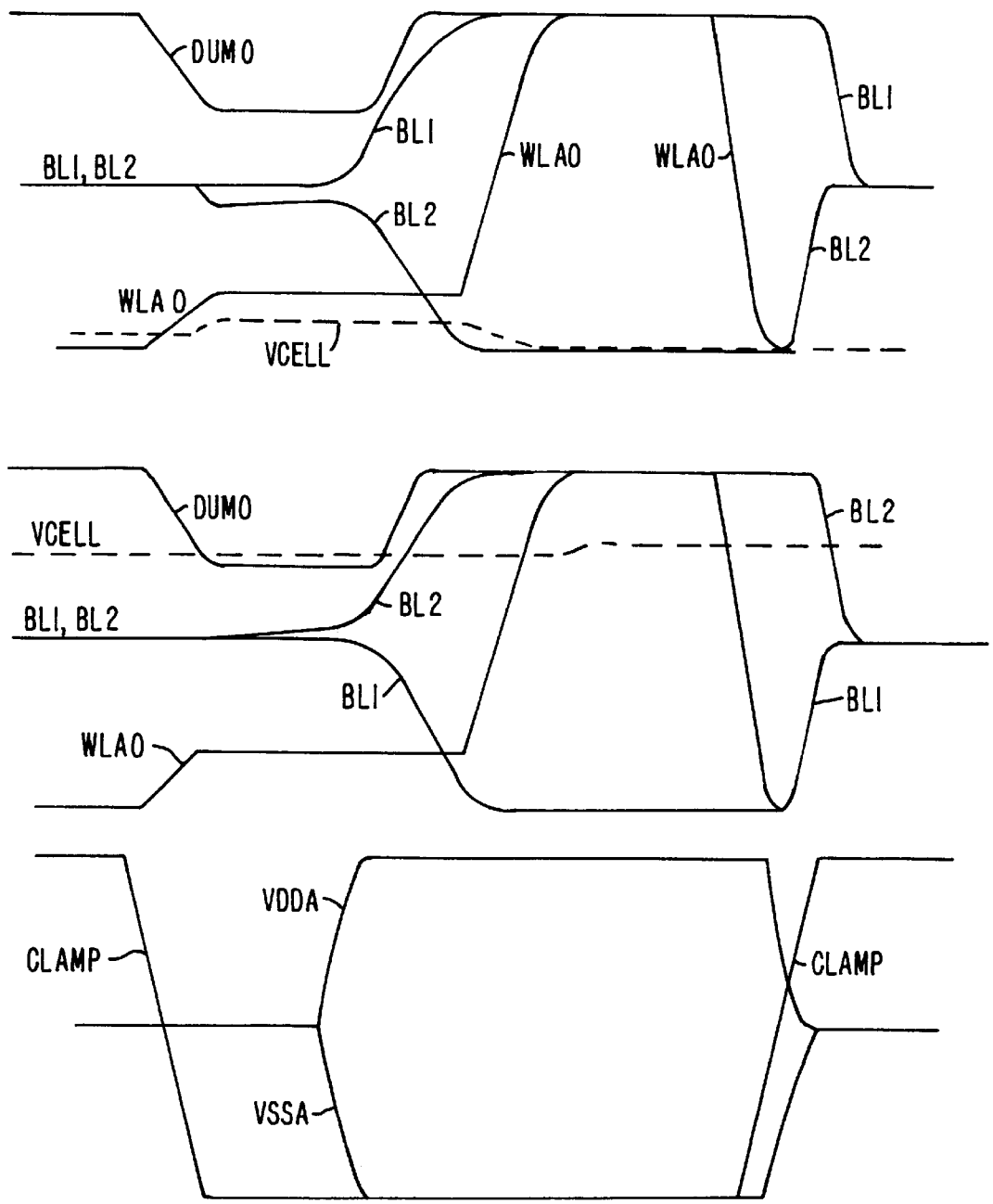

The timing for refreshing a stored zero and a stored one in a conventional cell is shown in FIG. 13G. Note for the stored zero that the exchange of charge continues only until the cell capacitor has been charged to one threshold voltage below WLA0. This also points out the need for frequent refreshing as a cell charged by leakage current to close to one threshold below the initial word line voltage will cause a read error. In reality, the large cell capacitors used in this configuration at the refresh frequency dictated by the new type of DRAM cells will be charged very little between cycles. The COUPL signal and the disturbance on the early bit line signals have not been shown in this figure as this is of interest only in the initial write mode and in the read mode used for checking that the written data was correctly stored (mainly in production tests).

Disabling Segments Above Selected Segments

Figure 14A:
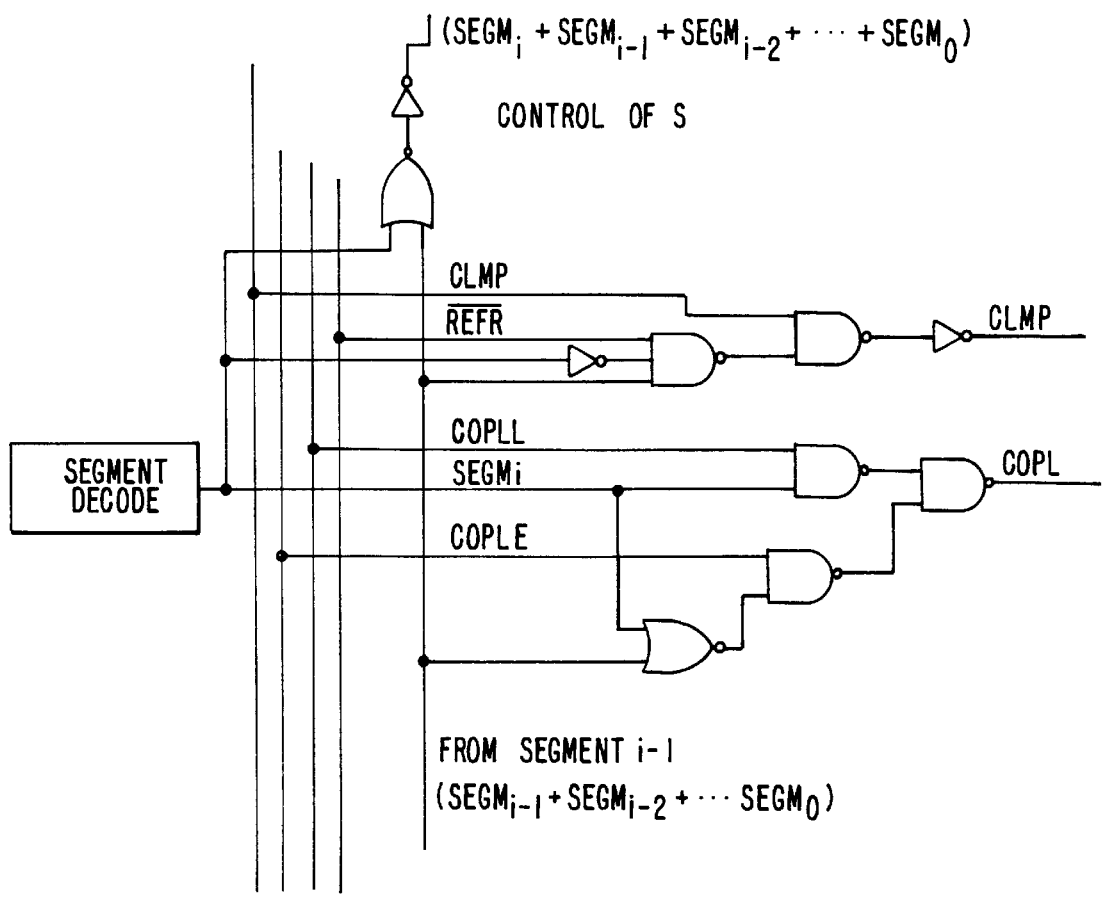
FIGS. 14A–C show the disabling of segments above selected segments.

In both read and write operations, the segments above the selected segment need not be activated. This is done by forwarding the segment select signal to the segment above, as depicted in FIG. 14A. In each segment an OR is formed by the segment select signal and the selected signal from the segment below this or signal is then forwarded to the segment above, where it is treated as the select signal from the segment below.

Figure 14B:
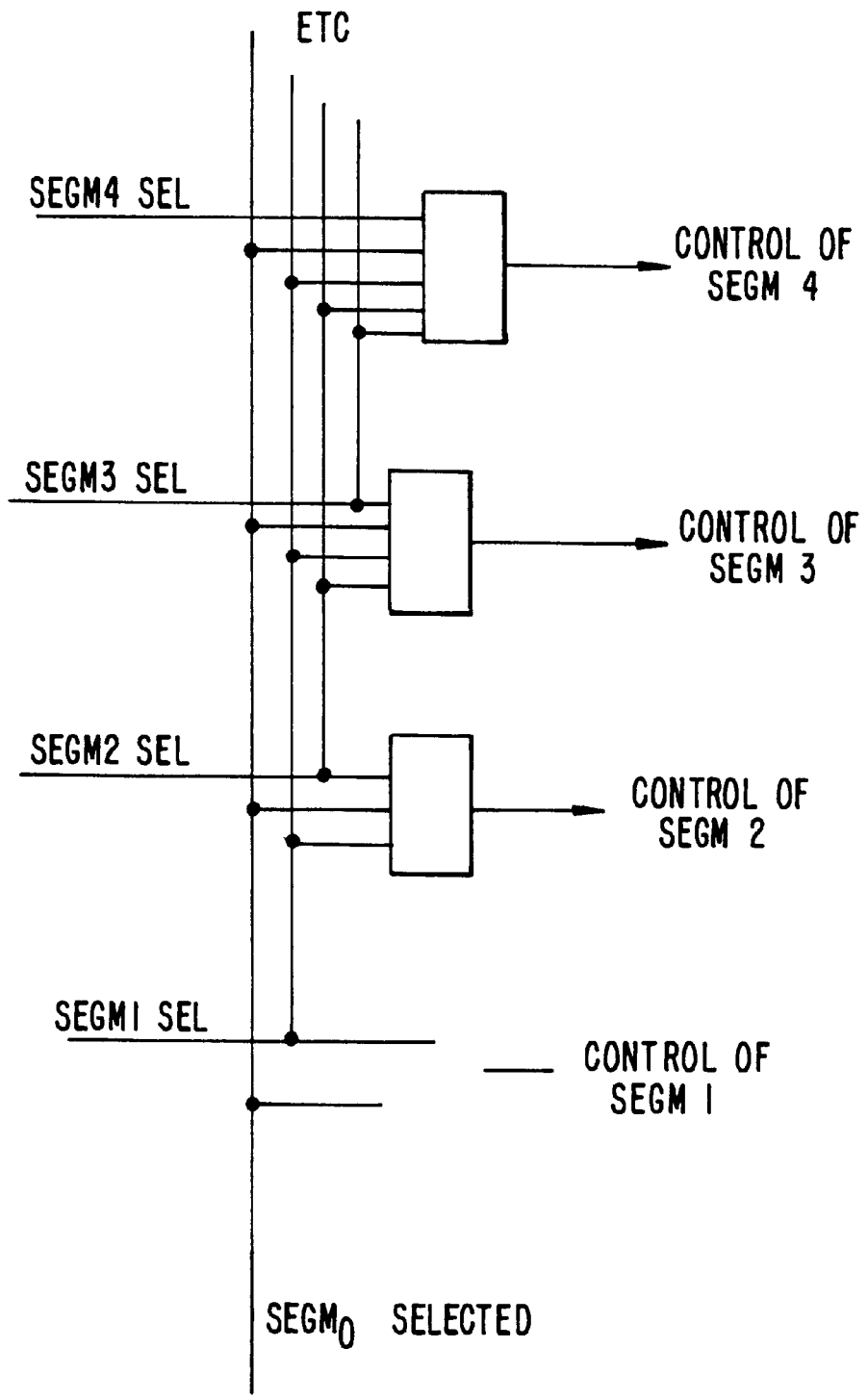

One disadvantage with this approach is the serial delay time to the last segments in the chain. It is desirable to be able to interrupt the clamping signals in all segments before they occur. A parallel approach as indicated in FIG. 14B addresses this concern. In this case each select signal is forwarded to all segments above and each segment has an OR gate as wide as the number of segments that are located below.

Figure 14C:
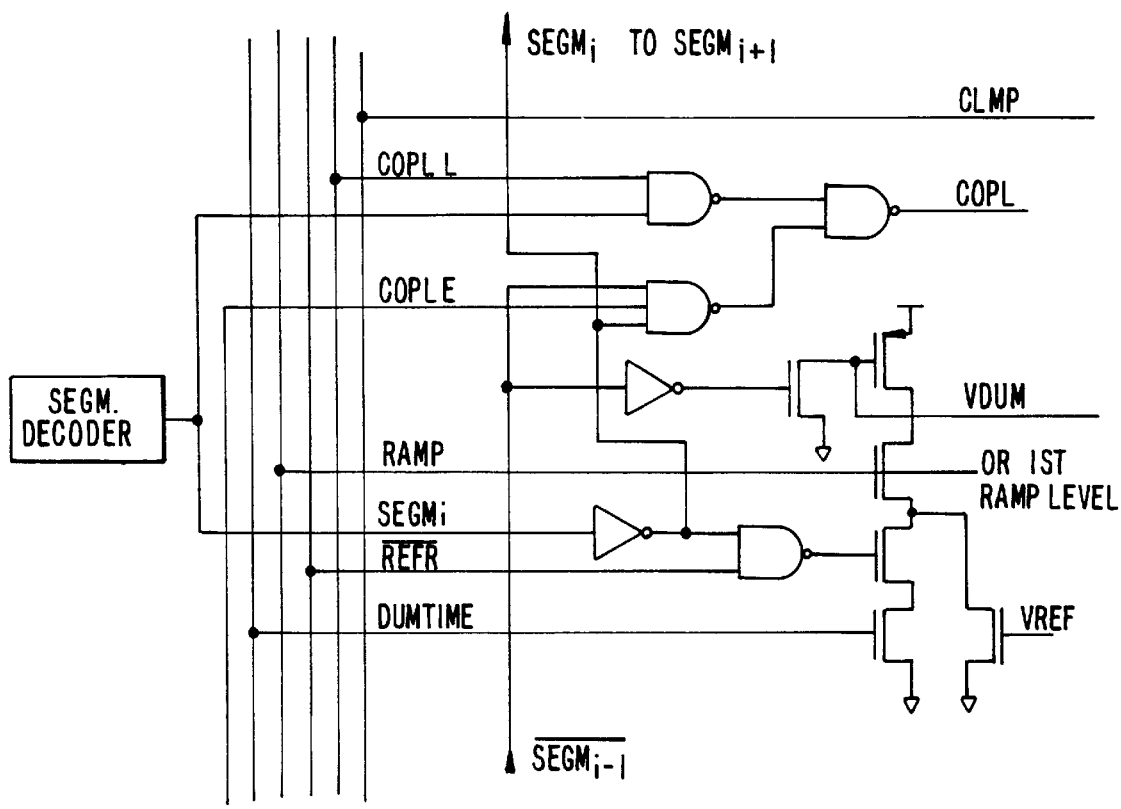
Figure 14C:
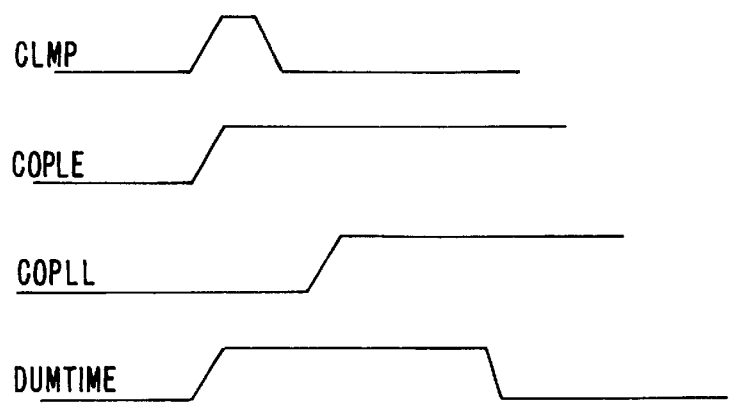

If power consumption is not a concern, only the segment directly above the selected one will need to be disconnected from the segment below as indicated in FIG. 14C. Here the coupling signal is disabled for SELn-1.

DRAM Cells with Separate Read and Write Word Lines and Clamped Amplifier

Figure 15:
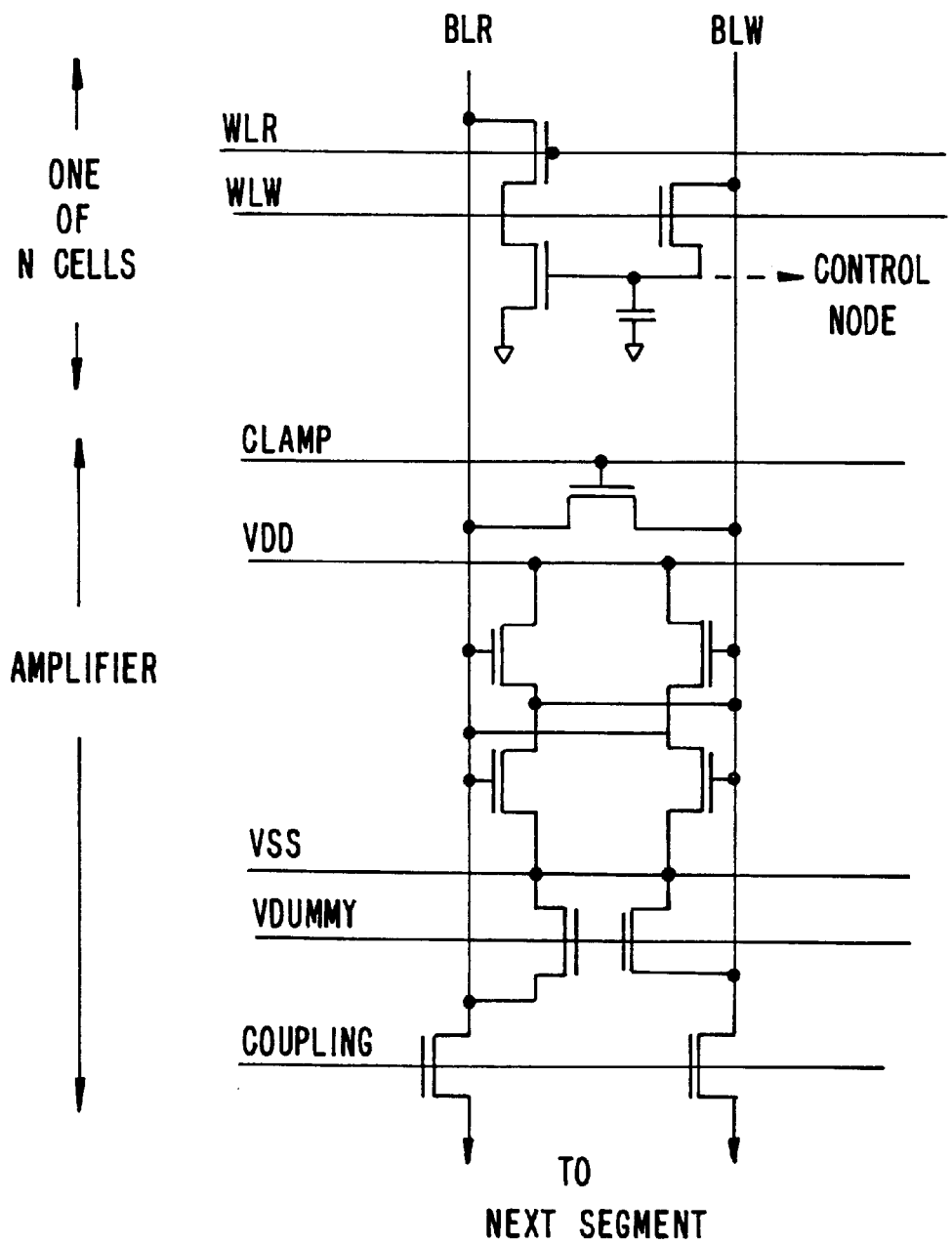
FIG. 15 shows DRAM cells with separate read and write word lines and a clamped amplifier.

The DRAM cell shown in FIG. 15 requires a larger chip area and more complex word line drivers, but offers advantages in two areas. The cell has the same advantages as the simpler cell described above in that the content of the cell is not disturbed during the refresh cycle. The fact that the word line voltage at reading has the full amplitude means that the read time is shorter than when the word line is left at an intermediate level. There is no feedback from the write transistor as the write word line is low during reading. If the refresh frequency is high enough, a stored ZERO will stay very close to Vss and a stored ONE will stay one threshold under WLW. Boosting the voltage of WLW can maintain the cell voltage of a stored ONE close to Vdd. This property makes the cell useful for control of logic, where the control node indicated in the figure connects to the logic to be controlled.

The amplifier can have all the forms as discussed before and can also be used in the segmented configuration. Bit lines need not be dedicated as indicated in the figure, but will in the non-dedicated case require dummy transistors on both bit lines under control of the address logic. The assumption is that the layout is more efficient with every other cell reversed around a vertical axle.

The amplifier in a different mode of operation can act as a latch, which is first reset, indicating a ZERO, and at reading a ONE is set. This requires that the cell with full cell voltage is strong enough to set the amplifier flip-flop. The segmented memory approach can still be taken.

Full Amplifier DRAM Configurations

In situations where fast access is of prime importance, the single inverting amplifier in each segment may be replaced with a full latch amplifier in each segment. This allows for simpler control with fewer control signals. The relative timing is however slightly more critical.

The DRAM with a full amplifier can operate in basically two modes. In Mode 1, shown in FIG. 16A, power is always applied to the amplifier, and the bit lines are clamped to the same potential, which is the switching point of the latch. In the Mode 2, shown in FIGS. 16B and 16C, power to the amplifier is turned off during the clamping and the first portion of the read cycle. In FIG. 16B, the amplifier is OFF in standby mode with the bit lines clamped to a reference clamp level. In FIG. 16C, on the other hand, power is ON in standby leaving one bit line at Vdd and the other at Vss level. The single clamp transistor is turned on at about the same time as power is turned off. If power is turned off before applying the clamp signal the bit lines will reach a voltage of approximately Vdd/2 due to charge sharing. If power is still on, the bit lines will eventually reach the switching point level of the amplifier latch. By designing the amplifier for a switching point level of Vdd/2, the relative timing at this time is not critical. Power is turned on again, when the input signal has been integrated to a safe level, to guarantee that the amplification will go in the right direction.

Figure 16A:
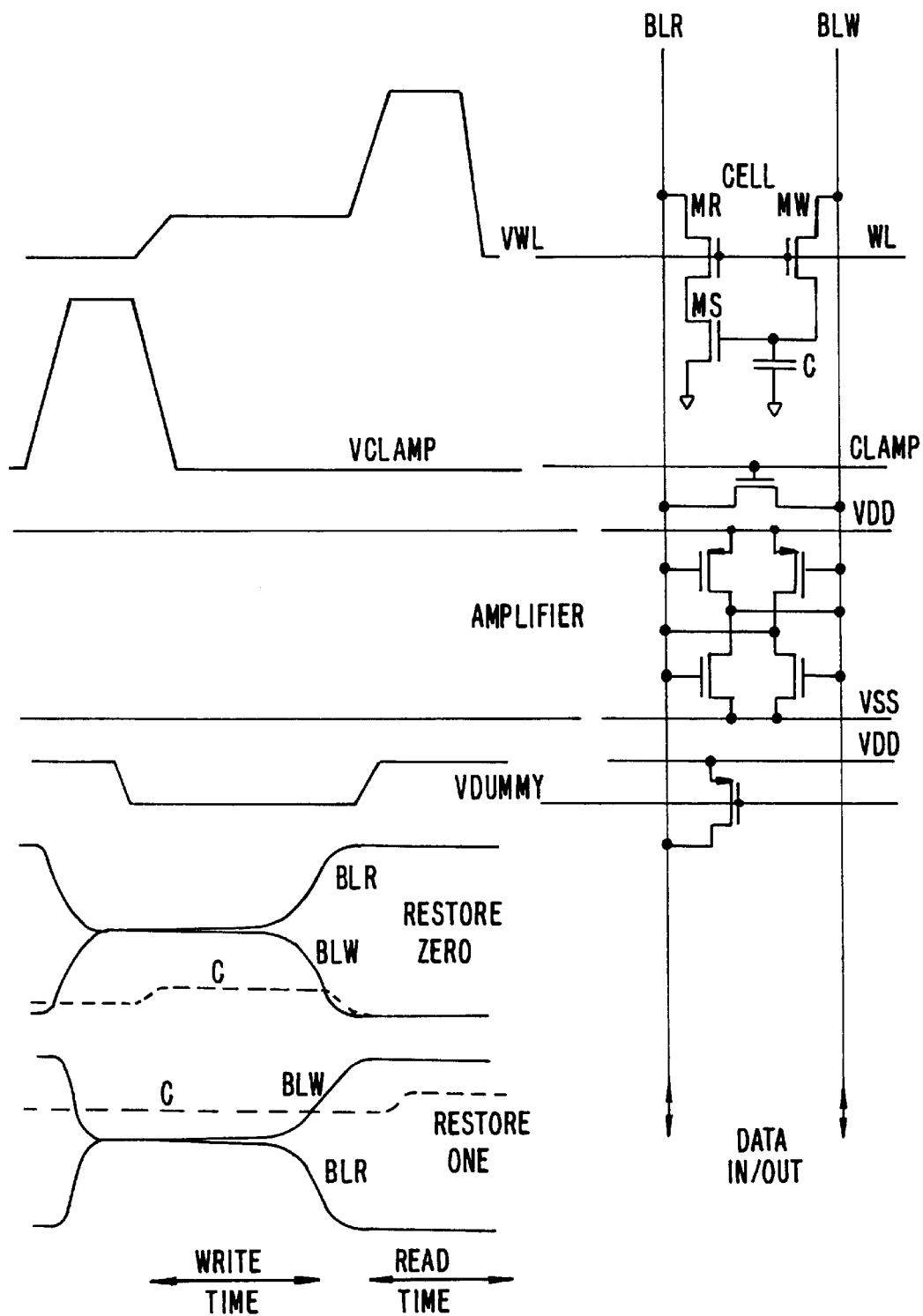
FIGS. 16A–D show memory cells according to the present invention with a full latch amplifier in each segment.
Figure 16B:
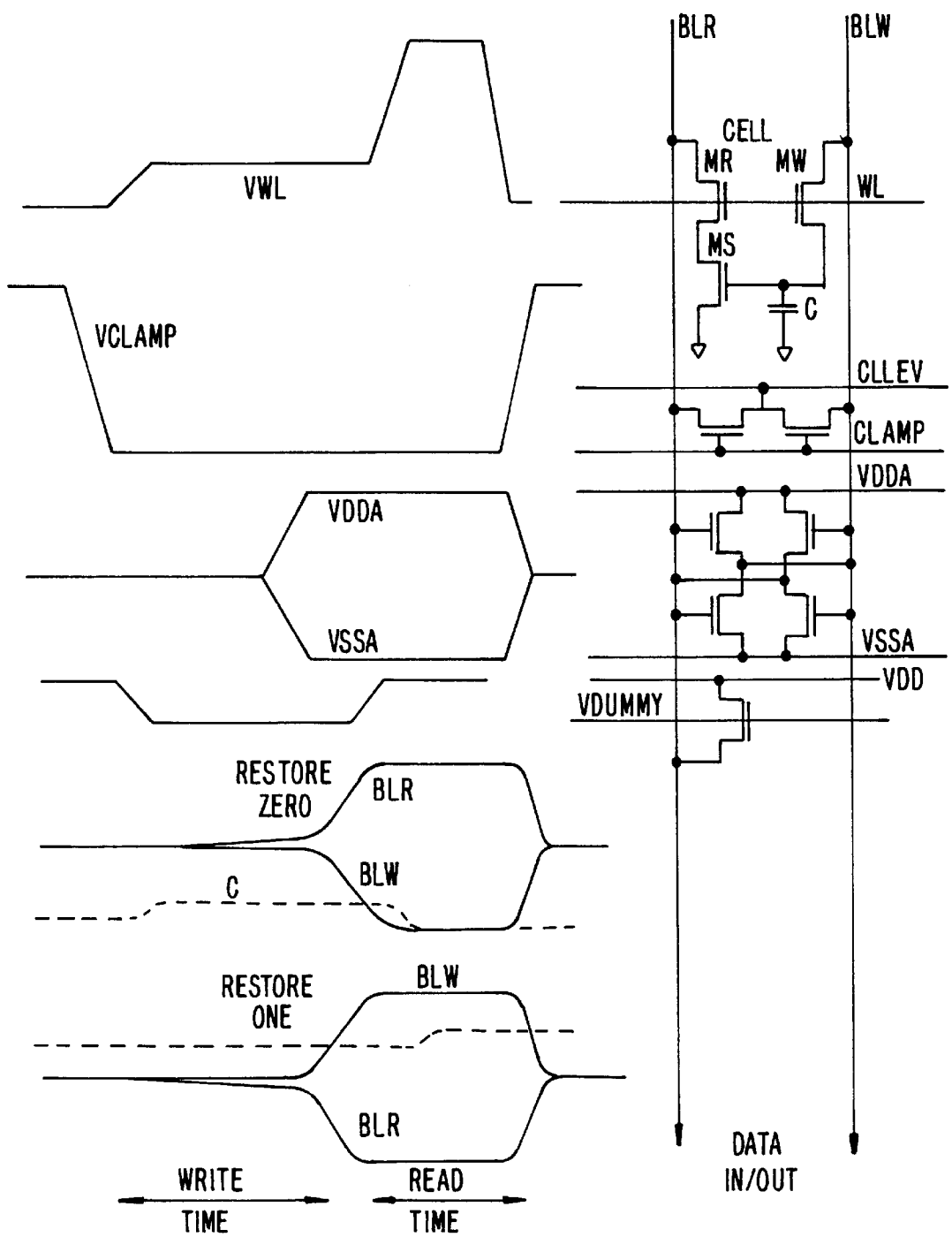
Figure 16C:
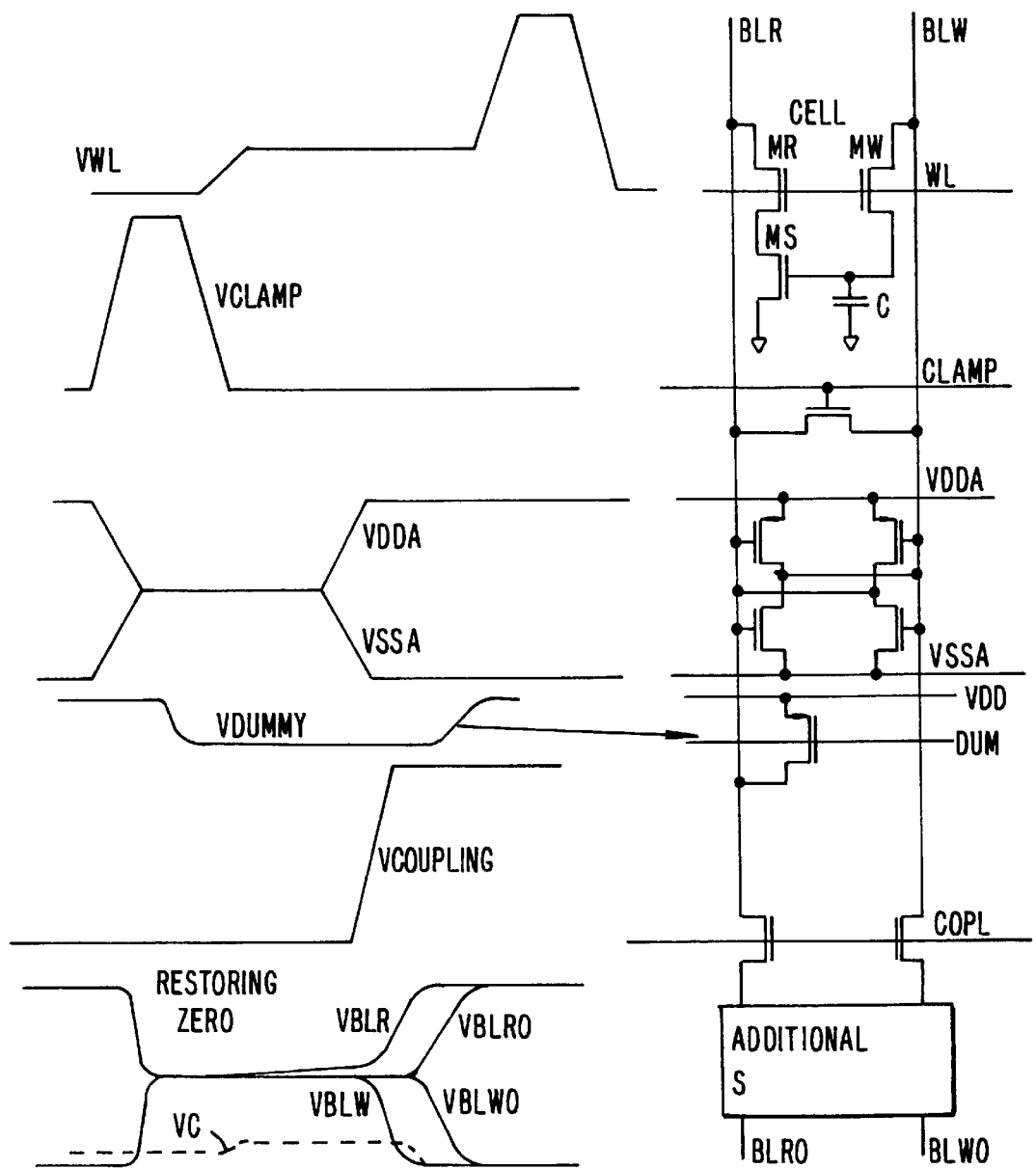
Figure 16D:
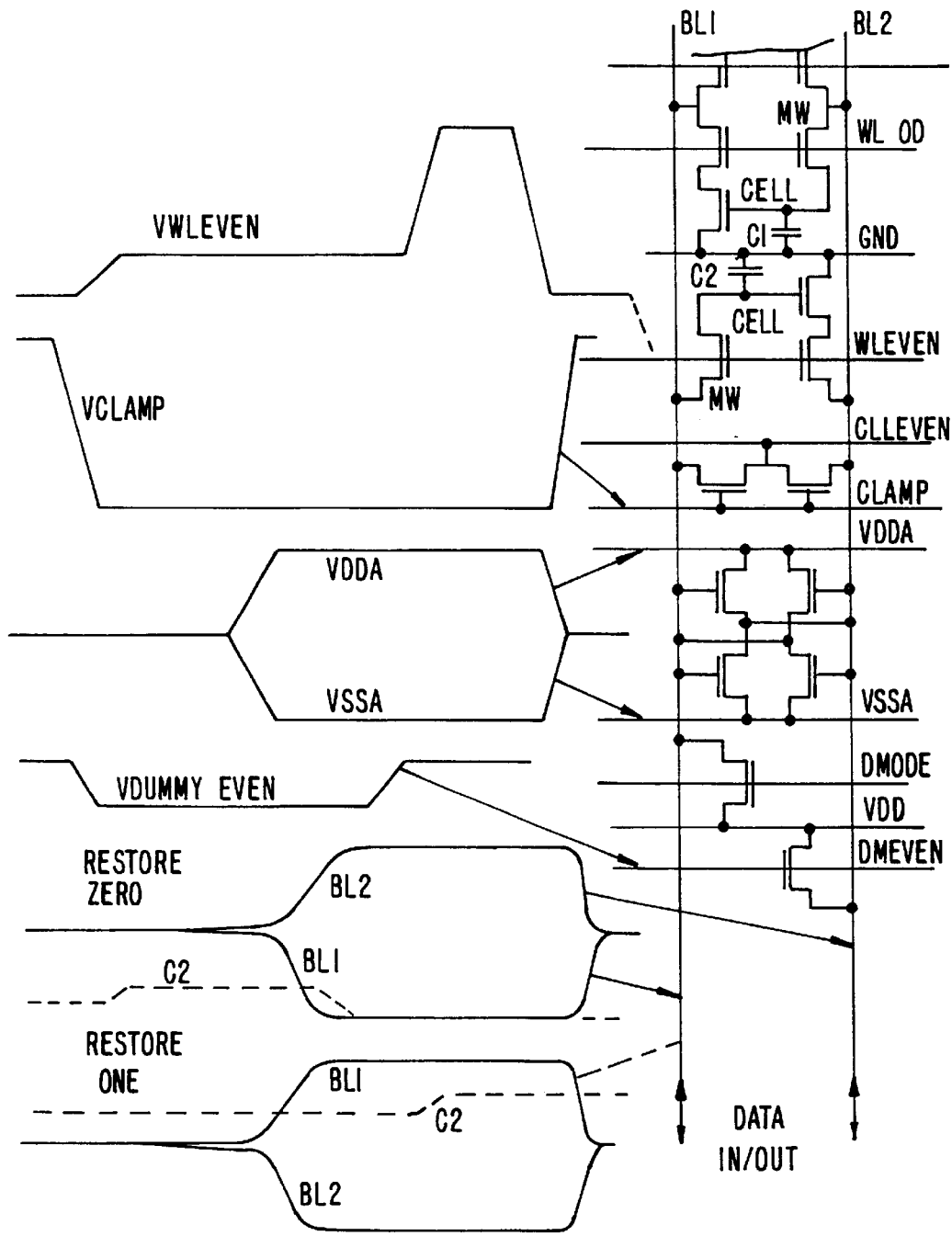

The bit lines as shown in FIGS. 16A–C are dedicated to reading and writing, which means that all cells in a segment are oriented the same way, with the write transistors connected to the write bit line (BLW) and all read transistor connected to the read bit line (BLR). To allow more options for cell layout, it may be advantageous to have non-dedicated bit lines as illustrated in FIG. 16D. There is a minor added cost in each amplifier in having two dummy transistor and controls to select the one corresponding to the address of the selected cell.

FIGS. 17A–M show the result of simulations using a 0.5 u NMOS process. The memory module consists of 8 segments per column, with 64 bits/segment, and 128 columns (65,536 bits).

Figure 17A:
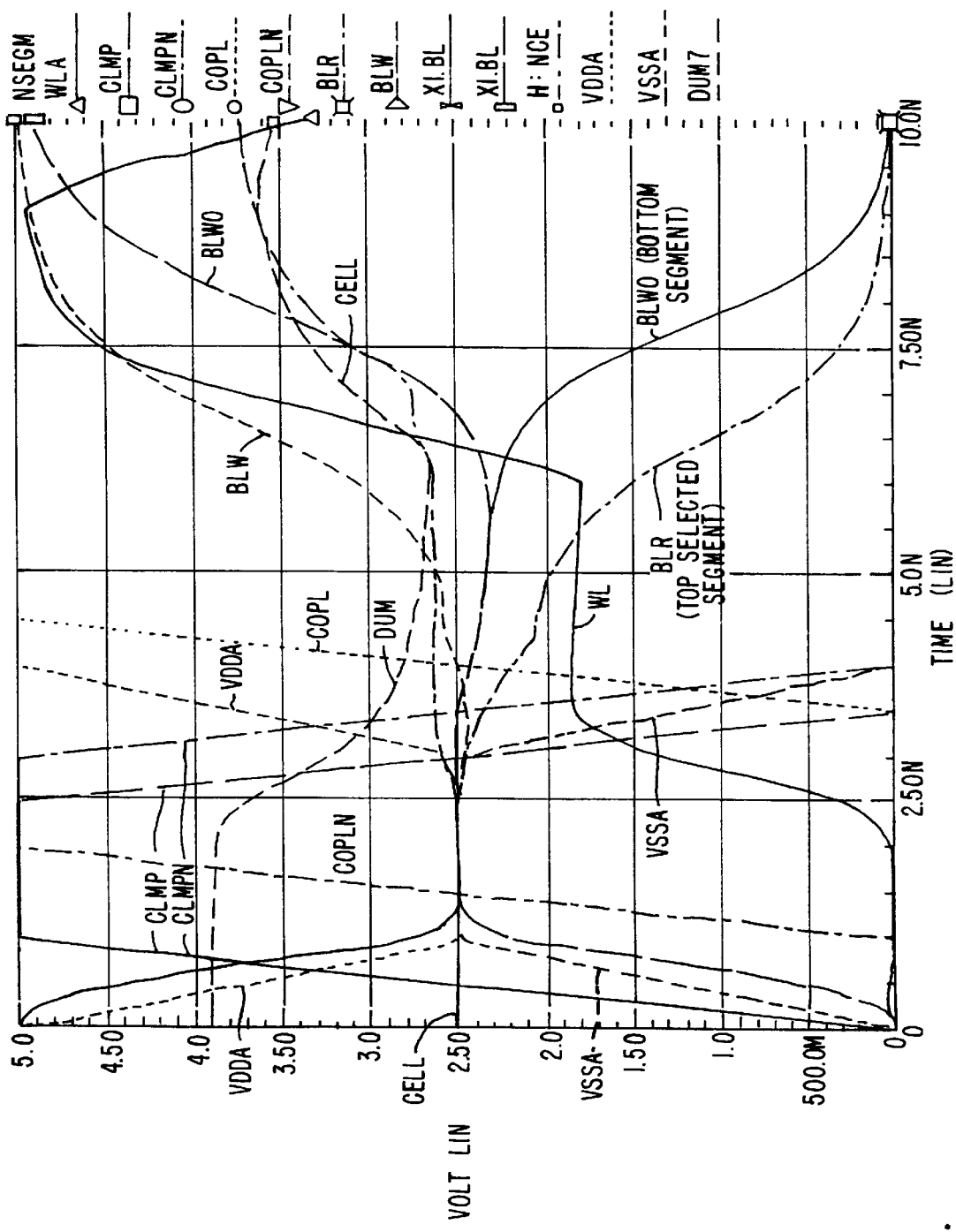
FIGS. 17A–M show the result of simulations using a 0.5 u NMOS process.

FIG. 17A illustrates reading a ONE in a cell located in the top segment, with the read data propagating from BLR and BLW in the top segment to BLR0 and BLW0 in the bottom segment. The data on BLR0 and BLW0 is forwarded to the I/O decoder at about 8 ns (not shown). Power in this case is initially turned off at the same time as clamping takes place (compare to FIG. 16C) and is turned on again when reading starts by bringing the word line (WL) to the first ramp level (1.8 V). The signal in the selected segment (the top segment in this case for worst case test) is amplified slightly before the COPL signal connects the selected segment to the rest of the segments that were interconnected earlier by the signal COPLN. In this simulation the non-selected segments were clamped a little longer by the signal COPLN, which is 0.5 ns longer than COPL, the signal clamping the selected segment. The stored energy in the bit lines of the selected segment is now transferred to the lower segments at the same time as each of the segments contributing to the amplification of the transmitted signal. At about 6 ns, the delayed signal has reached the bit lines BLR0 and BLW0 of the bottom segment and is reaching half of full amplitude at a delay of less than 7.5 ns. All bit lines are very close to the supply rails at the nominal end of the cycle (10 ns). The voltage difference between BLW0 and BLR0 at 8 ns is more than 2.5 V, which is sufficient to supply an output signal via decoder and output amplifier within 2 ns. The initial cell voltage was assumed to have degenerated due to leakage after the last refresh cycle to 2.5 V, but is refreshed in the shown read cycle to 3.5 V. The cell capacitance in the simulation is 2e-15 Farad plus the gate capacitance of the sense transistor (MS in FIGS. 1–3). There is a small coupling from the word line, which can be noticed in the figure, so the final cell voltage when WL reaches Vdd is slightly below 3.5 V. The maximum voltage is determined by the max value of WL less the threshold voltage. The short channel process has a strong body effect on the threshold. The cell current in the read phase increases very slowly with the cell voltage, when above 2.5 V, so boosting the WL voltage above Vdd would have a small effect on speed, but would of course allow for more leakage in the cell capacitor.

Figure 17B:
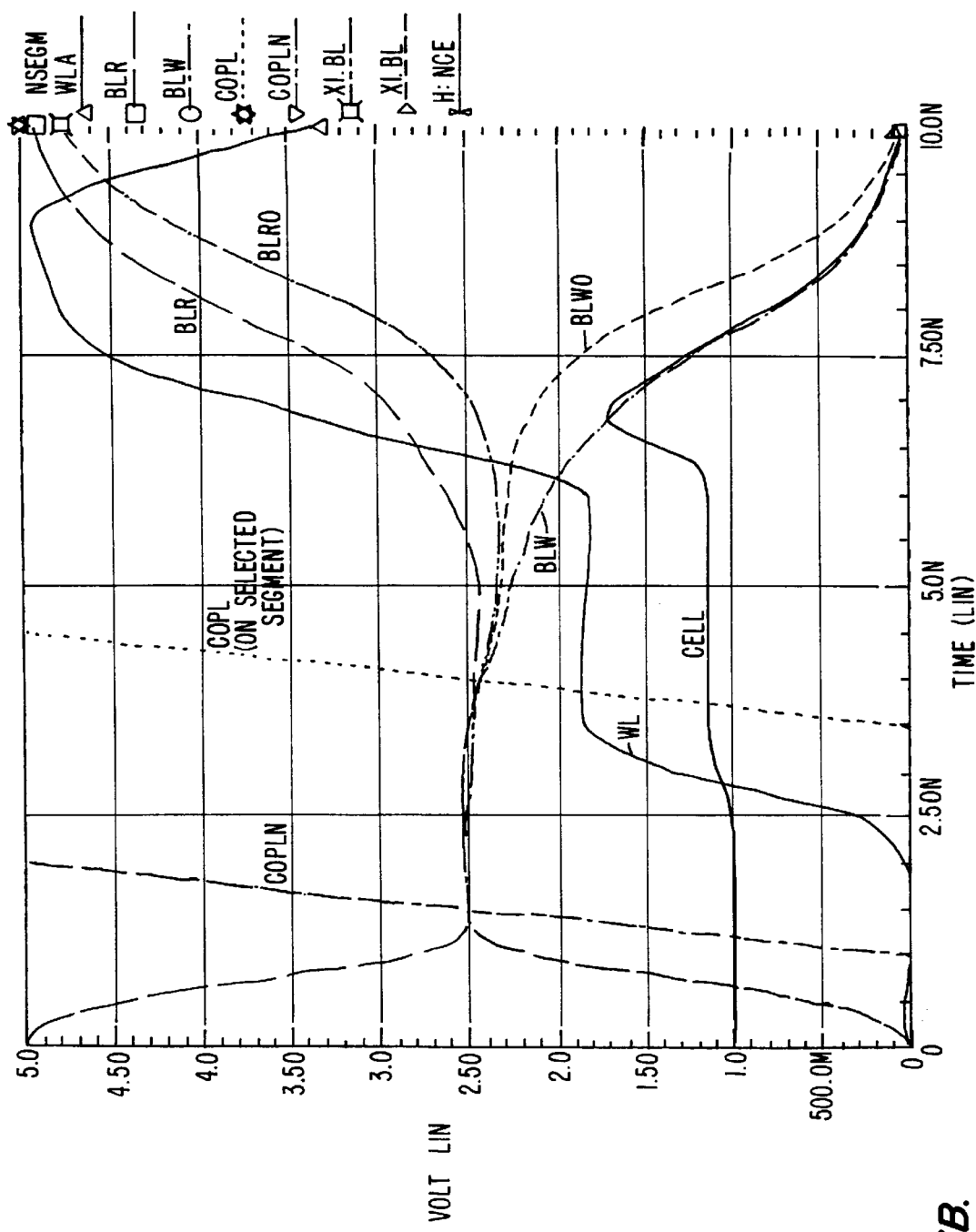

FIG. 17B shows the reading of a stored ZERO degenerated due to leakage from 0 V to 1 V. Only a limited number of control signals are shown in this figure. It is a clear indication in this figure that the switching point of the amplifier is below the clamp level defined by the charge sharing between the bit lines. This causes the bit lines to drift in the negative direction, before the positive current from the dummy transistor less the low cell current causes the read bit line (BLR) to go positive. In the full amplifier this drift is acceptable as long as the device parameters in the amplifier are consistent.

Figure 17C:
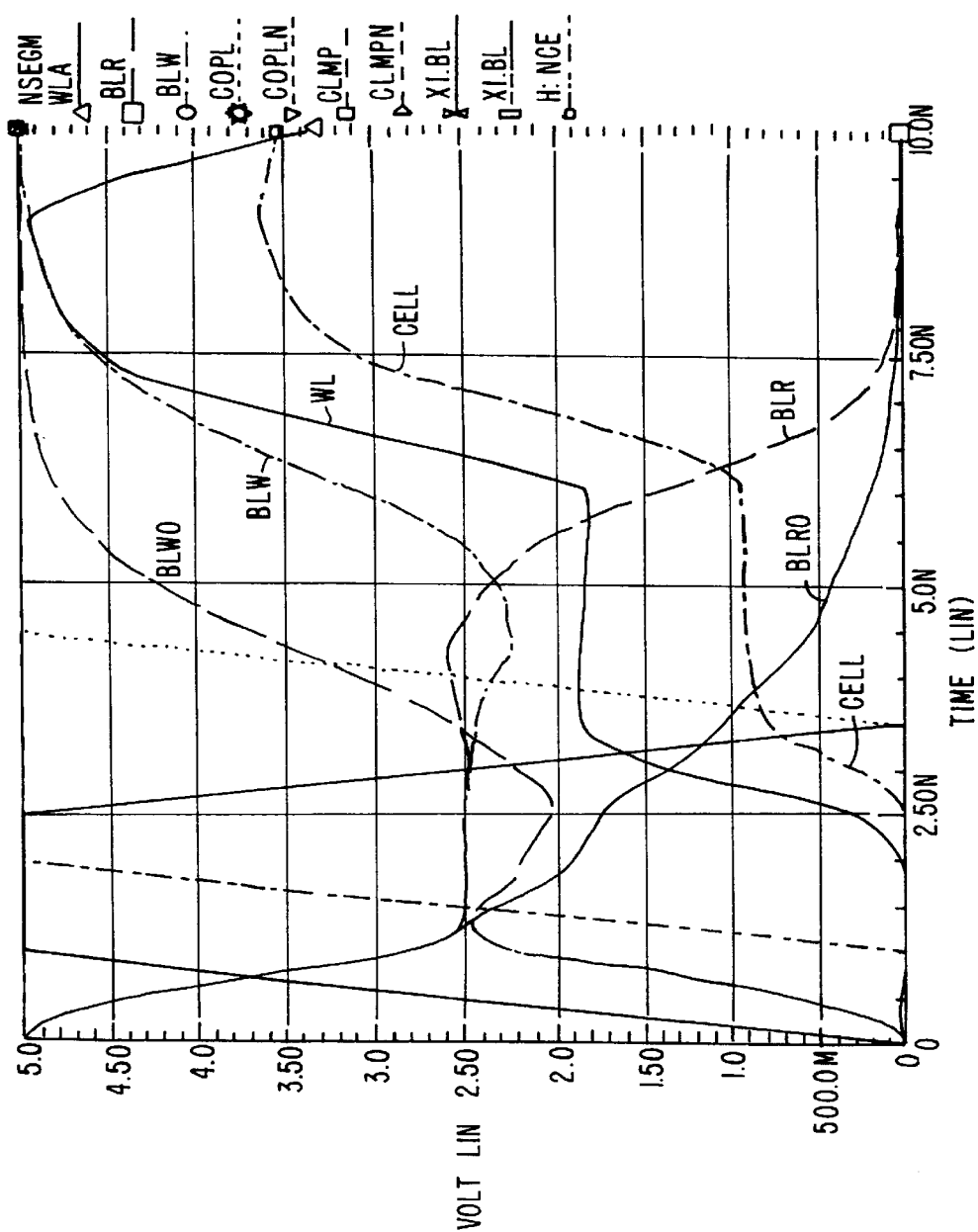
Figure 17D:
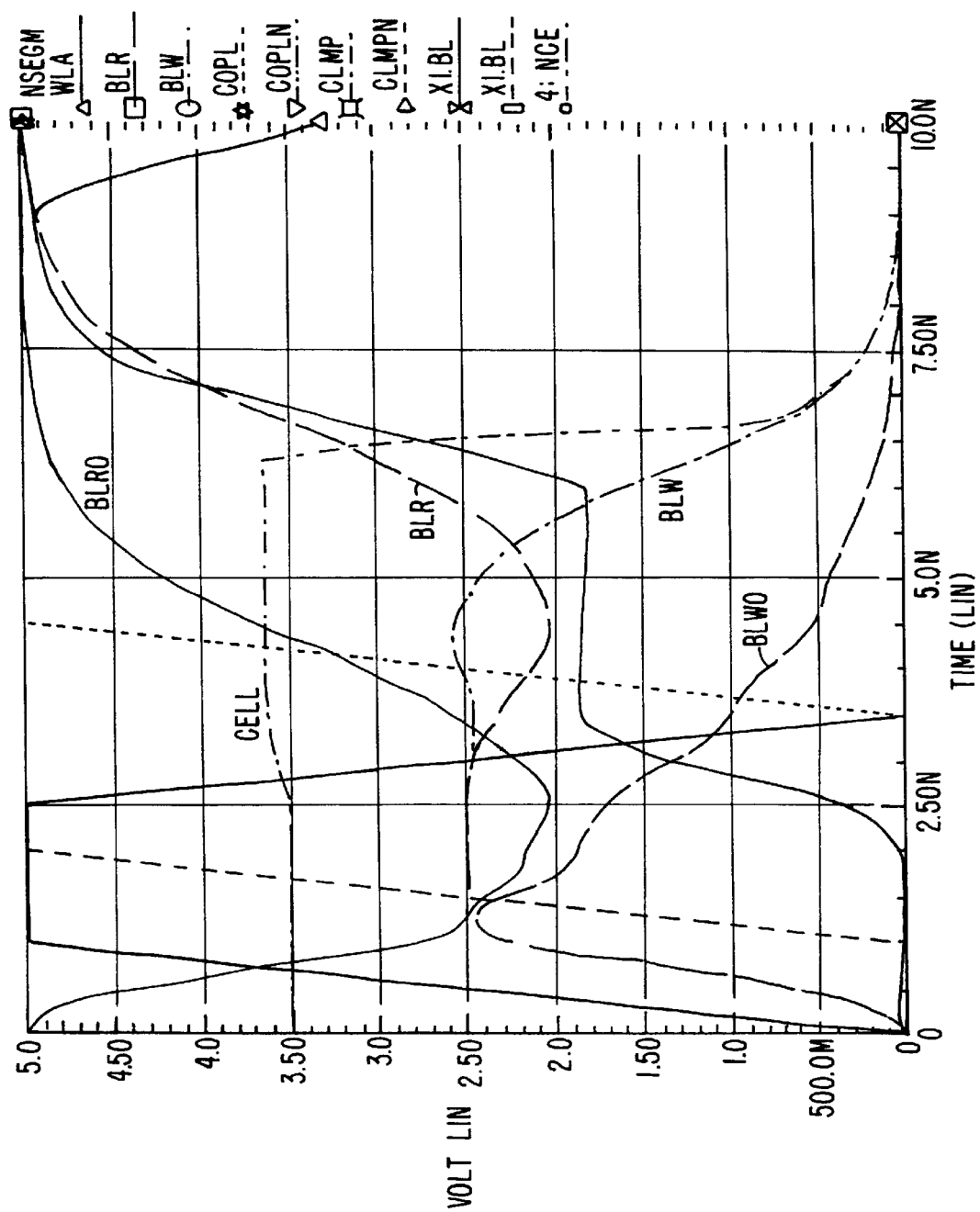

In the write operation (FIG. 17C) the data to be written is applied via the column decoder to BLW0 and/or BLR0 on the bottom segment. This signal is large enough to be amplified and propagate to the selected segment, which has started a normal read sequence, and override this signal. FIG. 17C shows how a stored ZERO is written over by a ONE. BLR0 and BLW0 are separated by the input signal already during the clamping operation. With all non-selected segments interconnected, the signal is quickly propagated to the selected segment, causing the direction of BLR and BLW to reverse, so that BLW will drive the cell voltage to 3.5 V when WL goes high. FIG. 17D illustrates how a stored ONE is written over by a ZERO.

Figure 17E:
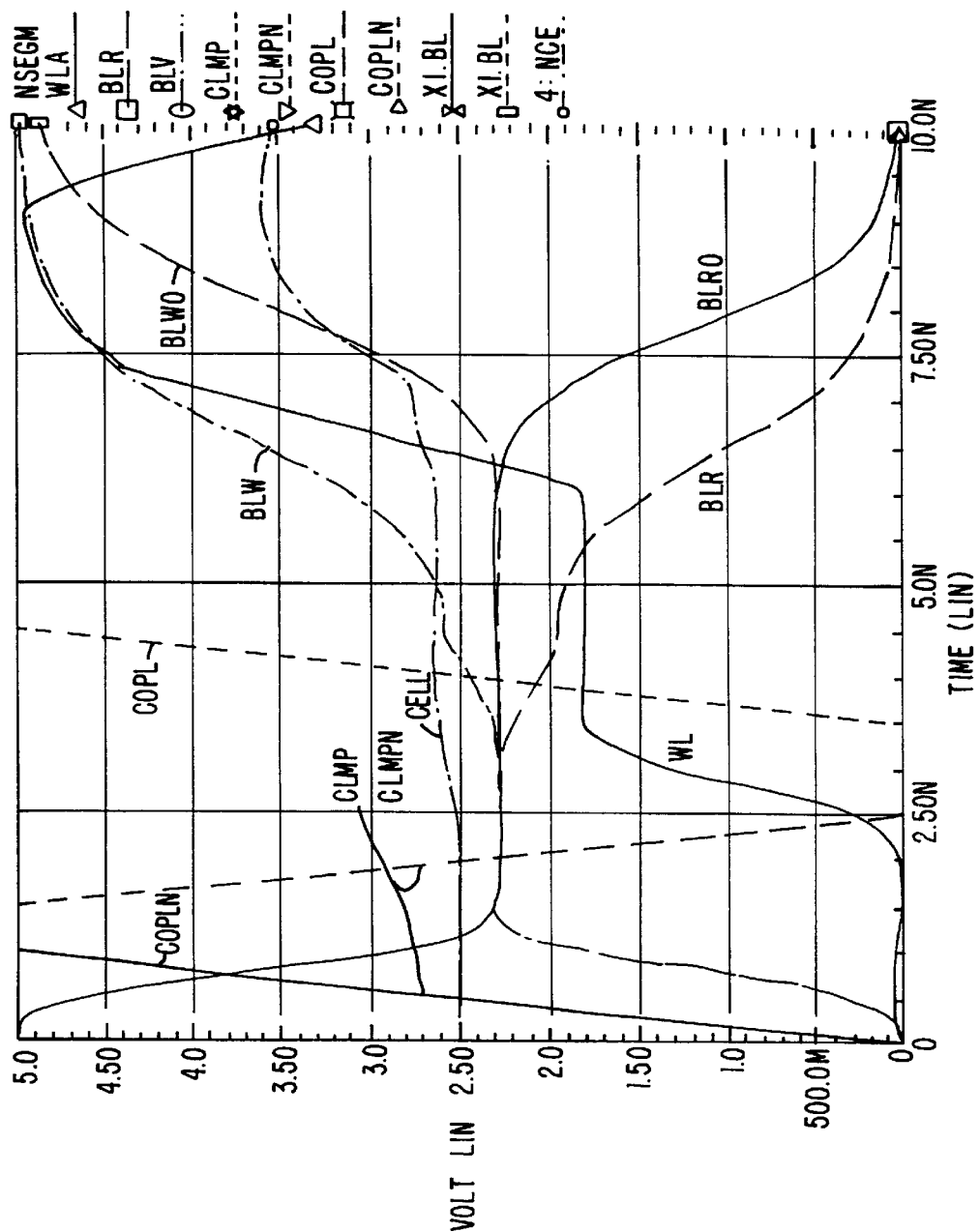
Figure 17F:
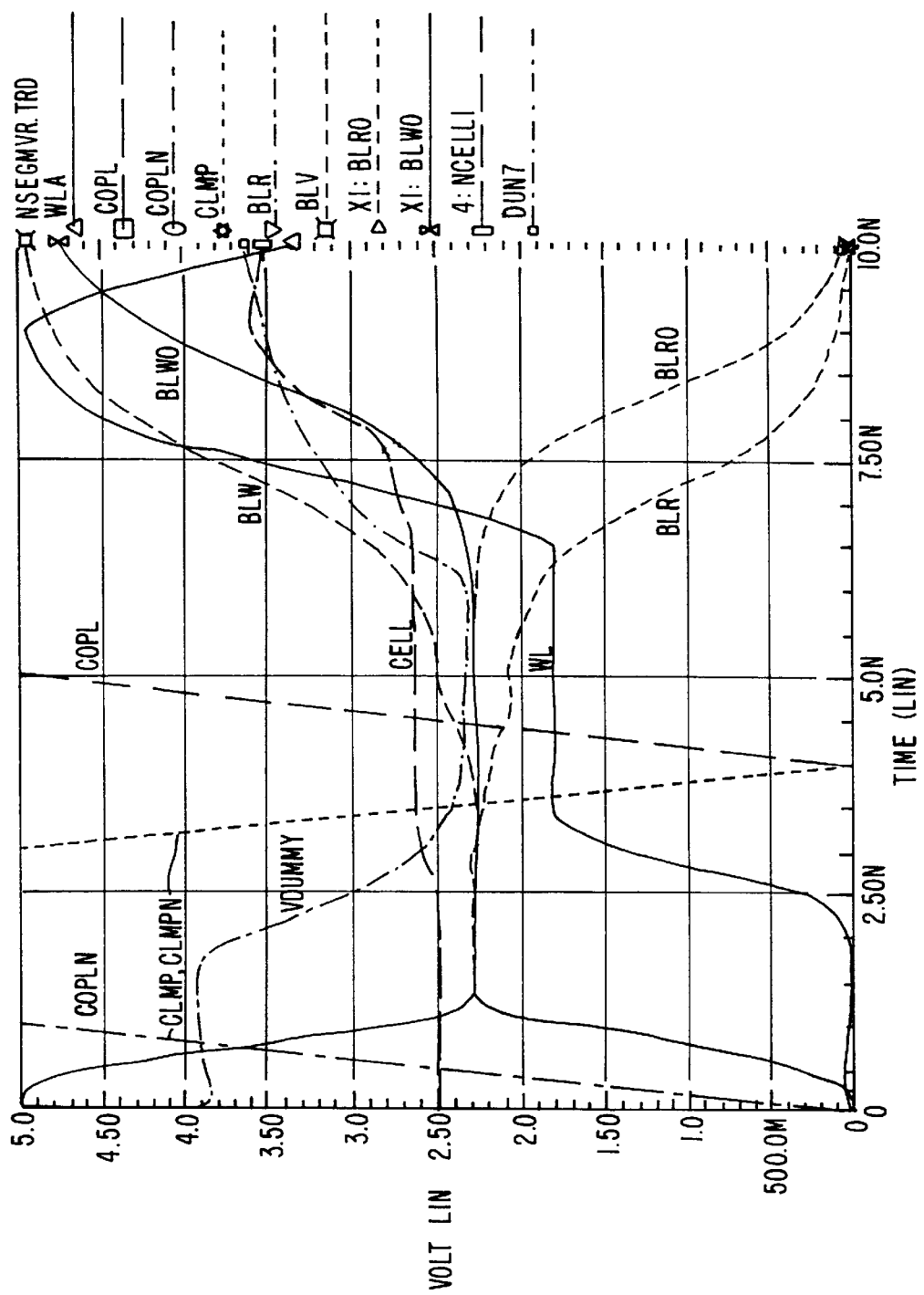
Figure 17G:
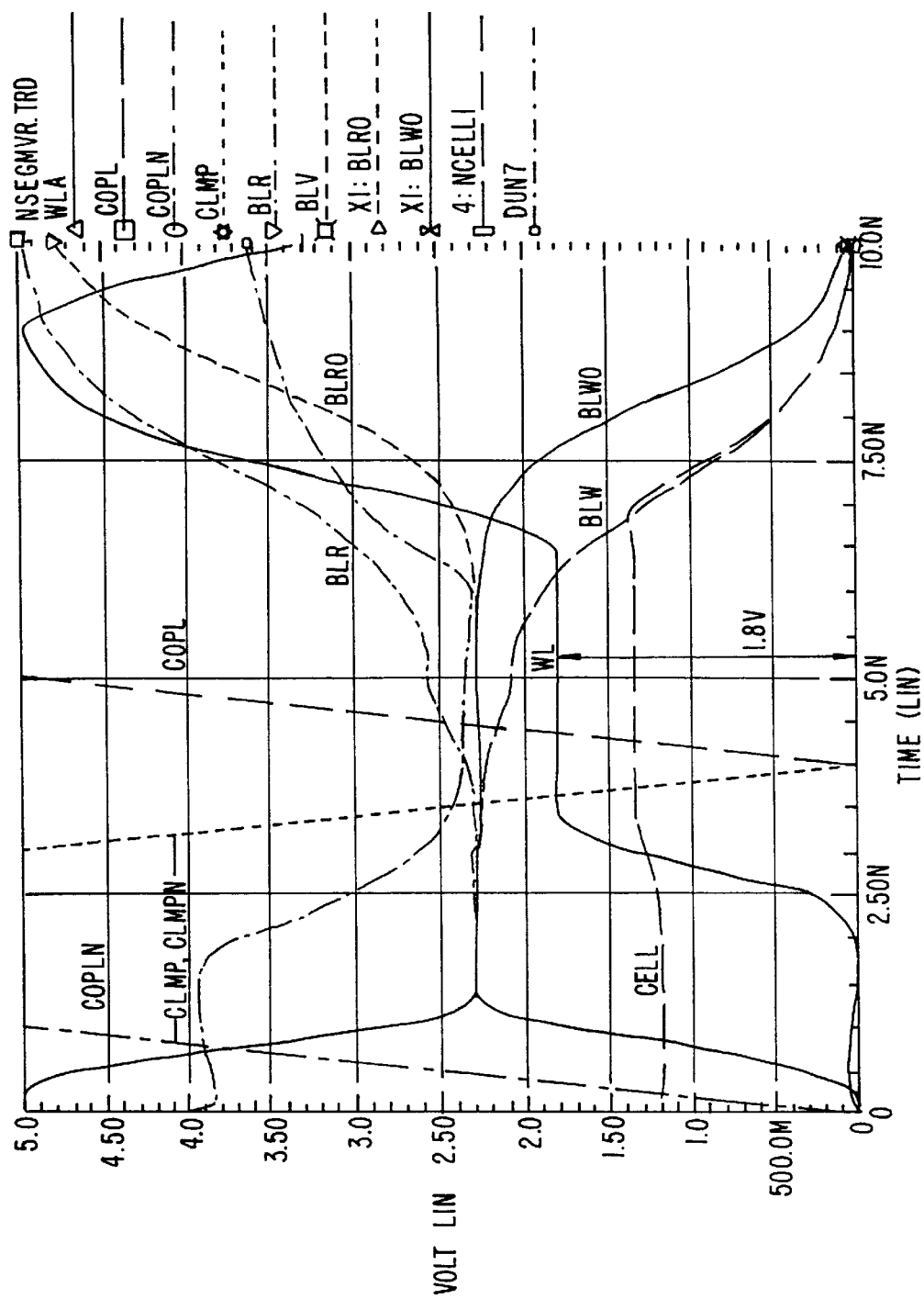

Turning off power during clamping saves power, as shown in FIGS. 17E–N, but adds to circuit complexity. FIGS. 17E–G all have a first ramp level of 1.8 V, while the following simulation used a first ramp level of 1.5 V. The circuit for the dummy current control adjusts the dummy current to an optimal value for a given first ramp level. The current difference between the cell current and the dummy current varies very little depending on the ramp level, but there is less dependence on device parameter variations at the lower first ramp level value.

Figure 17H:
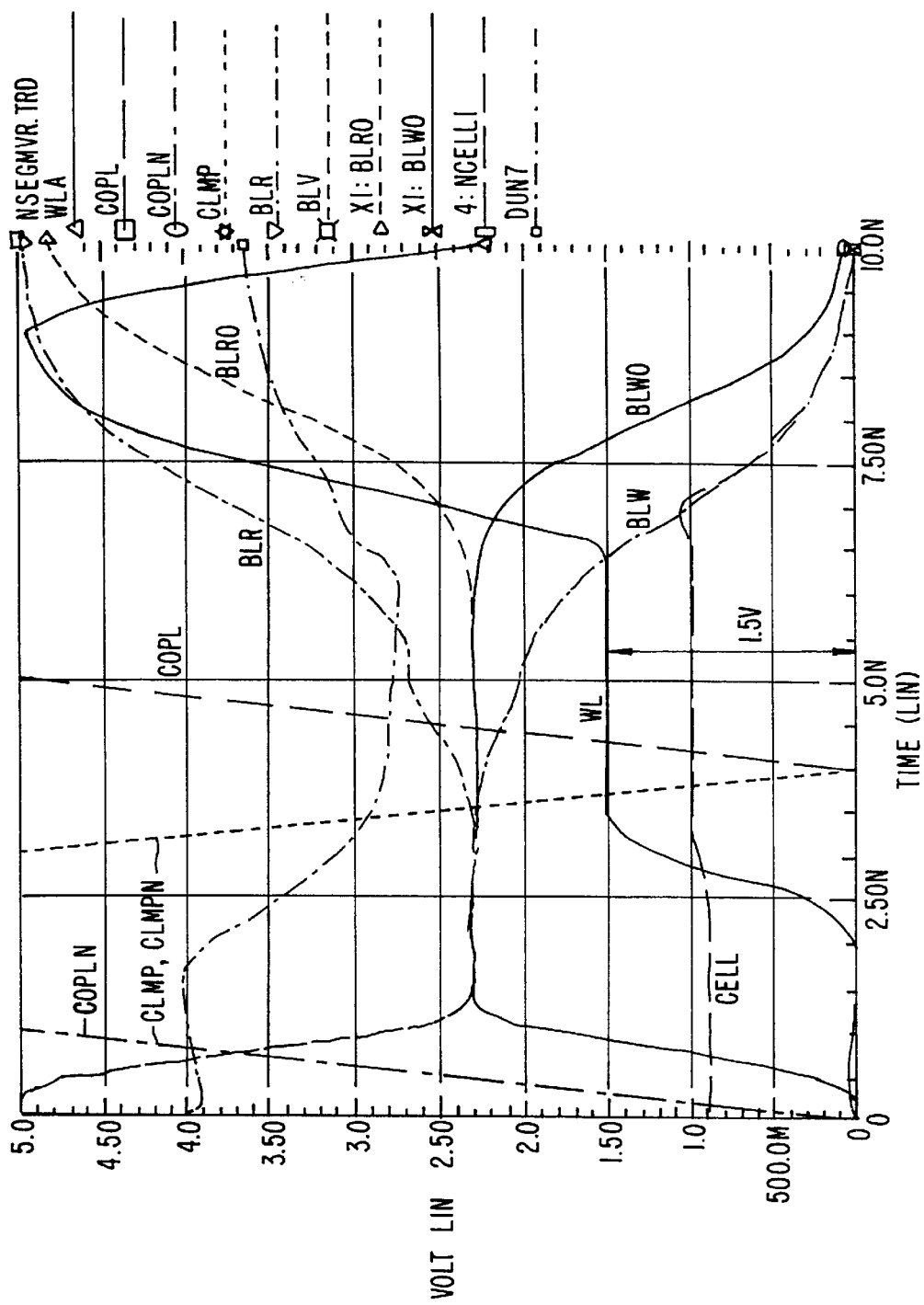
Figure 17I:
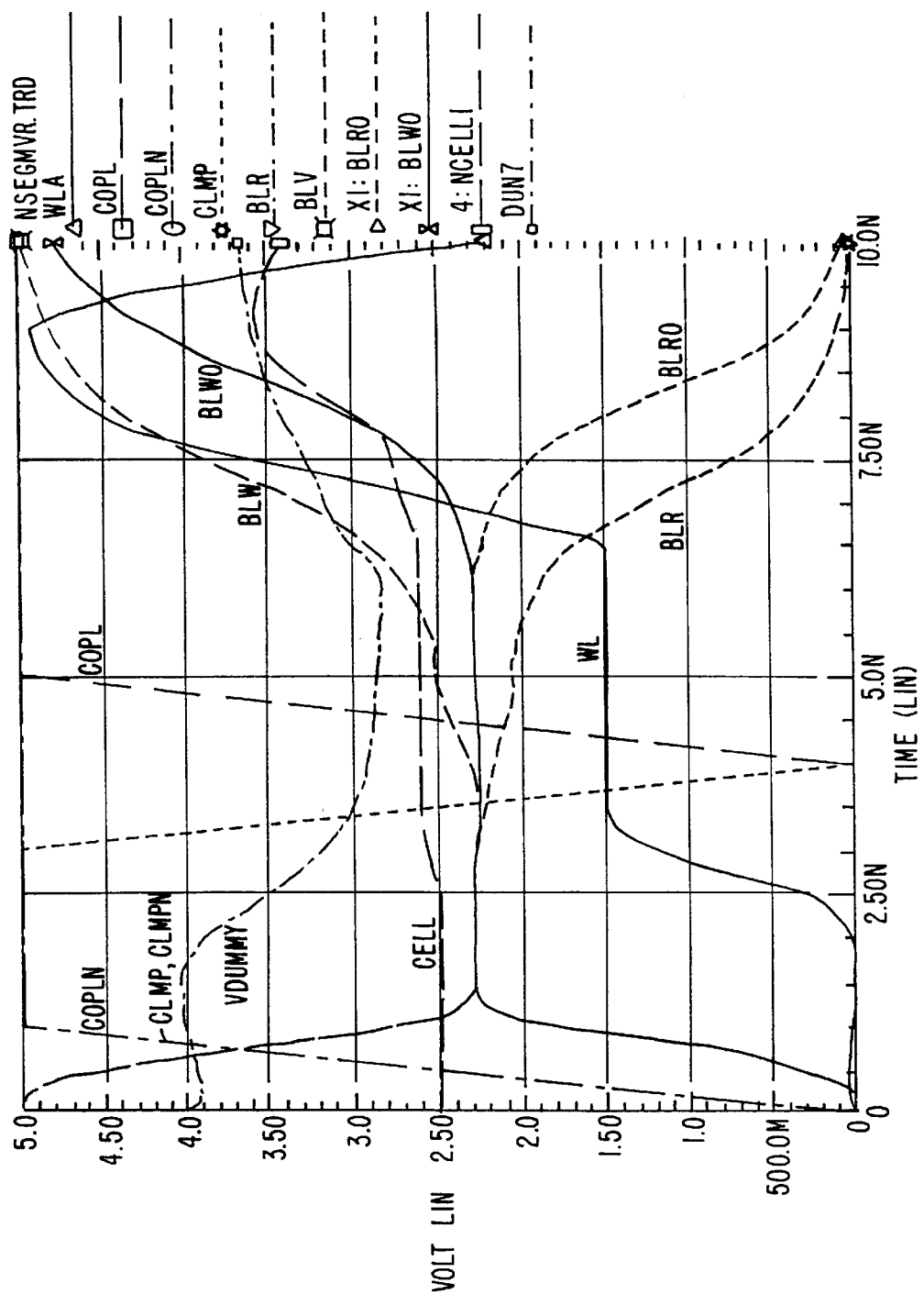

Comparing the initial clamp level of FIG. 17E with the previous simulations shows that the clamp level has dropped. This is caused by a change of the cell parameters equalizing the sizes of the read and write transistors and their junction areas. The higher junction capacitance at 0 V, compared to 5 V, brings the clamping level below 2.5 V. The switching point should also be set equal to the clamp level. The clamp pulses CLNP and CLMPN in FIG. 17E terminated before the word line had reached the first ramp level. This could cause the dummy current, if it had built up earlier to start the displacement of the read bit line prematurely. The margins otherwise are sufficient for correct reading of a ONE, as the figure shows. To eliminate the possibility of-the problem discussed above, the length of the clamp pulses in the following simulations were increased. FIG. 17F also displays the dummy voltage, that is applied to the gate of the P-channel dummy transistor. The dummy voltage is also close to its maximum negative value at the end of the clamp signals. A ONE is read in FIG. 17F and a ZERO is read in FIG. 17G. FIGS. 17H and 17I show normal read restore cycles for ZERO and ONE respectively.

Figure 17J:
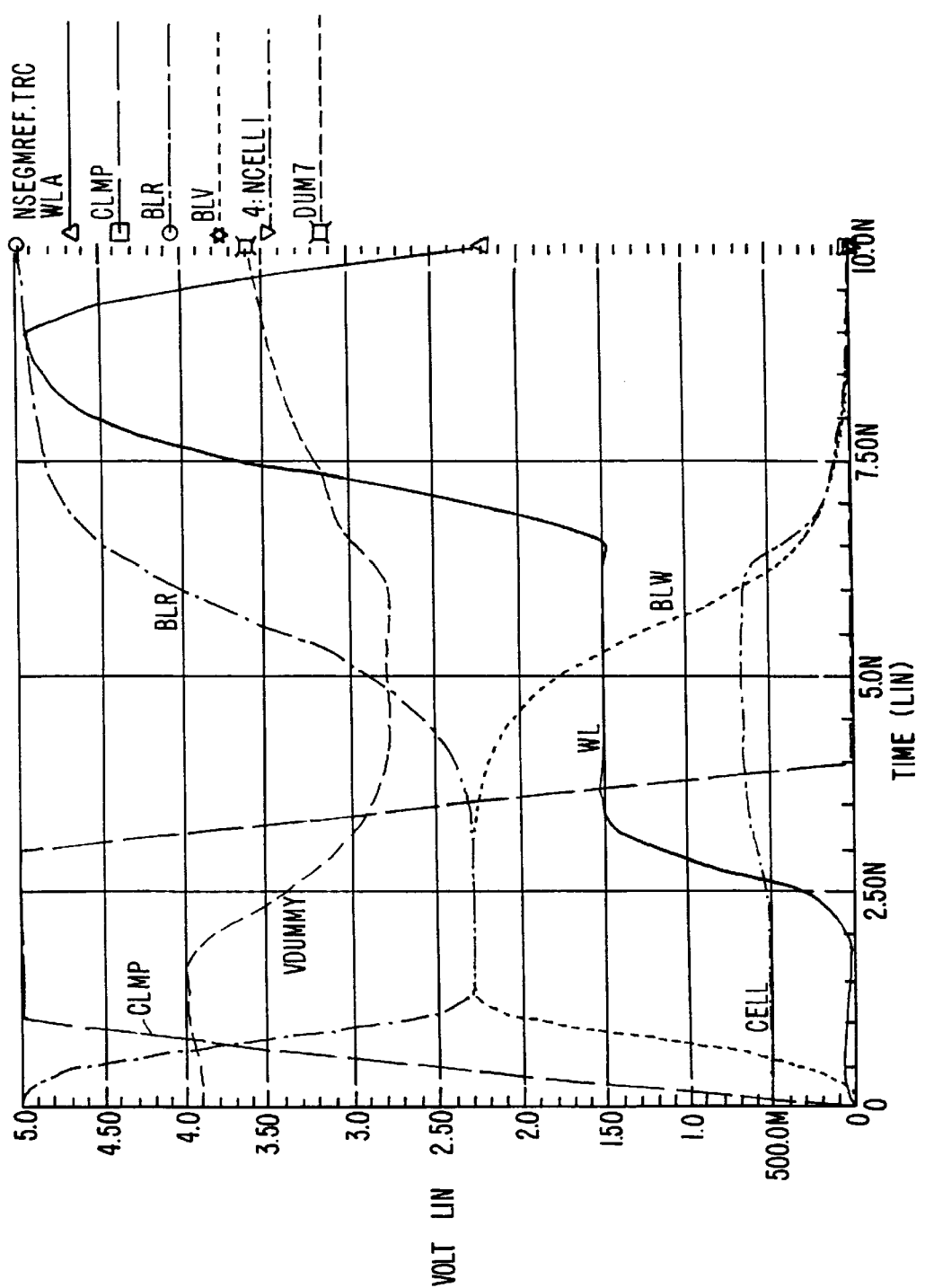
Figure 17K:
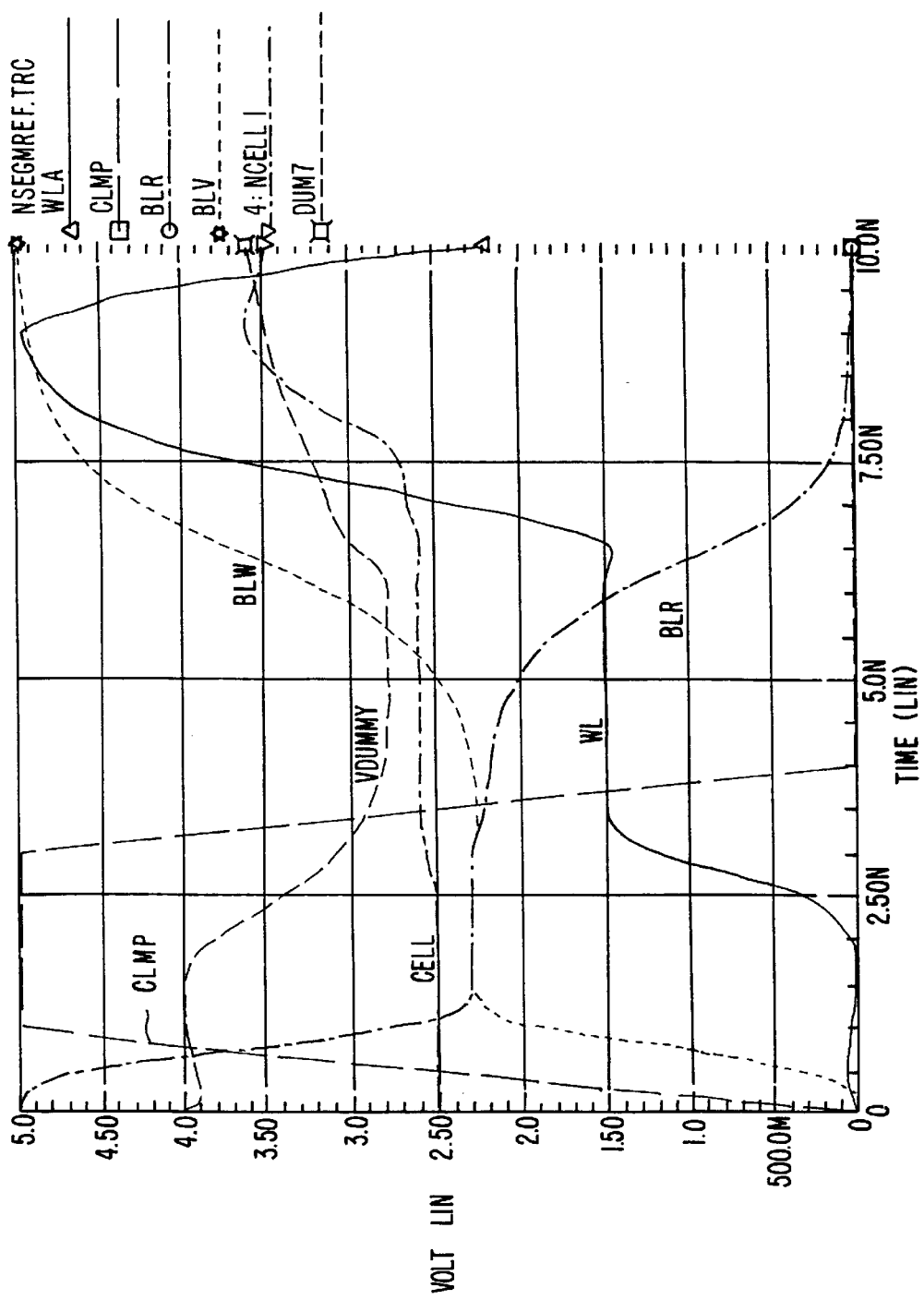
Figure 17L:
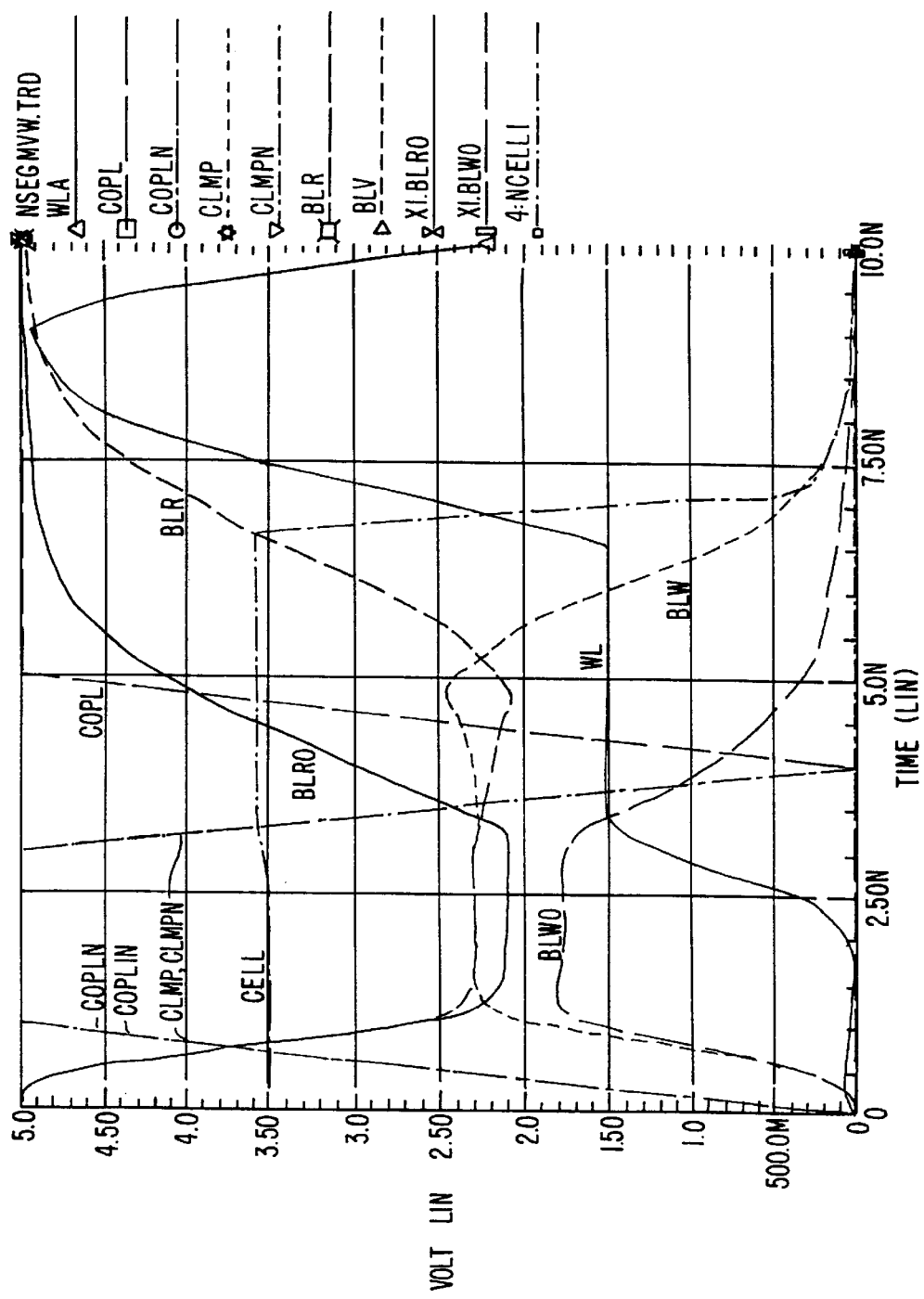
Figure 17M:
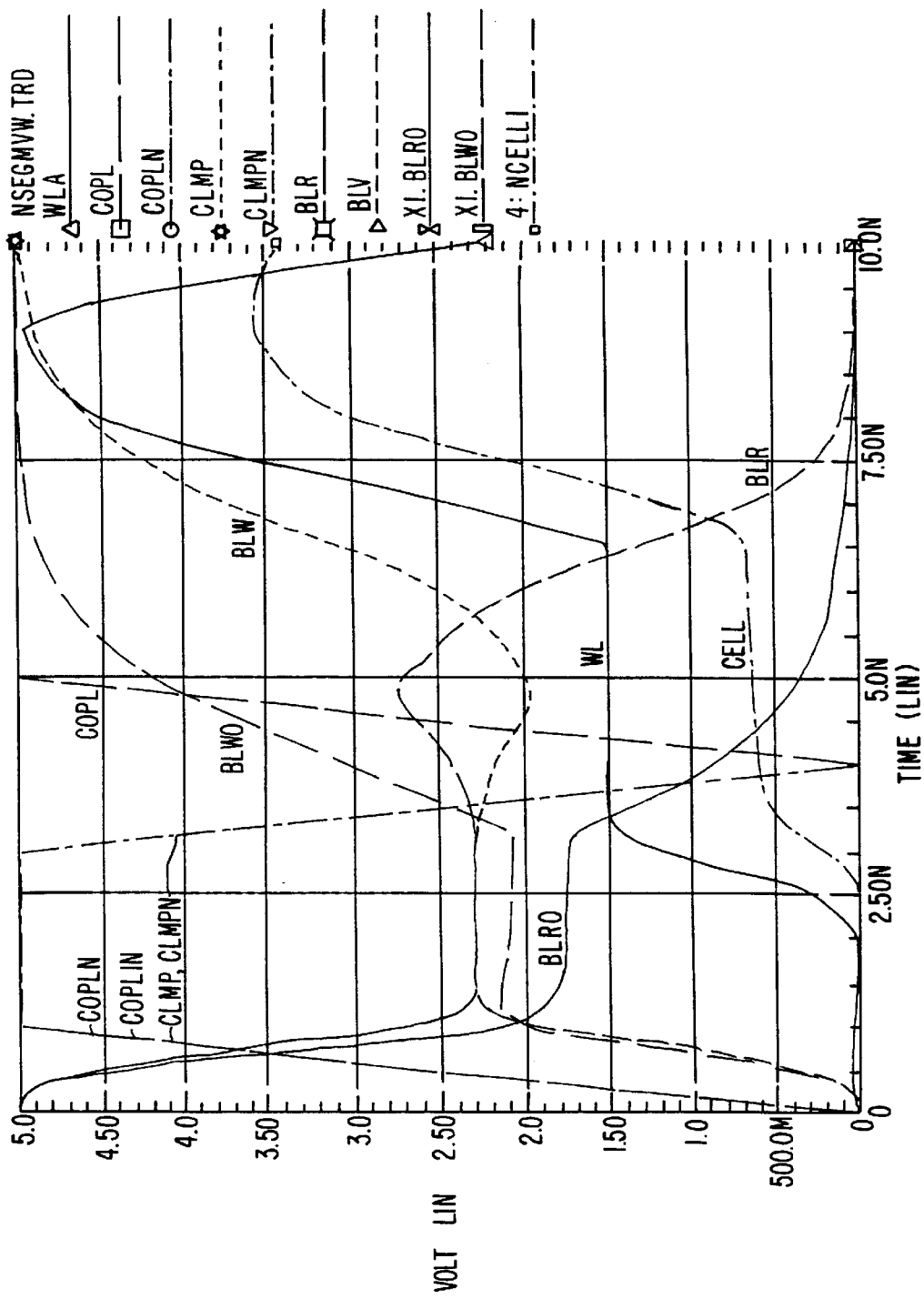

It should be pointed out that in all cases a refresh cycle is the same as a read cycle except that all segments operate simultaneously fully disconnected from each other. The signals COPL and COPLN are therefore inactive in the refresh cycles. All segments are enabled and the low order address bits addresses "the same" word line in each segment. With the timing for the clamping operation used in FIGS. 17E–Q, CLMP and CLMPN have the same duration and is in reality the same pulse. FIGS. 17J and 17K illustrate refresh cycles with the segments disconnected restoring ZEROs and ONEs. Comparing FIGS. 17H and 17J shows how the bit lines move faster without the added load of the additional segments. This indicates that the refresh cycles can be made shorter than a read or write cycle. FIGS. 17L and 17M show the write cycles for storing ZERO and ONE.

Memory Refresh Interruption without Delay

Figure 18A:
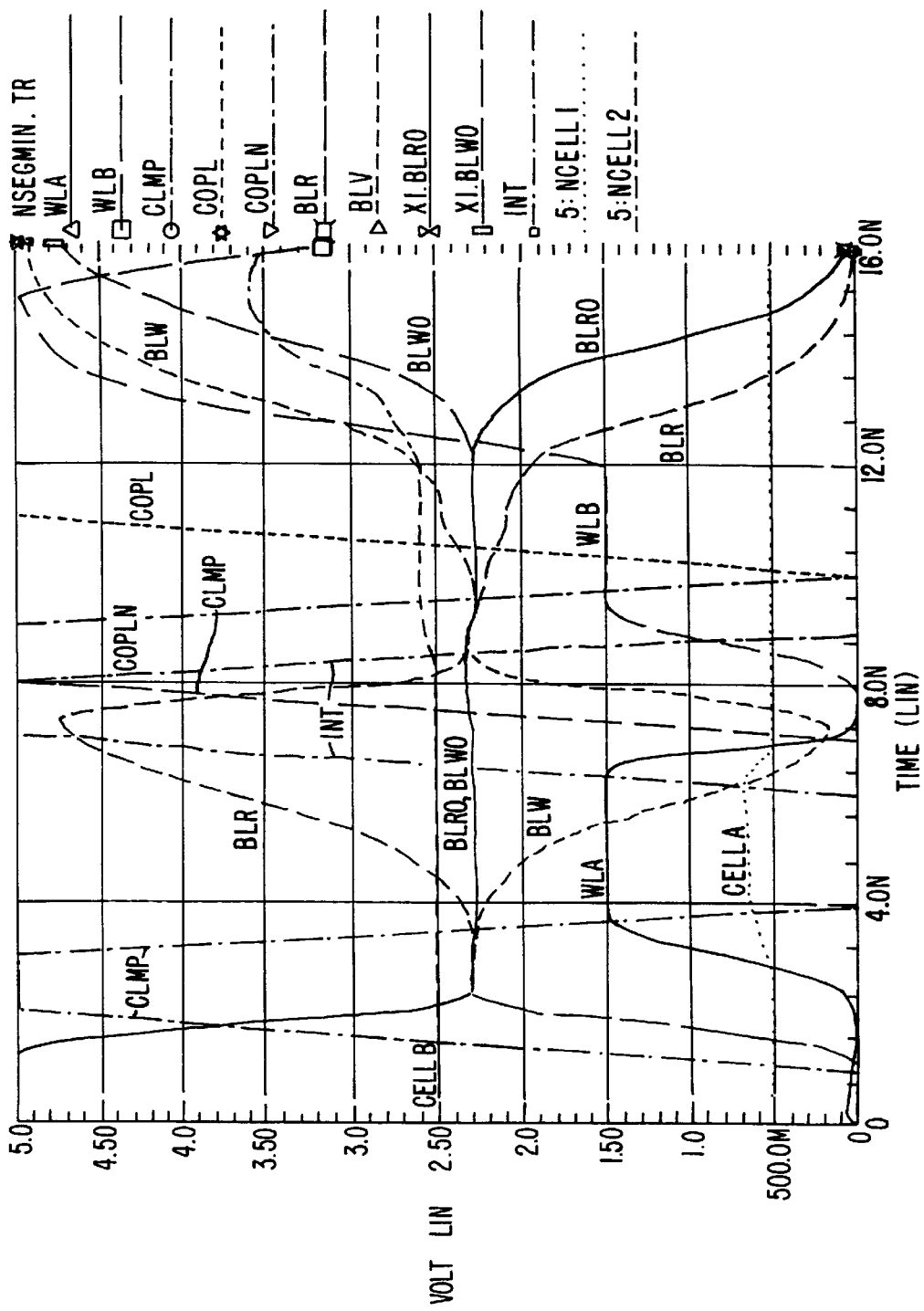
FIGS. 18A–D show how an ongoing refresh cycle can be interrupted at any time during the cycle without destroying the stored data.
Figure 18B:
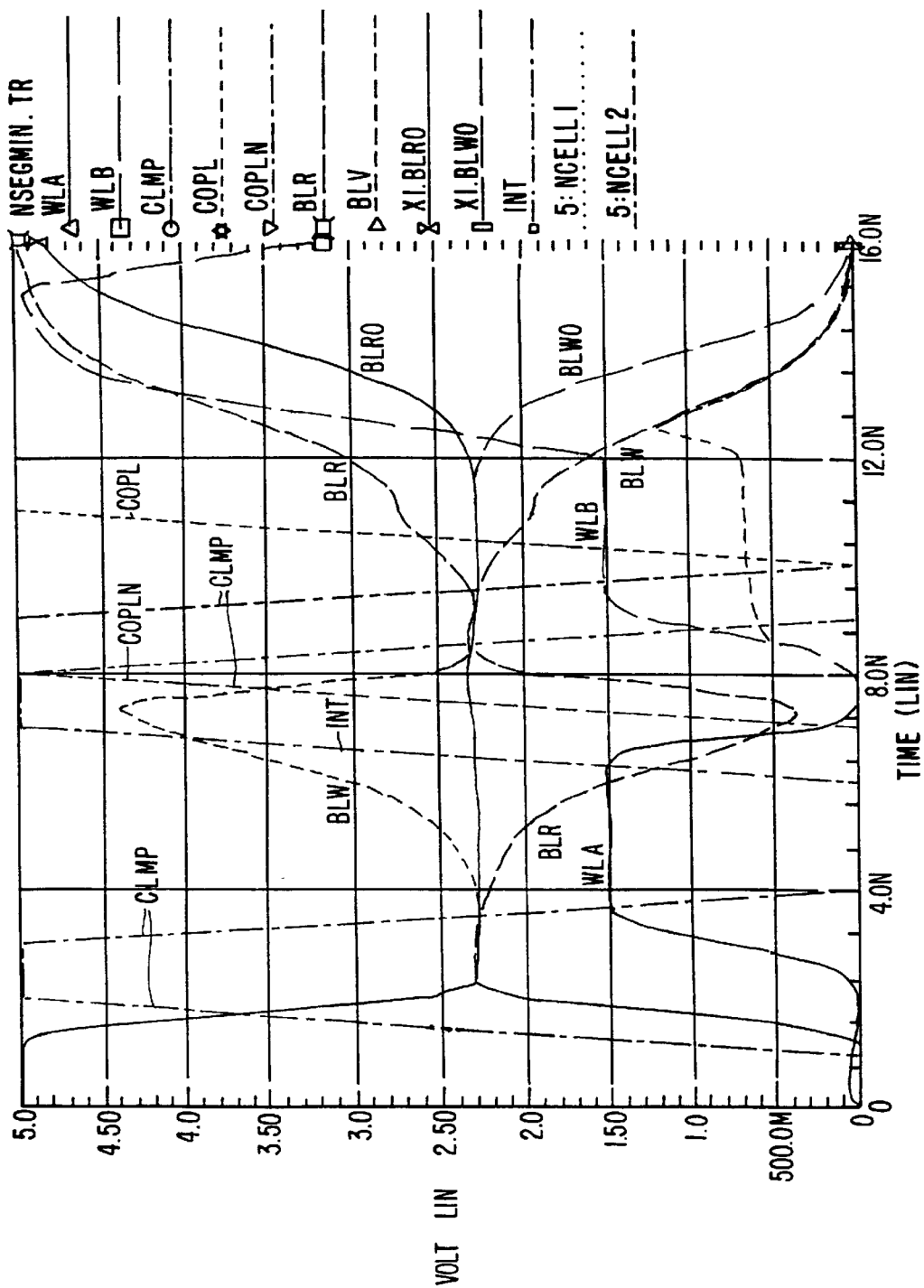

One reasons why SRAMs are typically preferred over conventional DRAMs is that synchronous systems require that a memory request is served without the delays that a DRAM refresh cycle would cause. A great advantage to the DRAM of the present invention is that an ongoing refresh cycle can be interrupted at any time during the cycle without destroying the stored data. Data stored in the cell capacitor remains intact most of the time or is refreshed during the end of the cycle. An ongoing refresh cycle can be stopped as long as the word line is brought low as the first step. FIGS. 18A–B show the simulations of interrupting refresh cycles after 6 ns and starting read cycles on a different address, while FIGS. 18C–D show an interrupting write cycle.

In these simulations the CLMP signal starts 1 ns later than in the previous simulations, but ends at the same time. The shorter pulse is sufficient for the clamping of the bit lines and the delay makes sure that the bit line voltages have not changed before the word line active during the refresh has been brought down. It is assumed that the refresh and the reading or writing is done in the top segment, with the bit lines BLR and BLW. The word line addressed during the refresh is WLA and the word line addressed during read or write is WLB. Data input and output connects to the bit lines of the bottom segment BLR0 and BLW0. The interrupting memory cycle starts with signal INT, which in the simulation was used to force the WLA low, while the decoder was selecting WLB. In FIG. 18A the cell addressed by WLA (CELLA) is in the ZERO state, starting at 0.5 V and during the read phase of the refresh cycle is lifted to 0.6 V and returned to 0.5 V when WLA is turned off (capacitive coupling between WLA and the cell capacitor). The cell to be read is at 2.5 V and is brought to 3.5 V at the end of the interrupting memory cycle. In FIG. 18B the cell to be refreshed (CELLA) is at 2.5 V and the cell to be read in the interrupting cycle (CELLB) is at 0.5 V. The reading returns CELLB to 0 V.

Figure 18C:
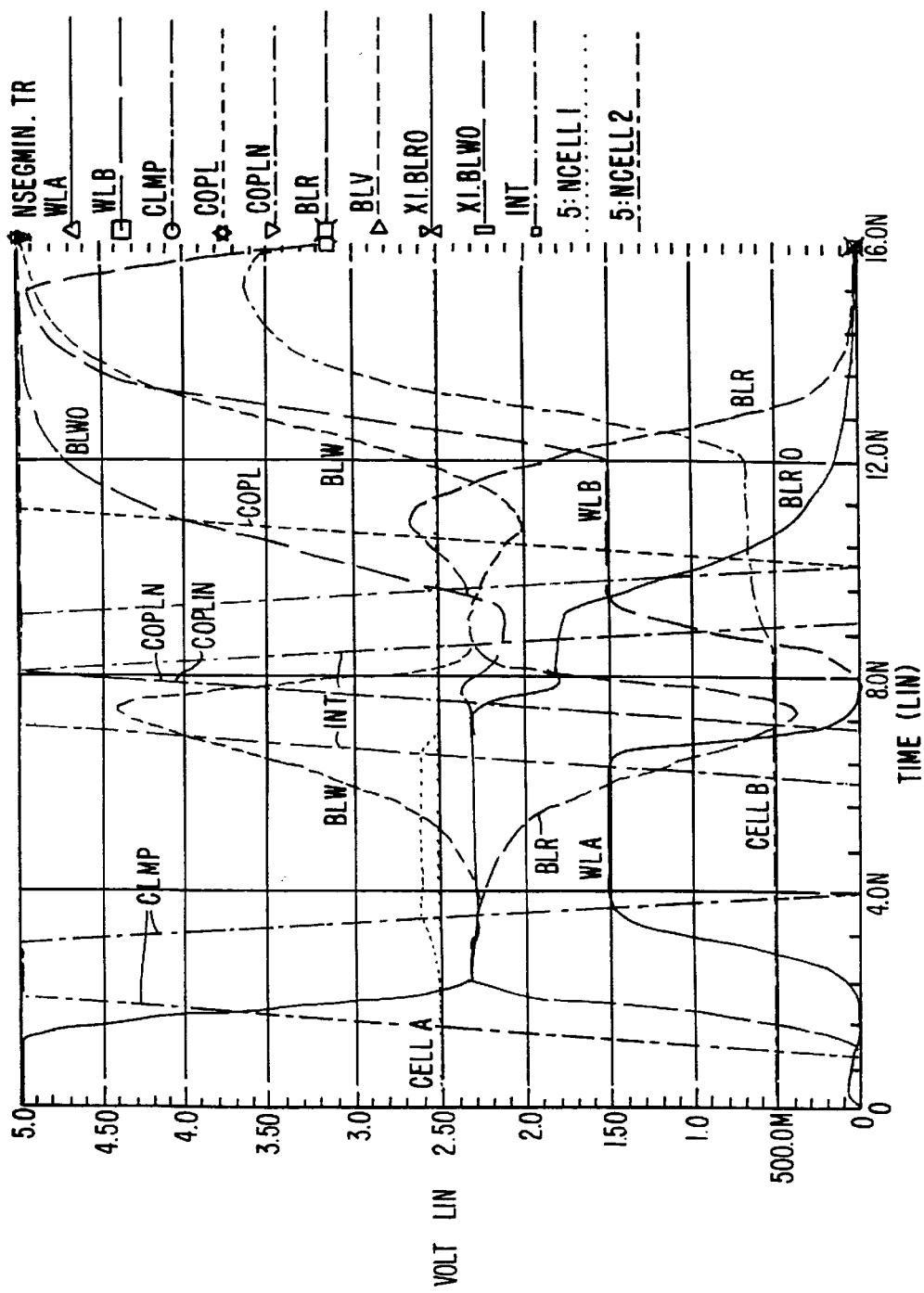
Figure 18D:
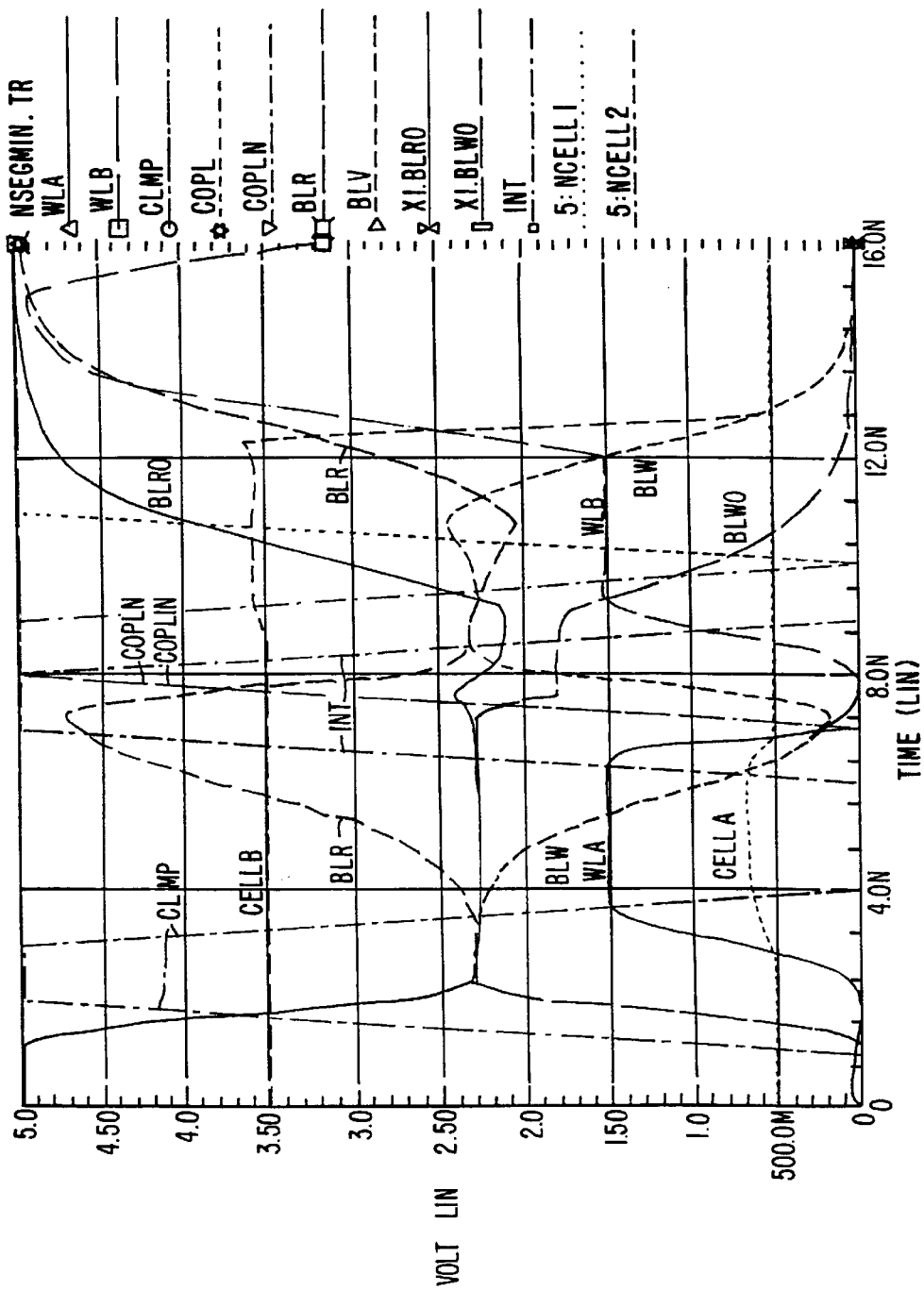

In FIGS. 18C–D the refresh cycles are interrupted by write cycles. In FIG. 18C the cell to be refreshed (CELLA) is at 2.5 V and remains at the same level after interrupting the refresh before WLA has been brought to 5 V. CELLB starts at its previous value of 0.5 V and at the end of the write cycle is at 3.5 V. In FIG. 18D CELLA remains at the 0.5 V it was at the start of the refresh cycle, while the voltage of CELLB is changed from its previously stored value of 3.5 V to 0 V. In the write operation a signal COPLIN occurring at the same time as the signal COPLN is applying the input data to the bottom segments bit lines BLR0 and BLW0. As can be seen these bit lines proceed in time the bit lines BLR and BLW in the top segment, contrary to the situation in FIGS. 18A–B, where BLR and BLW come first.

FIGS. 18A–D illustrate how a memory cycle can interrupt a refresh cycle without destroying the stored data for an arbitrarily chosen time in the refresh cycle. In the example a previously degenerated cell voltage was chosen (some time after last refresh). An incomplete refresh due to an interrupting memory access will cause further degeneration until new uninterrupted refresh cycle is performed. The address of the cells of the interrupted refresh would be retained during the memory access (accesses) and would be the first address used when the refresh cycle is resumed. With the very low refresh frequency compared to the high memory access rate very large blocks of data with very short interruptions would have to be transferred before the refresh integrity would be in danger. As a backup for all eventualities a long delay circuit could be used to interrupt the flow occasionally.

Related to the idea of interrupting an ongoing refresh cycle at any time without destroying the stored data is the concept of performing a fast burst read. A fast burst read operation involves reading data from the memory cell without completing a refresh cycle following the read operation. In the DRAM of the present invention, this is possible since the data stored in a memory cell is not destroyed when the contents of the cell are read, eliminating the need to refresh the contents of the cell. By reading data from a memory cell without a subsequent refresh cycle, the amount of time needed to perform a read operation is typically halved. Thus, the possible frequency of read cycles is doubled, improving the efficiency of memory operation. Of course, it should be understood that a standard DRAM refresh cycle must still be performed. The fast burst read operation essentially turns the customary read/refresh operation into a strict read operation, allowing a read operation to be performed without an associated refresh operation.

DRAM Cluster Cell

Figure 19A:
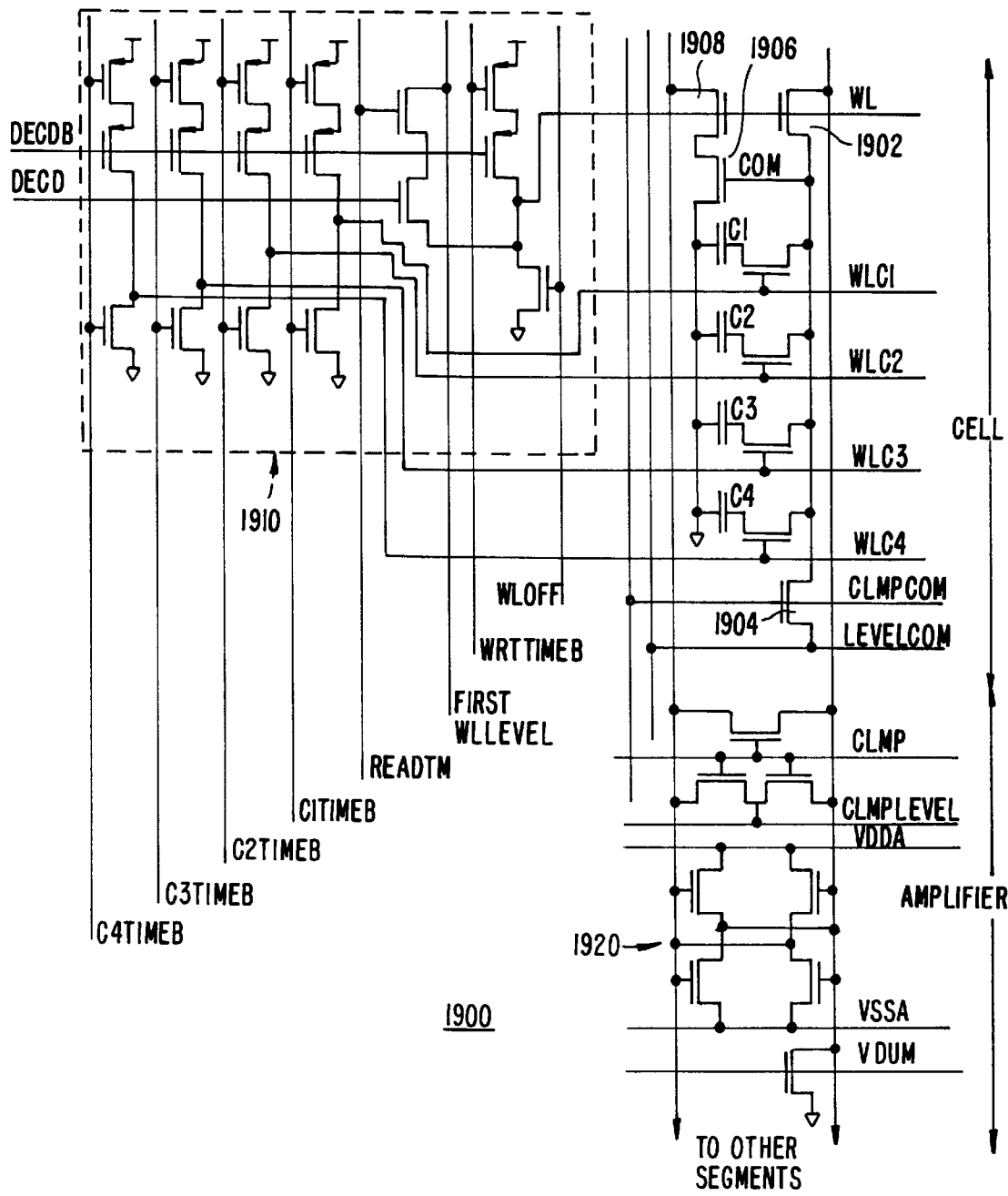
FIGS. 19A–D show a DRAM having more than one storage capacitor associated with a single pair of read and write transistors.

In another embodiment, the DRAM of the present invention may include more than one storage capacitor associated with a single pair of read and write transistors. FIG. 19A shows a simplified circuit diagram 1900 of a "cluster cell" using four storage nodes C1–C4. Instead of having one storage node at the common (COM) node, any of the four node capacitors C1–C4 can be connected to COM during a read or write operation. The COM node can be looked upon as a very short bit line in a conventional DRAM and all the techniques for layout and processing can be applied to the cells on the COM "bit line."

The number of cells that can be placed in the cluster depends on the relation between the memory cell capacitance and the capacitance of the COM node. The diagram in FIG. 19A shows four memory cells in the cluster, merely by way of example. The COM node capacitance includes the junction capacitance of the COM bit line, the source junction of write transistor 1902, the drain junction on CLMPCOM transistor 1904 and the gate of sense transistor 1906. The COM bit line may have relatively high resistance, so minimum active junctions can be used.

In operation, the primary DRAM cell, which normally reads and restores the charge stored in a capacitor connected to the COM node, has been modified so that any of the cell capacitors C1–C4 on the COM bit line can be connected to COM before the reading and restoring of the charge on the selected cell. Due to charge sharing between a cell capacitor and the COM node, there is a slight modification of the cell voltage after the connection. The actual voltage on the COM node depends on whether a ONE or a ZERO was read in the previous cycle. In order to make the effect of the charge sharing more predictable, the COM node is clamped to a fixed level between cycles. Once the cell is connected to COM, a normal cycle is then executed. FIG. 19A also shows a portion of a word line decoder 1910 coupled to master word line WL and four slave word lines WLC1, WLC2, WLC3 and WLC4. A number of global signals are also shown that define active time for the different horizontal lines. An active subcell is selected by a decoder (not shown) and applied at a specified time on C1TIMEB, C2TIMEB, C3TIMEB or C4TIMEB. An amplifier 1920 is also shown in FIG. 19A, and its performance is similar to that described above.

Figure 19B:
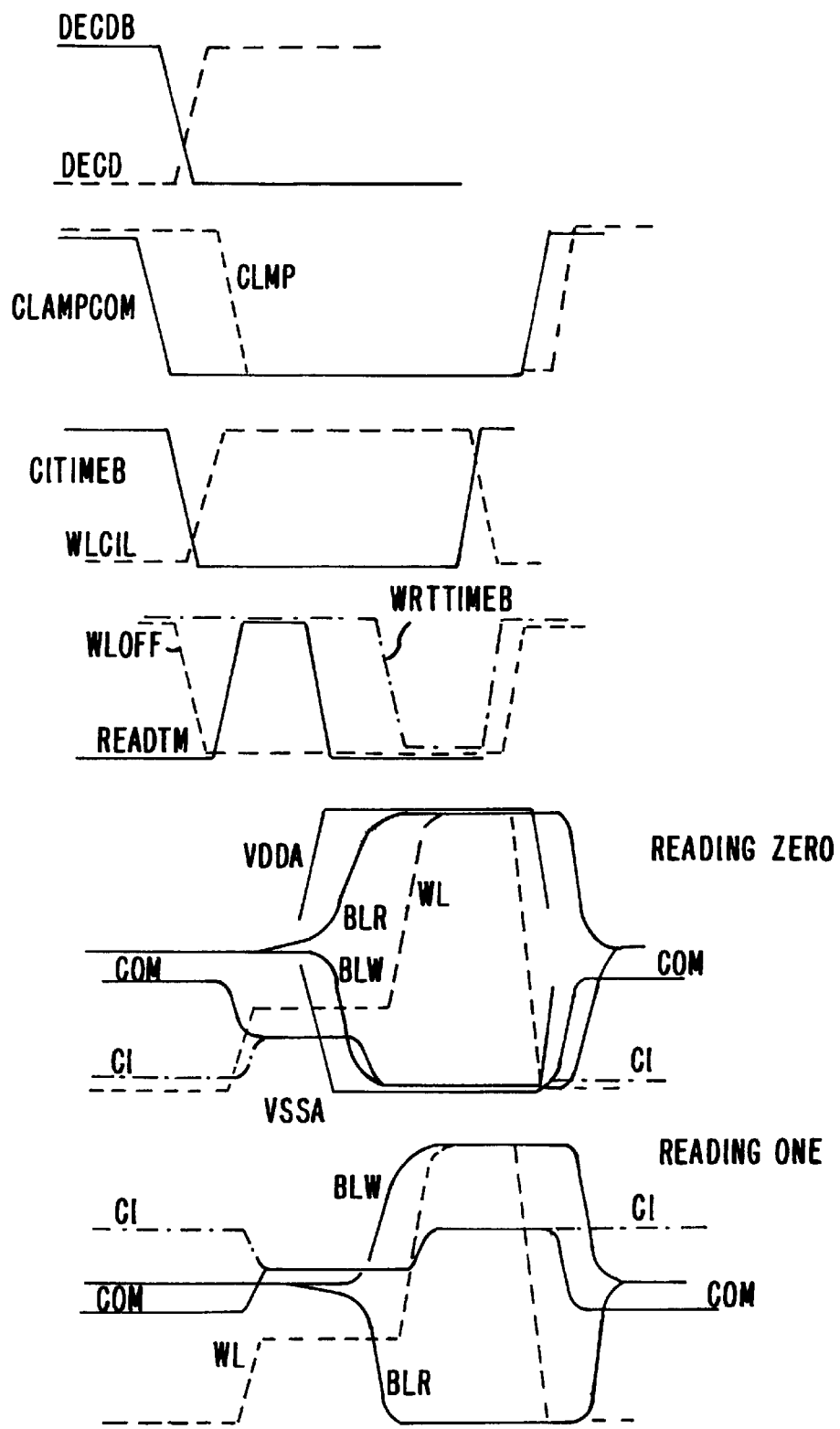

FIG. 19B shows the timing relationship between the different signals. For example, the reading and restoring of a ZERO and of a ONE is shown. The charge sharing effect between the cell capacitor and the COM node, when the COM node capacitance when the capacitances are equal is also illustrated.

Figure 19C:
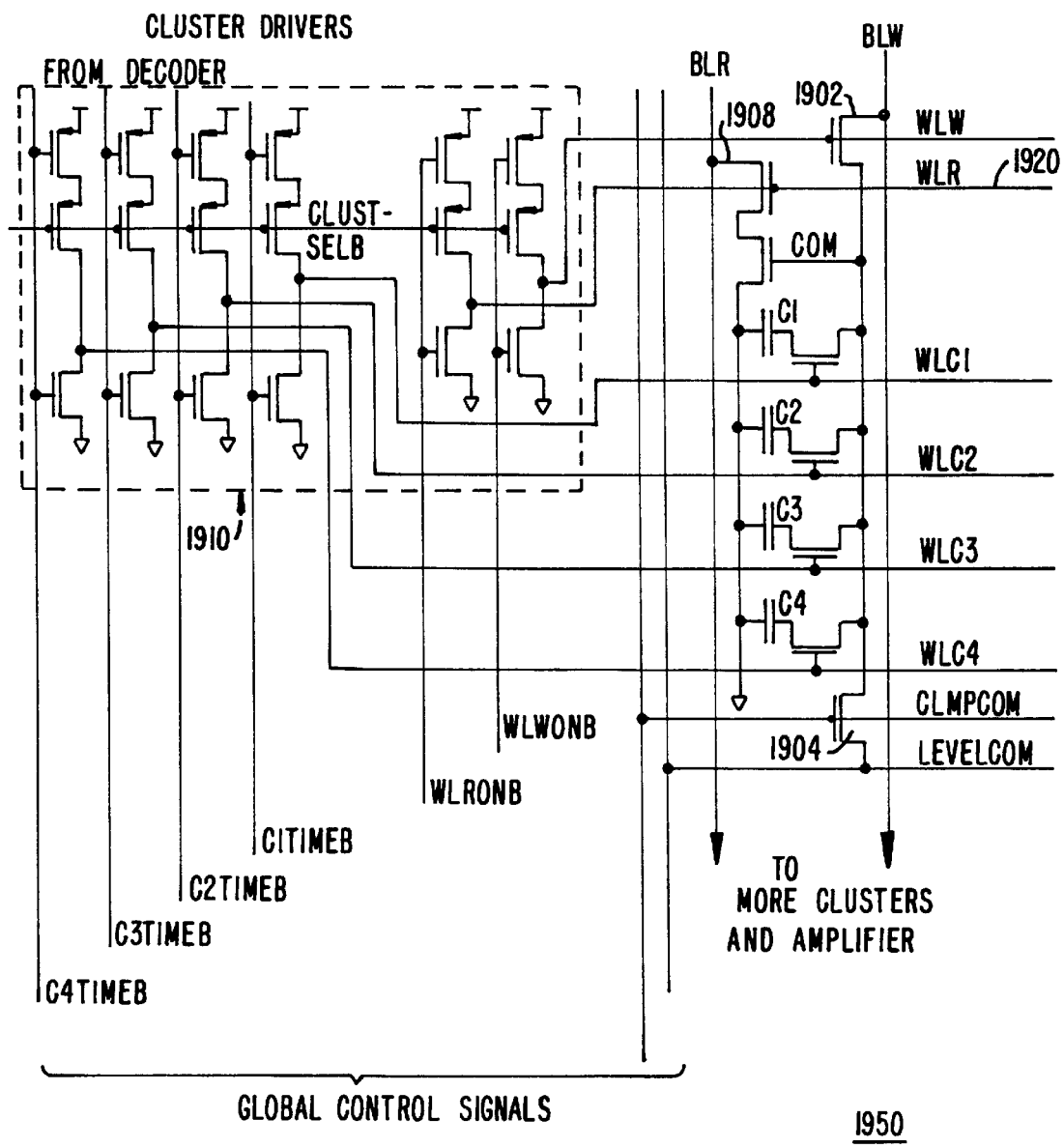
Figure 19D:
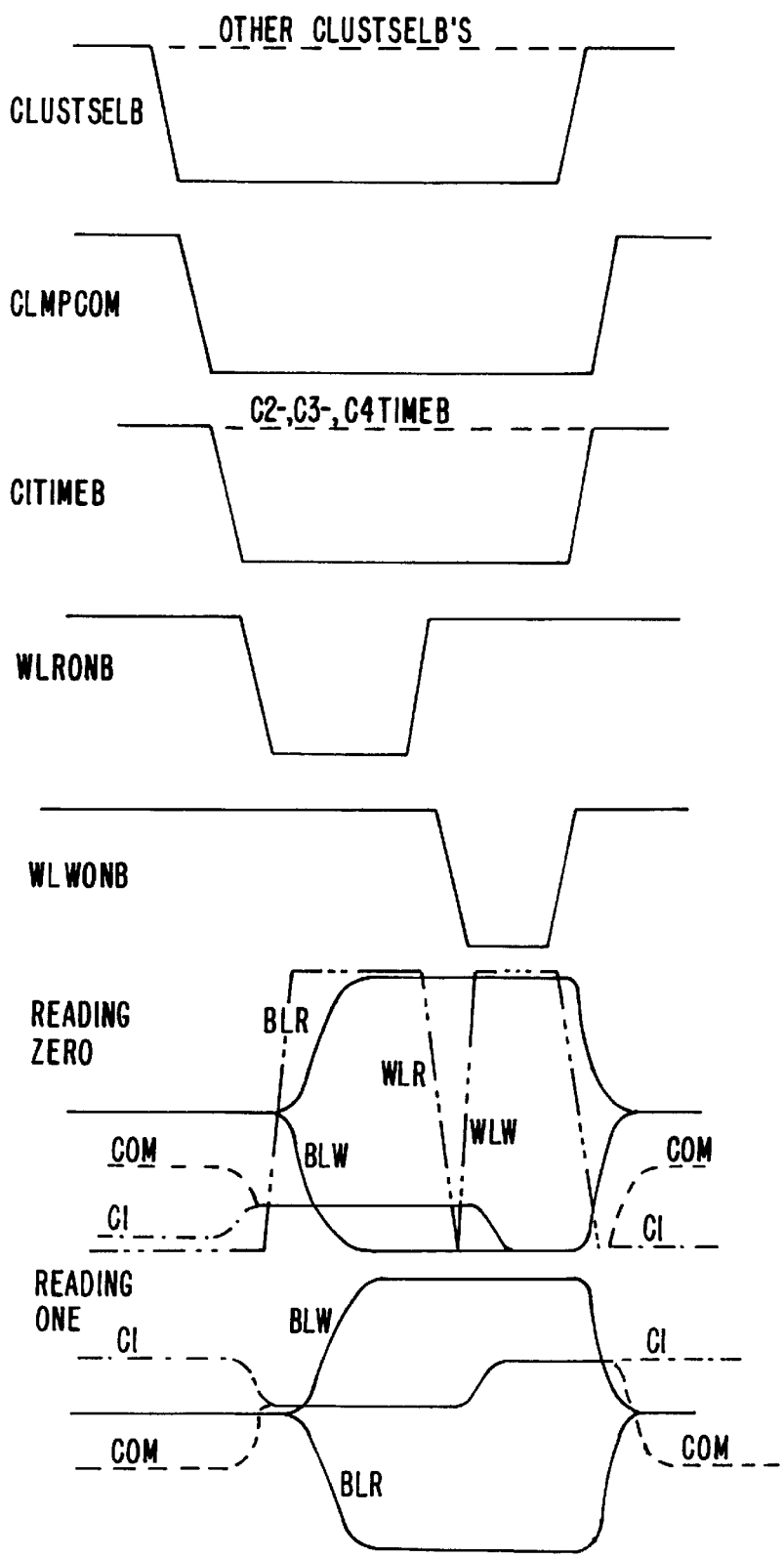

With the COM node clamped at 2 V between cycles, the displacement on the stored value while reading is the same, but in opposite directions. The cell current to BLR is normally limited by the low WL voltage on read transistor 1908 and therefore increases less than linearly with the cell voltage. The cost of adding a separate write word line 1920 is minimal to address this limitation, as shown in an alternate cluster cell configuration 1950 in FIG. 19C. The high WLR voltage (5 V) renders the cell current quadratically dependent of the active voltage on sense transistor 1906 (the COM node). The much higher read current on BLR makes for an even faster read operation and higher margins. The timing diagrams for the circuit of FIG. 19C is shown in FIG. 19D.

If a cluster cell is read before a refresh cycle, the cell voltage will have been modified by charge sharing with the COM node, as described above. A second reading may still be correct if the COM node capacitance is very small compared to the cell capacitor. The modification is however progressive from cycle to cycle, so a burst read could only be permitted once or twice before the cell is refreshed. The same restriction applies to interrupted refresh cycles for reading the same or other addresses and writing to other addresses. Note that the two tier configuration described earlier is still valid in the cluster cell as long as the second tier design takes into account the charge sharing effect.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A dynamic random access memory fabricated on a semiconductor substrate, comprising:
    a plurality of memory cells;
    a plurality of word lines coupled to said plurality of memory cells;
    a plurality of bit lines coupled to said plurality memory cells, wherein each bit line comprises a plurality of bit line segments, each bit line segment coupled to at least one of said plurality of memory cells and an associated sense amplifier; and
    a plurality of pass transistors, each pass coupled between adjacent bit line segments.

2. The dynamic random access memory of claim 1 further comprising:
    a plurality of segment decoders coupled to said plurality of bit line segments;
    a plurality of word line decoders coupled to said plurality of word lines; and
    a plurality of address lines coupled to said plurality of word line decoders and said plurality of segment decoders.

3. The dynamic random access memory of claim 1 wherein said associated sense amplifier further comprises a latching amplifier.

4. The dynamic random access memory of claim 1 wherein said associated sense amplifier further comprises an amplifier including at least one inverter.

5. The dynamic random access memory of claim 4 wherein an inverter in a first bit line segment and an inverter in an adjacent bit line segment are coupled in a full amplifier configuration.

6. The dynamic random access memory of claim 1 further comprising a clamp transistor coupled to a bit line and a clamp line, said clamp line having a clamp voltage level.

7. The dynamic random access memory of claim 1 wherein one of said plurality of bit line segments further comprises:
   a storage capacitor for storing charge representative of a stored value;
   a first, write transistor coupled to a first plate of said storage capacitor and a first bit line;
   a second, read transistor having a first terminal coupled to a first terminal of a third transistor and a second terminal coupled to a second bit line, said third transistor comprising a gate coupled to said first plate of said storage capacitor, a first one of said plurality of word lines coupled to a gate of said write transistor;
   a fourth transistor coupled to said first bit line and a clamp line, said clamp line having a clamp level intermediate to ground and a switching threshold of said write transistor; and
   a sense amplifier coupled to said first and second bit lines.

8. The dynamic random access memory of claim 7 wherein a second one of said plurality of word lines is coupled to a gate of said read transistor.

9. The dynamic random access memory of claim 7 wherein said sense amplifier further comprises:
   a first transistor coupled to said first and second bit lines and a first potential;
   a second transistor coupled to said first transistor, said first bit line and a second potential;
   a third transistor coupled to said first and second bit lines and said first potential; and
   a fourth transistor coupled to said first and second bit lines and said second potential.

10. The dynamic random access memory of claim 7 wherein said sense amplifier further comprises:
    a first transistor coupled to said first and second bit lines and a first potential; and
    a second transistor coupled to said first transistor, said first bit line and a second potential.

11. The dynamic random access memory of claim 1 further comprising shared bit lines.

12. A programmable logic device including the dynamic random access memory of claim 1 for control of said programmable logic device.

13. The programmable logic device of claim 12 further comprising:
    a pass transistor coupled to the dynamic random access memory; and
    a storage capacitor formed under said pass transistor.

14. The programmable logic device of claim 12 further comprising:
    a pass transistor coupled to the dynamic random access memory; and
    a storage capacitor formed above said pass transistor.

15. A two-tier dynamic random access memory comprising:
    a first tier memory with a first addressing circuit;
    a second tier memory with a second addressing circuit, said second tier memory configured to read contents of said first tier memory; and
    a circuit coupled to said first tier memory and configured to store data input in said first tier memory simultaneously with the reading of contents of said first tier memory by said second tier memory.

16. The two-tier dynamic random access memory of claim 15 wherein said first tier memory comprises:
    a storage capacitor for storing charge representative of a stored value;
    a first, write transistor coupled to a first plate of said storage capacitor and a first bit line;
    a second, read transistor having a first terminal coupled to a first terminal of a third transistor and a second terminal coupled to a second bit line, said third transistor comprising a gate coupled to said first plate of said storage capacitor, a gate of both said read transistor and said write transistor coupled to a word line; and
    wherein, said second tier comprises:
      a fourth transistor coupled to said first plate of said storage capacitor;
      a fifth transistor having a first terminal coupled to said four transistor and a second terminal coupled to a third bit line;
    said two-tier dynamic random access memory further comprising:
      a first sense amplifier coupled to said first and second bit lines; and
      a second sense amplifier coupled to said third bit line.

17. A dynamic random access memory comprising:
    a storage capacitor for storing charge representative of a stored value;
    a first, write transistor coupled to a first plate of said storage capacitor and a first bit line, said first, write transistor having a gate coupled to a word line:
    a second, read transistor having a first terminal coupled to a first node and a second terminal coupled to a second bit line, and a gate coupled to said word line:
    a third transistor coupled to said first node and having a gate coupled to said first plate of said storage capacitor;
    a fourth transistor coupled to said first bit line and a clamp line, said clamp line having a clamp level intermediate to ground and a switching threshold of said write transistor; and
    a sense amplifier coupled to said first and second bit lines,
    wherein a refresh cycle of the dynamic random access memory may be interrupted with a memory read cycle without destroying data stored in the dynamic random access memory, and
    wherein a refresh cycle of the dynamic random access memory may be interrupted with a memory write cycle without destroying data stored in non-addressed columns of the dynamic random access memory.

18. The dynamic random access memory of claim 17 wherein a fast burst read cycle is performed without a subsequent associated memory refresh operation.

19. A method of operating a dynamic random access memory comprising a plurality of memory cells, a plurality of word lines coupled to said plurality of memory cells and a plurality of bit lines divided into bit line segments, each segment coupled to at least one of the plurality of memory cells and an associated sense amplifier, the method comprising the steps of:

storing a charge representing a data value in a memory cell capacitance;

activating a word line to operatively couple said memory cell to a selected bit line segment, said charge in said memory cell either permitting or not permitting a selected current to flow to said selected bit line segment depending upon said data value;

sensing a difference in voltage between two sense nodes with the sense amplifier, said voltage difference established by said selected current flow and a reference current flow to a sense node; and activating said word line to refresh said charge in said memory cell capacitance in said selected bit line segment.

20. The method of claim 19 further comprising the step of reading said charge from said memory cell by propagating a signal representing said voltage difference from said selected bit line segment to remaining bit line segments in a bit-line.

21. A dynamic random access memory comprising:

a plurality of memory cells respectively located at the intersections of a plurality of word lines and a plurality of bit lines, each memory cell comprising:

a plurality of storage capacitors for storing charge representative of a stored value;

a plurality of switch transistors, each respectively coupled to a first plate of one of said plurality of storage capacitors;

a write transistor coupled to said plurality of switch transistors at a common node and a first bit line;

a sense transistor having a gate coupled to said common node and a source coupled to a second plate of each of said plurality of storage capacitors; and a read transistor coupled to said sense transistor and a second bit line; and a sense amplifier coupled to said first and second bit lines.

22. The dynamic random access memory of claim 21 further comprising:

a clamp transistor coupled to said common node; and a clamp voltage line coupled to said clamp transistor, said clamp transistor coupling a common clamp voltage level on said clamp voltage line to said common node prior to a read or write operation of said memory cell.

23. The dynamic random access memory of claim 21 further comprising:

a first word line coupled to a gate of said write transistor; and a second word line coupled to a gate of said read transistor.

24. The dynamic random access memory of claim 21 wherein said each of said bit lines is divided into a plurality of bit line segments separated by pass transistors, each bit line segment coupled to at least one of said plurality of memory cells and an associated sense amplifier.

25. A dynamic random access memory comprising:

a plurality of memory cells respectively located at the intersections of a plurality of word lines and a plurality of bit lines, each memory cell comprising:

a storage capacitor for storing charge representative of a stored value;

a write transistor coupled to a first plate of said storage capacitor and a first bit line;

a sense transistor having a gate coupled to said write transistor and said first plate of said storage capacitor;

a read transistor having a first terminal coupled to said sense transistor and a second terminal coupled to a second bit line;

a first word line coupled to a gate of said write transistor; and a second word line coupled to a gate of said read transistor; and a sense amplifier coupled to said first and second bit lines.

26. A method of operating a two-tier dynamic random access memory comprising the steps of:

providing a first tier memory coupled to a first addressing circuit;

providing a second tier memory coupled to a second addressing circuit;

reading output data from said first tier memory into said second tier memory; and writing input data to said first tier memory concurrently with said reading step.

* * * * *

UNITED STATES PATENT AND TRADEMARK OFFICE
CERTIFICATE OF CORRECTION

PATENT NO. : 6,335,896 B1
DATED : January 1, 2002
INVENTOR(S) : Sven E. Wahlstrom It is certified that error appears in the above-identified patent and that said Letters Patent is hereby corrected as shown below:

Column 32,
Line 48, after "plurality", insert -- of --.

Column 34,
Line 26, delete "four" and insert -- fourth --.

Signed and Sealed this

Tenth Day of September, 2002

Attest:

JAMES E. ROGAN
Attesting Officer   Director of the United States Patent and Trademark Office

UNITED STATES PATENT AND TRADEMARK OFFICE
CERTIFICATE OF CORRECTION

PATENT NO. : 6,335,896 B1
DATED : January 1, 2002
INVENTOR(S) : Sven E. Wahlstrom It is certified that error appears in the above-identified patent and that said Letters Patent is hereby corrected as shown below:

Title page,
Item [73], Assignee, delete "(73) Assignee: Altera Corporation, San Jose, CA"

Signed and Sealed this

Twelfth Day of October, 2004

JON W. DUDAS
*Director of the United States Patent and Trademark Office*